(12) United States Patent
Onitsuka et al.

(10) Patent No.: US 8,029,638 B2
(45) Date of Patent: Oct. 4, 2011

(54) COMPONENT MOUNTING APPARATUS AND METHOD

(75) Inventors: Yasuto Onitsuka, Osaka (JP); Atsushi Katayama, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/745,954

(22) PCT Filed: Dec. 3, 2008

(86) PCT No.: PCT/JP2008/003579
§ 371 (c)(1),
(2), (4) Date: Jun. 3, 2010

(87) PCT Pub. No.: WO2009/072282
PCT Pub. Date: Jun. 11, 2009

(65) Prior Publication Data
US 2010/0243153 A1    Sep. 30, 2010

(30) Foreign Application Priority Data

Dec. 4, 2007 (JP) ................................. 2007-313718
Dec. 4, 2007 (JP) ................................. 2007-313722
Dec. 4, 2007 (JP) ................................. 2007-313727

(51) Int. Cl.
*B29C 65/00* (2006.01)
*B32B 37/00* (2006.01)
*E04F 13/08* (2006.01)
*C09J 5/00* (2006.01)
*B31F 5/00* (2006.01)

(52) U.S. Cl. .................... 156/299; 156/312; 156/562

(58) Field of Classification Search ............... 156/60, 156/290, 297, 299, 300, 312, 321, 349, 350, 156/351, 358, 360, 362, 363, 364, 538, 539, 156/556, 559, 560, 561, 562, 580, 583.1, 156/583.6, 583.7
See application file for complete search history.

(56) References Cited

U.S. PATENT DOCUMENTS 5,664,473 A * 9/1997 Huang ........................... 83/620
5,806,174 A * 9/1998 Itoh .............................. 29/740
6,148,511 A * 11/2000 Taguchi ........................ 29/834

FOREIGN PATENT DOCUMENTS

JP 06-077643 3/1994
(Continued)

OTHER PUBLICATIONS

International Preliminary Report on Patentability (Chapter II) (in English) issued Aug. 12, 2010 in International (PCT) Application No. PCT/JP2008/003579.

(Continued)

*Primary Examiner* — Philip Tucker
*Assistant Examiner* — Brian R Slawski
(74) *Attorney, Agent, or Firm* — Wenderoth, Lind & Ponack, L.L.P.

(57) ABSTRACT

A component mounting apparatus includes: a plurality of pressure-bonding units which are arrayed in line and each of which includes a pressure-bonding head for pressure-bonding a component to a component pressure-bonding area of the substrate, and an edge-portion support member for supporting an edge portion of the substrate during the pressure bonding; a guide support member for supporting the pressure-bonding units so that their movement along the edge portion for execution of substrate pressure-bonding can be guided; a common head up/down unit for integrally moving up and down the individual pressure-bonding heads; and a plurality of unit-moving devices which are provided for the plurality of pressure-bonding units, individually and respectively, to move the pressure-bonding units along the edge portion so that placement of the pressure-bonding units is changed.

2 Claims, 31 Drawing Sheets

FOREIGN PATENT DOCUMENTS

| | | | |
|---|---|---|---|
| JP | 3275744 | | 4/2002 |
| JP | 2003-282653 | | 10/2003 |
| JP | 2003282653 A | * | 10/2003 |
| JP | 2005-317784 | | 11/2005 |
| JP | 2006-287011 | | 10/2006 |
| JP | 2006287011 A | * | 10/2006 |
| JP | 4007031 | | 11/2007 |

OTHER PUBLICATIONS

International Preliminary Report on Patentability and Written Opinion of the International Searching Authority issued Aug. 12, 2010 in International (PCT) Application No. PCT/JP2008/003579 (in English).

International Search Report issued Feb. 17, 2009 in International (PCT) Application No. PCT/JP2008/003579.

* cited by examiner

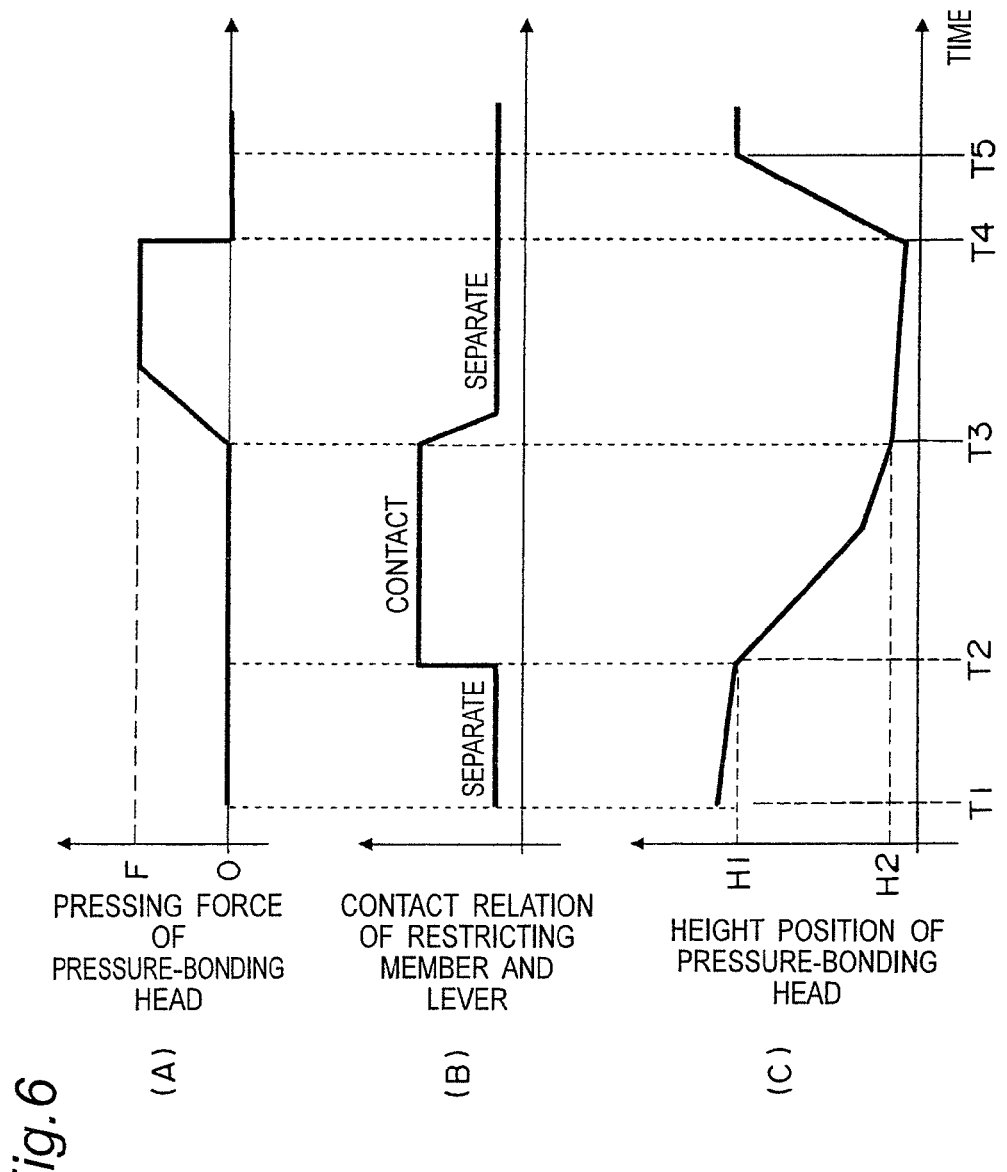

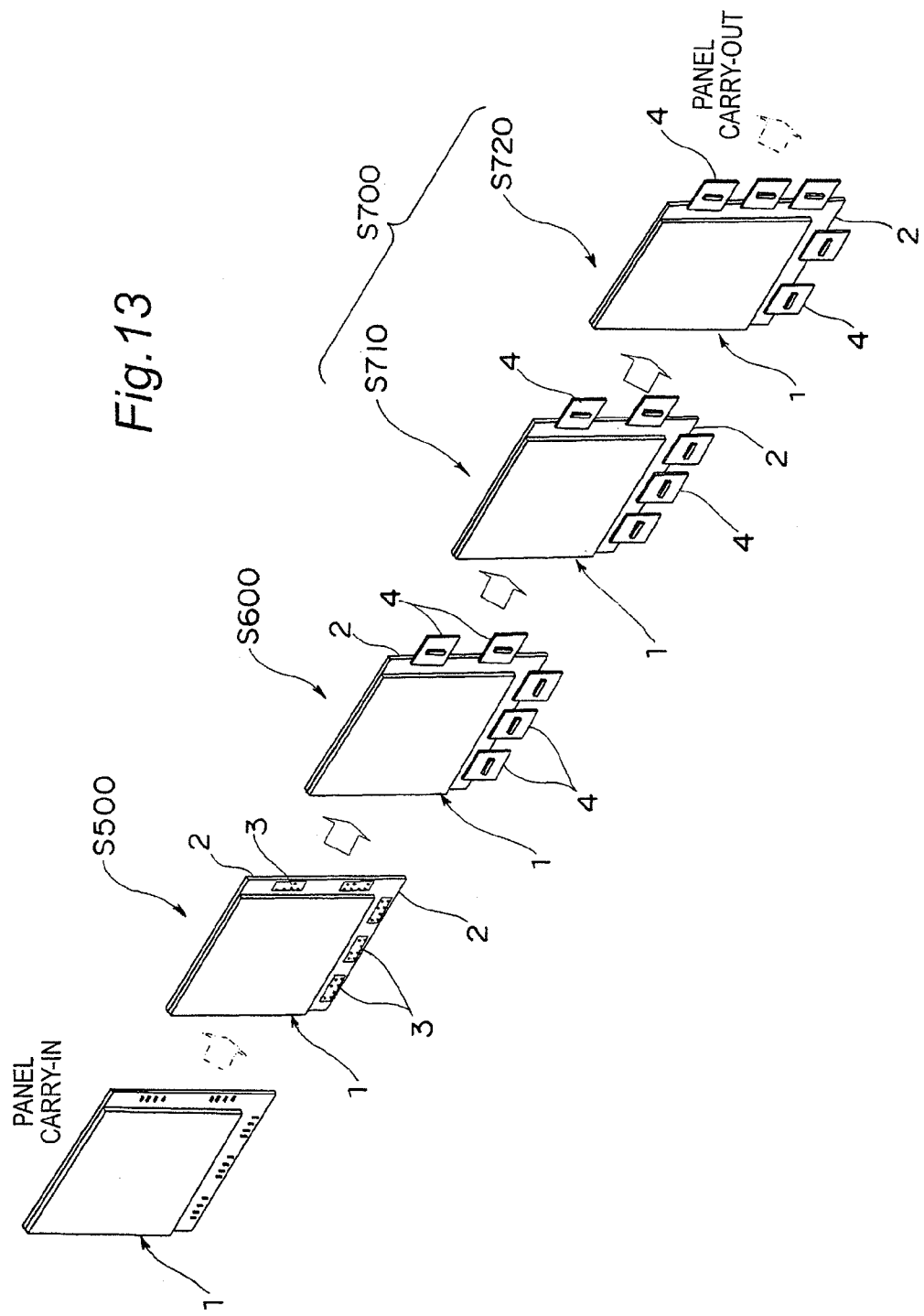

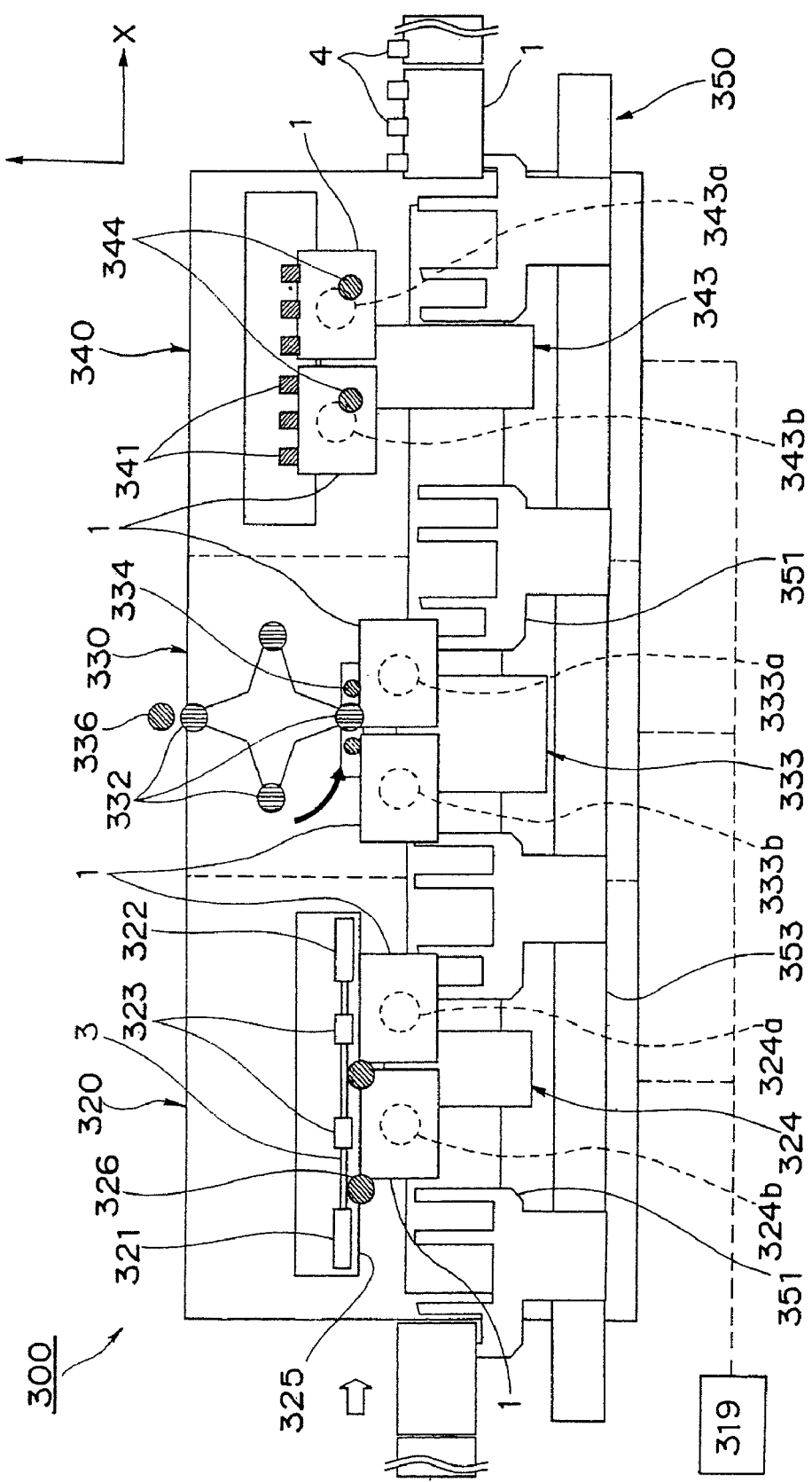

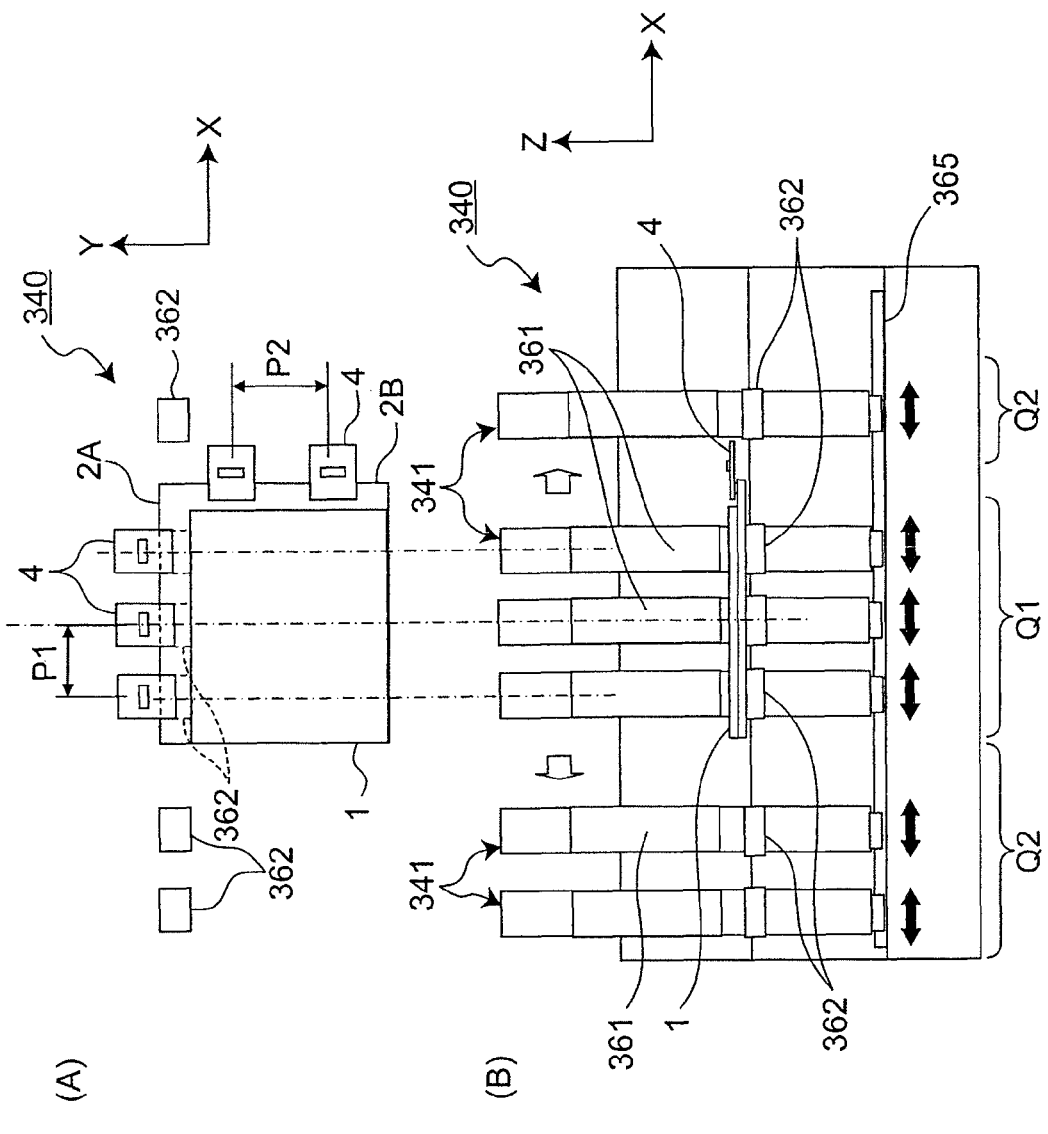

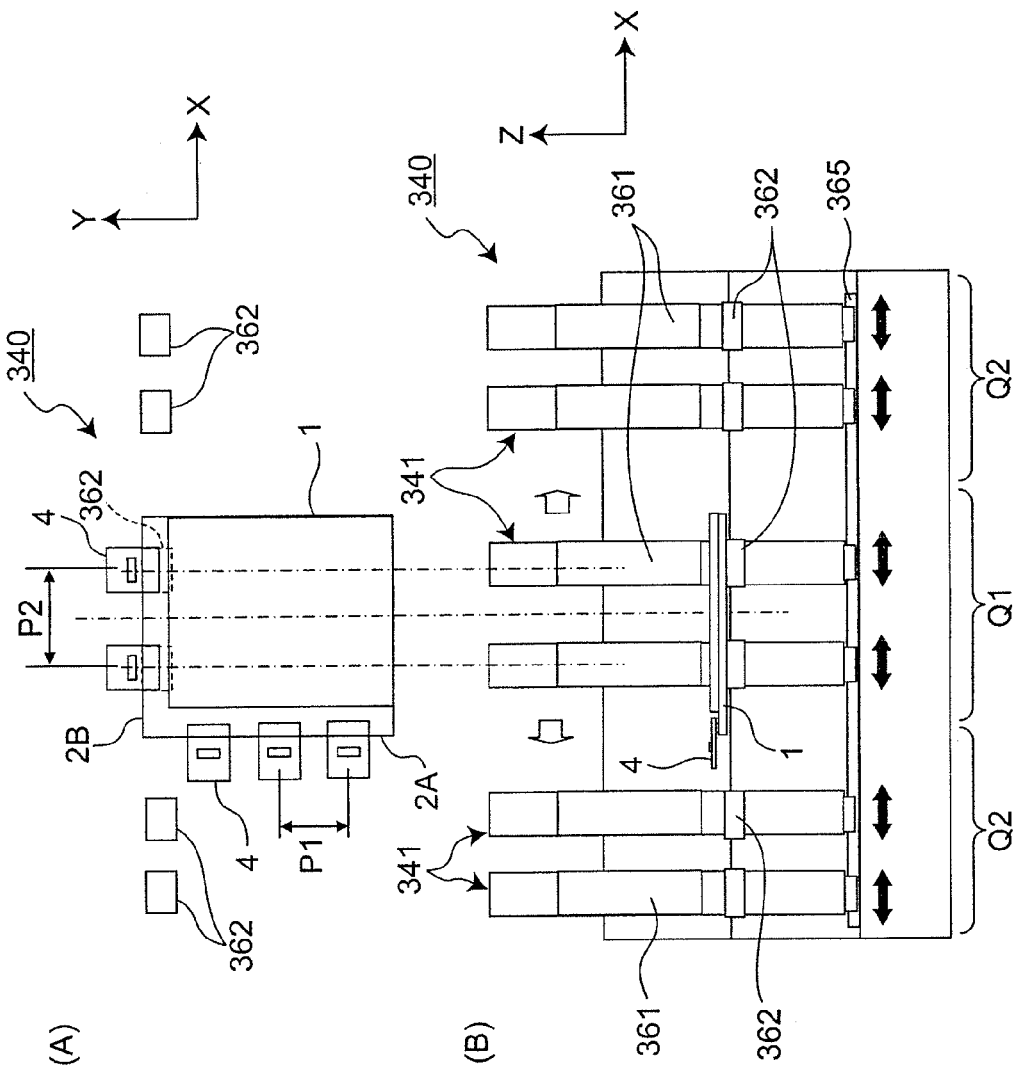

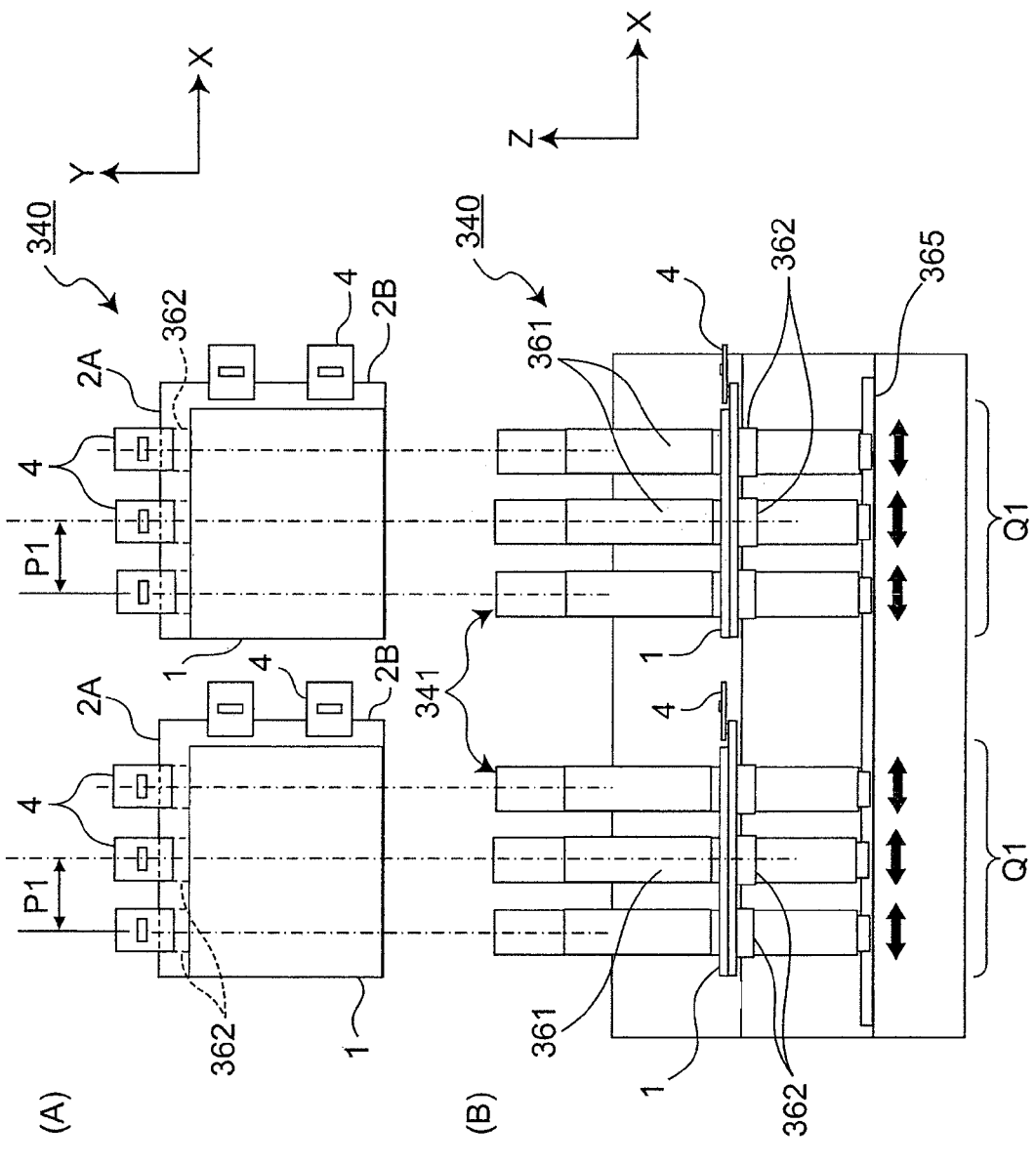

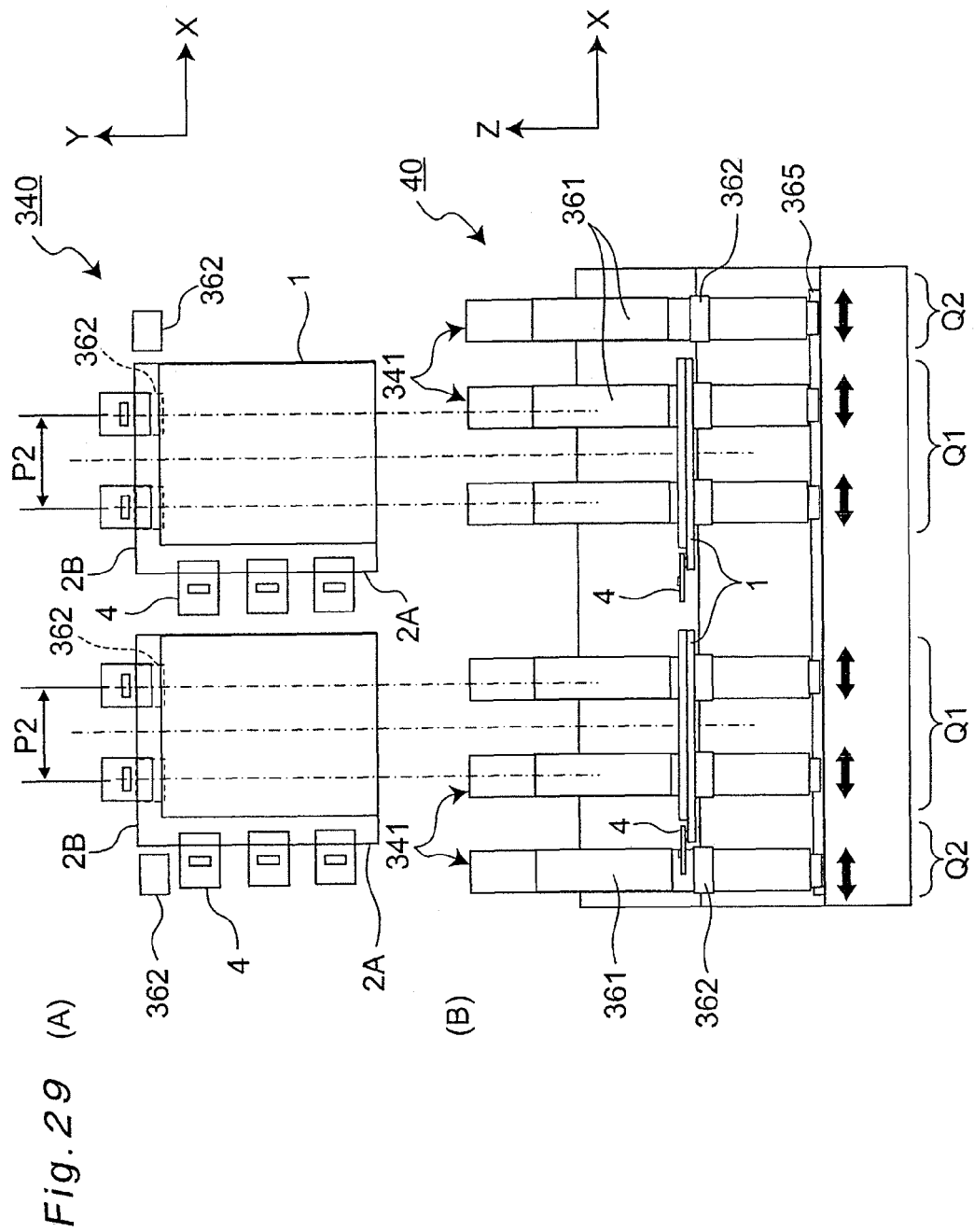

COMPONENT MOUNTING APPARATUS AND METHOD

CROSS REFERENCE TO RELATED APPLICATIONS

This application is a national stage application of PCT/JP2008/003579, filed on Dec. 3, 2008, which claims priority to Japanese patent application numbers JP 2007-313727, JP 2007-313722, and JP 2007-313718, all filed on Dec. 4, 2007.

TECHNICAL FIELD

The present invention relates to a component mounting apparatus and method for pressing and pressure-bonding components to component pressure-bonding areas of a substrate typified by substrates having component pressure-bonding areas in their edge portions such as, in particular, liquid crystal glass panel substrates and plasma display panel substrates.

BACKGROUND ART

Conventionally, manufacture of display devices includes a pressure-bonding mounting process of electronic components, mechanical components, optical components or other components, flexible printed circuit boards (FPC boards) or other boards or substrates, or COG (Chip On Glass), COF (Chip On Film), IC chips, TCP (Tape Carrier Package) or other semiconductor package components, onto such substrates as liquid crystal display (LCD) panel substrates, plasma display panel (PDP) substrates (hereinafter, referred to as 'panel substrates').

A component mounting system (component mounting line) for such panel substrates (e.g., liquid crystal display substrate) as mentioned above includes: an ACF applying device for performing an ACF applying step of applying an anisotropically conductive film (ACF) sheet to each of terminal portions (component pressure-bonding areas) formed in one-side or two-side edge portions of a panel substrate held by a component holding device; a component temporary pressure-bonding device for performing a component temporary pressure-bonding step of temporarily pressure-bonding TCPs or other components via an ACF sheet in each terminal portion; a final pressure-bonding device for performing a final pressure-bonding step of pressure-bonding and thereby mounting the components, which have been temporarily pressure-bonded to the terminal portions, by temporary pressure-bonding for pressuring with high pressure and temperature and heating so that the components are pressure-bonded via the ACF sheet; and a substrate conveyor device for conveying panel substrates one by one with their lower face sides is held so that the panel substrates can be worked at the individual devices. In a conventional component mounting line constructed as mentioned above, panel substrates, while conveyed in succession by the substrate conveyor device, are subjected to specified process steps in the individual devices, by which component mounting to each terminal portion of the panel substrates is fulfilled.

In recent years, panel substrates to be treated in such a conventional component mounting line come in various sizes, for example, from relatively small-sized panel substrates for use in mobile phones to relatively large-sized panel substrates for use in computers. Also, pressure-bonding positions of the components in the terminal portions of the substrates differ depending on the type of the panel substrate to be treated. In order to meet component pressure-bonding to such various types as shown above, for example, JP 3275744 B2 (Literature 1) and JP 2006-287011 A (Literature 2) adopt a structure in which differences in component pressure-bonding position depending on the type of the panel substrate can be managed by moving a pressure-bonding head and a backup stage that supports terminal portions of the panel substrate from below during the pressure-bonding operation are moved along the terminal portions of the panel substrate.

Problems to be Solved by the Invention

Particularly, Patent Literature 2 adopts a structure in which a plurality of pressure-bonding units each composed of one pair of a pressure-bonding head and a backup stage are arrayed so that the placement position or number of units in use can be arbitrarily selected depending on specifications of the panel substrate. However, with the structure of Literature 2, only one pressure-bonding unit can be adjusted for its placement by one unit-position adjusting means provided for a plurality of pressure-bonding units, and a plurality of pressure-bonding units cannot simultaneously be adjusted for placement. Because of this, each time the type of the panel substrate to be treated by the component mounting line is changed, the individual pressure-bonding units are adjusted for their positions one by one by the unit-position adjusting means to prepare for the placement of pressure-bonding position of the panel substrate of the new type. Consequently, with the structure of Literature 2, such positional adjustment of the individual pressure-bonding units as shown above takes time naturally.

Meanwhile, panel substrates' specifications also have been being further diversified in recent years, so that in not a few panel substrates, the placement pitch or the count of component pressure-bonding positions differs between a longer-side terminal portion and a shorter-side terminal portion of the panel substrate. For such panel substrates, however, the conventional apparatus having the structure of Literature 2 needs to adjust the placement positions of the individual pressure-bonding units each time component pressure-bonding onto the shorter-side terminal portion is performed after the component pressure-bonding onto the longer-side terminal portion is carried out, thus being incapable of achieving efficient component pressure-bonding. Therefore, the component mounting line includes independent pressure-bonding devices, i.e., a longer-end side final pressure-bonding device for performing component pressure-bonding for the longer-side terminal portion and a shorter-side final pressure-bonding device for performing component pressure-bonding for the shorter-side terminal portion, thus making it ready to manage component pressure-bonding for such panel substrates.

Further, even in a case of a structural design that a plurality of pressure-bonding units are adjusted for their placement by a plurality of unit-position adjusting means, respectively, it is desired to downscale and simplify the apparatus construction from the viewpoint of speeding up placement changes of the individual pressure-bonding units.

SUMMARY OF THE INVENTION

Accordingly, an object of the present invention, lying in solving these and other issues, is to provide a component mounting apparatus and method capable of easily and promptly changing the placement of a plurality of pressure-bonding units each of which includes a pressure-bonding head and an edge-portion support member in component pressure-bonding to a substrate having component mounting areas in its edge portions, making it possible to achieve an efficient component pressure-bonding suitable for placement of component pressure-bonding positions in the edge portions of the substrate.

In order to achieve the above object, the present invention has the following constitutions.

According to a first aspect of the present invention, there is provided a component mounting apparatus for pressing and thereby pressure-bonding components to a component pressure-bonding area in an edge portion of a substrate, the apparatus comprising:

a plurality of pressure-bonding units which are arrayed in line and each of which includes a pressing member which moves in a pressing direction perpendicular to the substrate thereby pressing a component to a component pressure-bonding area of the substrate, and an edge-portion support member for supporting an edge portion of the substrate during the pressing by the pressing member;

a common pressing-member moving device for moving a plurality of pressing members integrally in the pressing direction; and a plurality of unit-moving devices which are provided for the plurality of pressure-bonding units, respectively, and which perform parallel movement of the pressure-bonding units along an edge portion of the substrate by independent operations for the respective pressure-bonding units thereby changing placement of the pressure-bonding units.

According to a second aspect of the present invention, there is provided the component mounting apparatus as defined in the first aspect, wherein each of the pressure-bonding units further comprises:

a pressing-member guide member for guiding back-and-forth movement of the pressing members in the pressing direction;

a unit support member in which the pressing-member guide member and the edge-portion support member are provided and which serves for supporting the pressing member via the pressing-member guide member; and a press driving part which is provided on the unit support member and which imparts to the pressing member a force for moving back and forth the pressing member along the pressing direction and a force for pressure-bonding components to the substrate, and wherein the component mounting apparatus includes, as the common pressing-member moving device, an operation speed restricting device having a restricting member for restricting, in common to the plurality of pressure-bonding units, operation speeds of the individual pressing members operated toward the edge-portion support member by the press driving part.

According to a third aspect of the present invention, there is provided the component mounting apparatus as defined in the second aspect, wherein in the operation speed restricting device, the restricting member is engageable directly or indirectly with the pressing member in a direction in which the pressing member is moved toward the edge-portion support member, the operation speed restricting device includes a restricting member moving device for moving back and forth the restricting member along the pressing direction, and the parallel movement of the pressure-bonding units along the edge portion of the substrate by the unit-moving devices is carried out in a state in which direct or indirect engagement between the restricting member and the pressing member is released.

According to a fourth aspect of the present invention, there is provided the component mounting apparatus as defined in the third aspect, wherein each of the pressure-bonding units further includes a lever member one end of which is rotatably connected to the press driving part placed at one side of the unit support member, the other end of which is rotatably connected to the pressing member placed at the other side of the unit support member, and which is rotatably supported by the unit support member at a portion between the one end and the other end, and the lever member has a fulcrum which is a support position by the unit support member, where one end of the lever member is a force point to which the force by the press driving part is applied while the other end is a point of action at which the applied force is made to act on the pressing member.

According to a fifth aspect of the present invention, there is provided the component mounting apparatus as defined in the third aspect, wherein in each of the pressure-bonding units, the press driving part is placed on an axis of back-and-forth movement of the pressing members along the pressing direction, and operation speed of the pressing members is restricted by the restricting member being engaged with the press driving part on the back-and-forth movement axis.

According to a sixth aspect of the present invention, there is provided the component mounting apparatus as defined in the second aspect, further comprising:

a support frame for movably supporting the pressure-bonding units along the edge portion of the substrate and for supporting the operation speed restricting device; and a moving device for moving back and forth the support frame along with the plurality of pressure-bonding units integrally in a direction extending along the edge portion of the substrate.

According to a seventh aspect of the present invention, there is provided the component mounting apparatus as defined in the first aspect, further comprising:

a substrate holding device for holding the substrate and moving the substrate so that the edge portion to which components to be pressure-bonded are placed on or above the edge-portion support member; and a control device which has pressure-bonding position information as to a plurality of components to be pressure-bonded to a component pressure-bonding areas in the edge portion of the substrate and which, based on the pressure-bonding position information, controls the individual unit-moving devices so as to perform parallel movement of the plurality of pressure-bonding units along the edge portion of the substrate by each independent operation so that the plurality of pressure-bonding units are placed coincident with pressure-bonding positions of the plurality of components, and moreover controlling the substrate holding device so as to place edge portions of the substrate at the pressure-bonding positions of the components on or above the edge-portion support member.

According to an eighth aspect of the present invention, there is provided the component mounting apparatus as defined in the first aspect, including, as the common pressing-member moving device, a common pressing-member up/down device for moving the pressing members integrally up and down to move the individual pressing members back and forth in the pressing direction.

According to a ninth aspect of the present invention, there is provided the component mounting apparatus as defined in the eighth aspect, further comprising guide support members for supporting the pressure-bonding units, respectively, so that the parallel movement along the edge portion of the substrate can be guided in a pressure-bonding operation execution area in which pressure-bonding units for execution of pressure-bonding operation for the substrate are placed, and withdrawal areas which are placed adjacently on both sides of the pressure-bonding operation execution area and in which pressure-bonding units for no execution of the pressure-bonding operation are placed.

According to a tenth aspect of the present invention, there is provided a component mounting method for pressing and thereby pressure-bonding a plurality of components to a component pressure-bonding area in an edge portion of a substrate, the method comprising:

with provision of a pressing member for pressing a component to a component pressure-bonding area in the substrate, a unit support member in which an edge-portion support member for supporting an edge portion of the substrate during pressure-bonding by the pressing member is provided, and a press driving part which is provided on the unit support member and which imparts to the pressing member a force for moving back and forth the pressing member along a pressing direction perpendicular to a surface of the substrate, moving a plurality of pressure-bonding units, which are arrayed in line, independently of one another along the edge portion of the substrate so that the pressure-bonding units become coincident with pressure-bonding positions for a plurality of components to be pressure-bonded to a component pressure-bonding area in the edge portion of the substrate, thus achieving positioning of the pressure-bonding units;

setting a plurality of pressure-bonding positions in the edge portion of the substrate on or above the edge-portion support member;

thereafter, generating a force for moving back and forth the pressing member by the press driving part of each pressure-bonding unit to operate the pressing member toward the edge-portion support member, and moreover, while making a common restricting member directly or indirectly engaged with each pressing member in a plurality of pressure-bonding units in a direction in which the pressing member is moved toward the edge-portion support member, controlling a moving speed of a common restricting member to commonly restrict operation speeds of the individual pressing members; and releasing the engagement between the pressing members and the common restricting member while contacting the pressing members with the components, and pressure-bonding a plurality of components to the edge portion of the substrate by the individual pressing members.

According to an eleventh aspect of the present invention, there is provided the component mounting method as defined in the tenth aspect, wherein in positional alignment between the pressure-bonding positions of a plurality of components in the edge portion of the substrate and a plurality of pressure-bonding units, the individual pressure-bonding units are supported so as to be movable in a direction along the edge portion of the substrate, and a support frame for supporting the common restricting member is moved integrally with the plurality of pressure-bonding units in the direction along the edge portion of the substrate.

According to a 12th aspect of the present invention, there is provided a component mounting method for pressing and thereby pressure-bonding a plurality of components to component pressure-bonding areas in a first edge portion of a substrate or board and a second edge portion of the substrate or board, the method comprising the steps of:

performing parallel movement of a plurality of pressure-bonding units which are placed in line and each of which includes a pressing member for pressing a component to a component pressure-bonding area of the substrate and an edge-portion support member for supporting the first edge portion or the second edge portion of the substrate during the pressure bonding, the parallel movement being along the first edge portion, so as to obtain coincidence with pressure-bonding positions of a plurality of components to be pressure-bonded to the component pressure-bonding area in the first edge portion of the substrate, thus achieving positioning of the pressure-bonding units;

thereafter, with the plurality of pressure-bonding positions of the first edge portion set on or above the edge-portion support member, moving down a plurality of pressing members integrally by a common pressing-member up/down device, whereby a plurality of components are pressure-bonded to the first edge portion;

thereafter, moving the first edge portion and the edge-portion support member apart from each other, and performing parallel movement of a plurality of pressure-bonding units, independently of one another, along the second edge portion so as to be coincident with pressure-bonding positions of a plurality of components to be pressure-bonded to the component pressure-bonding area in the second edge portion of the substrate, thus achieving positioning of the pressure-bonding units, and thereafter, with the plurality of pressure-bonding positions of the second edge portion set on or above the edge-portion support member, moving down a plurality of pressing members integrally by the common pressing-member up/down device, whereby a plurality of components are pressure-bonded to the second edge portion.

According to a 13th aspect of the present invention, there is provided the component mounting method as defined in the 12th aspect, wherein in execution of pressure-bonding operation for the first edge portion or the second edge portion of the substrate, a plurality of pressure-bonding units for execution of the pressure-bonding process are placed in a pressure-bonding operation execution area so that the first edge portion or the second edge portion can be supported by an edge-portion support member for the plurality of pressure-bonding units for execution of the component pressure-bonding process, and a plurality of pressure-bonding units for no execution of the pressure-bonding process are placed in a withdrawal area located at least on one end side of the pressure-bonding operation execution area so that the first edge portion or the second edge portion is not supported by the edge-portion support members of the plurality of pressure-bonding units that do not perform the component pressure-bonding process.

According to one aspect of the present invention, a component mounting apparatus comprises: a plurality of pressure-bonding units each including a pressing member for pressing a component to a component pressure-bonding area of a substrate or board, a unit support member provided with a pressing-member guide member for guiding back-and-forth operation of the pressing member in a pressing direction perpendicular to the substrate and an edge-portion support member for supporting an edge portion of the substrate during the pressing by the pressing member, and a press driving part provided in the unit support member and serving for imparting, to the pressing member, a force for back-and-forth movement of the pressing member along the pressing direction and a force for pressure-bonding a component; and a plurality of unit-moving devices which are provided for the plurality of pressure-bonding units, respectively, and which move the pressure-bonding units along an edge portion of the substrate by independent operations for the respective pressure-bonding units to thereby change placement of the pressure-bonding units. With such a constitution, it becomes possible to move the pressure-bonding units along the edge portion of the substrate by individual independent parallel operations (operations independent of one another), respectively, by their respective unit-moving devices in response to placement or number of a plurality of component pressure-bonding positions in component pressure-bonding areas of the substrate so that the placement of the pressure-bonding units can be changed so as to coincide with the component pressure-bonding positions.

Also, in this constitution, an operation speed restricting device for restricting the operation speed of each pressing member operated toward the edge-portion support member by the press driving part is not provided individually for each of the pressure-bonding units, but provided as a common operation speed restricting device for commonly restricting the plurality of pressure-bonding units. As a result of this, while it is made possible to generate force transfer to the pressing member by using the press driving part reliably as a pressure for pressure bonding, the operation speed of the pressing member in the pressing direction can be restricted so that the pressing member can be brought into contact with the component at a proper operation speed. Further, by such an operation speed restricting device included as a device in common to a plurality of pressure-bonding units, the pressure-bonding units can be downsized and simplified in structure, individually, and placement change of the pressure-bonding units can be achieved easily and promptly. Thus, the pressure-bonding operation can be carried out efficiently in accordance with component pressure-bonding positions that vary depending on specifications of the substrate.

According to another aspect of the invention, a component mounting apparatus comprises: a plurality of pressure-bonding units which are arrayed in line and each of which includes a pressing member for pressing a component to a component pressure-bonding area of a substrate or board, and an edge-portion support member for supporting an edge portion of the substrate during the pressing; and a plurality of unit-moving devices which are provided for the plurality of pressure-bonding units, respectively, and which perform parallel movement of the pressure-bonding units along the edge portion to thereby change placement of the pressure-bonding units. With such a constitution, it becomes possible to perform parallel movement of the pressure-bonding units by individual independent parallel operations (operations independent of one another), respectively, by their respective unit-moving devices in response to placement or number of a plurality of component pressure-bonding positions in component pressure-bonding areas of the substrate so that the placement of the pressure-bonding units can be changed so as to coincide with the component pressure-bonding positions. Thus, the pressure-bonding operation can be carried out efficiently in accordance with component pressure-bonding positions that vary depending on specifications of the substrate.

Also, in this constitution, there is included a common pressing-member up/down device for integrally moving back and forth the pressing members in the pressing direction by not individually but integrally moving up and down a plurality of pressing members. As a result of this, the pressure-bonding units can be downsized and simplified in structure, individually, and placement change of the pressure-bonding units by their parallel movement can be achieved easily and promptly. Thus, the pressure-bonding operation can be carried out efficiently in accordance with component pressure-bonding positions that vary depending on specifications of the substrate.

Also, in a component mounting method for pressing and thereby pressure-bonding a plurality of components to component pressure-bonding areas in mutually perpendicular first and second edge portions of a substrate or board having the first edge portion and the second edge portion, to which components are to be pressure-bonded, a plurality of pressure-bonding units which are arrayed in line and each of which includes a pressing member for pressing a component to a component pressure-bonding area of the substrate, and an edge-portion support member for supporting an edge portion of the substrate during the pressing are subjected to parallel movement, independently of one another, along the first edge portion so as to coincide with component pressure-bonding positions of a plurality of components to be pressure-bonded to the component pressure-bonding area in the first edge portion of the substrate, thus achieving positioning of the pressure-bonding units, and thereafter a plurality of pressure-bonding positions of the first edge portion are set on or above the edge-portion support member, a plurality of pressing members are moved down integrally by the common pressing-member up/down device so that a plurality of components can be pressure-bonded to the first edge portion. After that, the first edge portion and the edge-portion support member are separated from each other, and further a plurality of pressure-bonding units are moved in parallel, independently of one another, along the second edge portion so as to coincide with pressure-bonding positions of a plurality of components to be pressure-bonded to the component pressure-bonding area in the second edge portion of the substrate, thus achieving positioning of the pressure-bonding units, and thereafter with a plurality of pressure-bonding positions of the second edge portion set on the edge-portion support member, a plurality of pressing members are moved down integrally by the common pressing-member up/down device, by which a plurality of components can be pressure-bonded to the second edge portion. According to such a component mounting method, even in cases where the component pressure-bonding positions of the first edge portion and the component pressure-bonding positions of the second edge portion in the substrate differ from each other in their placement or number, the placement of the individual pressure-bonding units can be changed efficiently and promptly in response to specifications of the edge portions to which the pressure-bonding operation is executed. Further, a plurality of pressing members are moved down not by using their respective up/down devices but integrally by using a common pressing-member up/down device, the pressure-bonding units can be simplified in structure and reduced in weight, so that parallel movement of the individual pressure-bonding units can be efficiently achieved. Thus, component pressure-bonding can be carried out efficiently in accordance particularly with placement of component pressure-bonding positions that differ between the first edge portion and the second edge portion.

BRIEF DESCRIPTION OF DRAWINGS

These aspects and features of the present invention will become clear from the following description taken in conjunction with the preferred embodiments thereof with reference to the accompanying drawings, in which:

FIG. 6 is a graph showing time-based correlations among a graph (A) showing time-based changes of pressing force of the pressure-bonding head, a graph (B) showing time-based changes of a contact relation between a restricting member and a lever, and a graph (C) showing time-based changes of height position of the pressure-bonding head;

FIG. 8(A) is a schematic plan view and FIG. 8(B) is a schematic front view;

FIG. 9(A) is a schematic plan view and FIG. 9(B) is a schematic front view;

FIG. 13 is an outer lead bonding step (vertical conveyance) of the second embodiment;

FIG. 23 is a schematic plan view of a component mounting line according to a third embodiment of the invention;

FIG. 26 is a schematic explanatory view of a state in which the final pressure-bonding operation is being performed for the longer-side terminal portion of one panel substrate, where FIG. 26(A) is a schematic plan view and FIG. 26(B) is a schematic front view;

FIG. 27 is a schematic explanatory view of a state in which the final pressure-bonding operation is being performed for the shorter-side terminal portion of one panel substrate, where FIG. 27(A) is a schematic plan view and FIG. 27(B) is a schematic front view;

FIG. 28 is a schematic explanatory view of a state in which the final pressure-bonding operation according to a modification is being performed for longer-side terminal portions of two panel substrates, where FIG. 28(A) is a schematic plan view and FIG. 28(B) is a schematic front view; and FIG. 29 is a schematic explanatory view of a state in which the final pressure-bonding operation is being performed for shorter-side terminal portions of two panel substrates, where FIG. 29(A) is a schematic plan view and FIG. 29(B) is a schematic front view.

DESCRIPTION OF EMBODIMENTS

Figure 1:
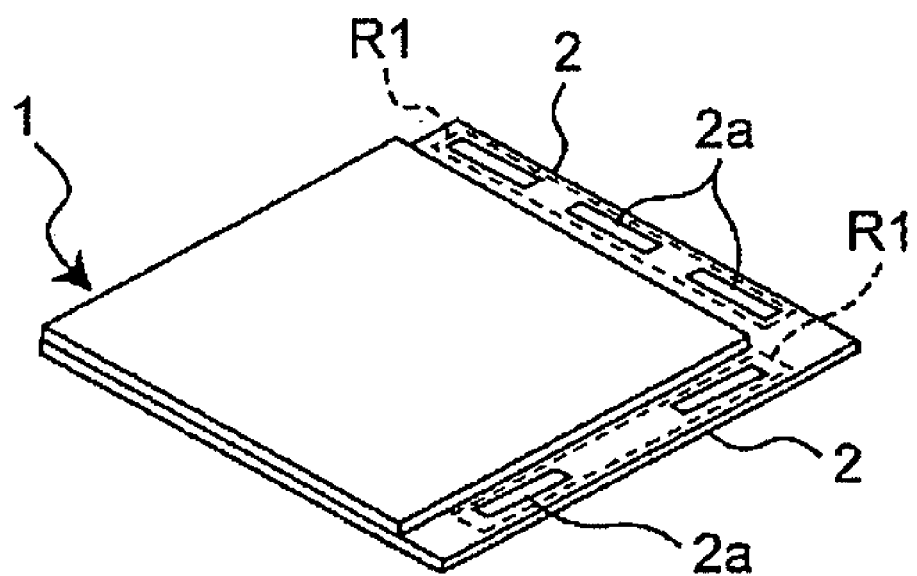
FIG. 1 is an appearance view of a panel substrate treated in a component mounting line according to a first embodiment of the present invention.

Before the description of the present invention proceeds, it is to be noted that like parts are designated by like reference numerals throughout the accompanying drawings.

Hereinbelow, embodiments of the present invention will be described in detail with reference to the accompanying drawings.

First Embodiment

For description of a component mounting apparatus and a component mounting method according to a first embodiment of the invention, first, a mode of a panel substrate 1 treated by the component mounting apparatus and method as well as an outline of a pressure-bonding process (or mounting process) performed on the panel substrate 1 will be described with reference to FIG. 1 showing the appearance of the panel substrate 1.

First, as shown in FIG. 1, the substrate treated in this first embodiment is a base board or substrate (hereinafter, referred to as 'panel substrate') typified by liquid crystal display (LCD) panel substrates or plasma display panel (PDP) substrates or the like, the substrate having terminal portions 2 in which component mounting areas R1 for components to be mounted thereon are placed in adjoining two-side edge portions in a rectangular shape. The panel substrate 1 as in this case is generally formed into a rectangular shape so that the terminal portions 2 are comprised of a longer-side terminal portion (which is a terminal portion on the deeper side in FIG. 1, being an example of the first edge portion) and a shorter-side terminal portion (which is a terminal portion on the front side in FIG. 1, being an example of the second edge portion). A plurality of terminal electrodes 2a are formed in each of the terminal portions 2, and individual components are to be pressure-bonded, thereby mounted, to the terminal electrodes 2a so as to be electrically connected thereto. An internal area inward of the edge portions in the panel substrate 1 serves as a display area in which images of picture, text or other information are to be displayed. It is noted that the panel substrate 1 is formed mainly from a glass material, its thickness being as thin as, for example, 0.5 mm or less as a state of the art.

Figure 2:
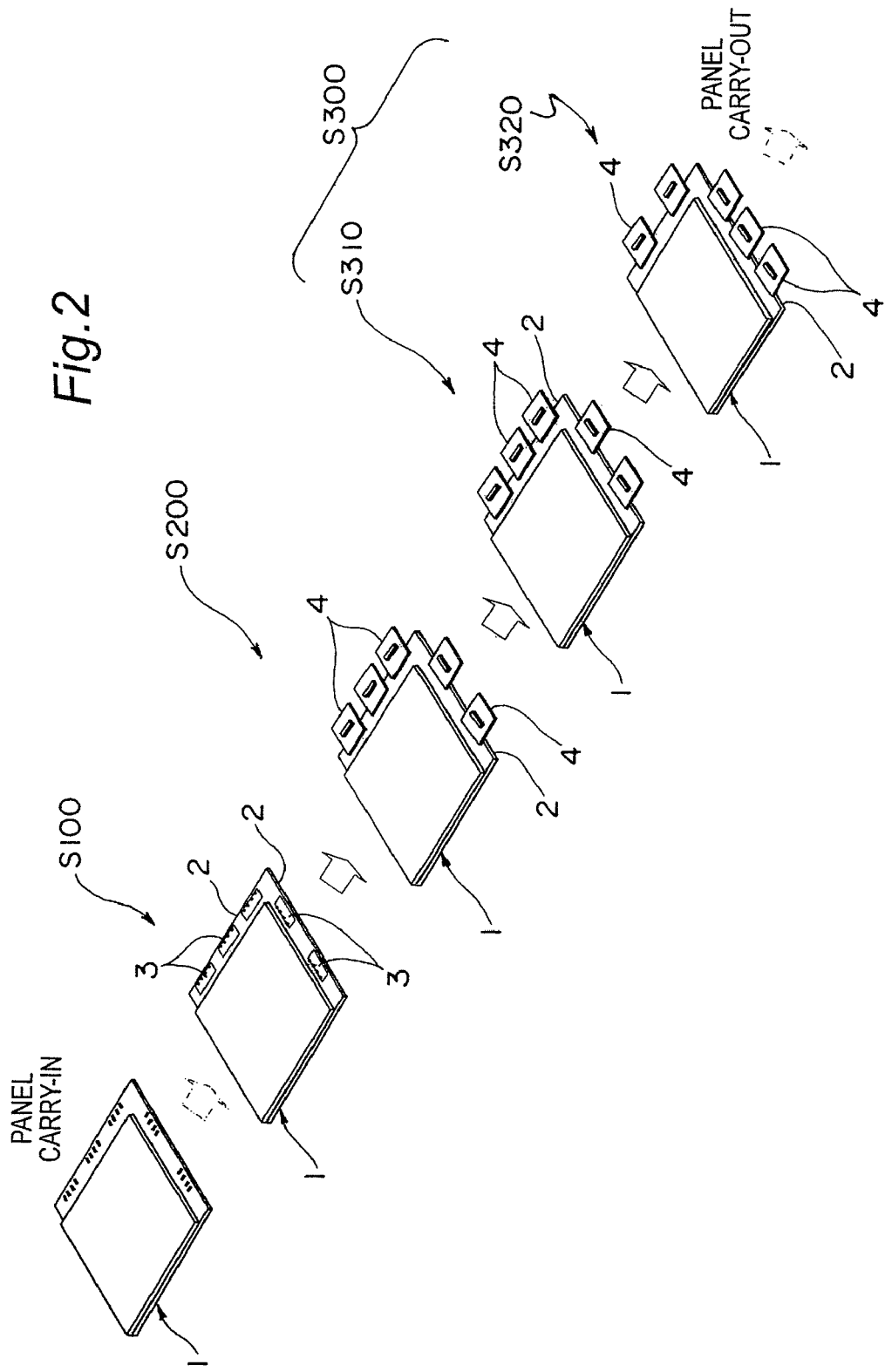
FIG. 2 is a schematic explanatory view of an outer lead bonding step (horizontal conveyance) in the first embodiment.

FIG. 2 shows an explanatory view of the procedure of the component mounting process, including a component mounting method of this first embodiment, for the panel substrate 1 having such a structure as described above. As shown in FIG. 2, the panel substrate 1 carried into a device that performs a component mounting step is subjected first to an ACF applying step S100, which is an example of a bonding member setting step, in which step an ACF sheet 3 as a bonding member is applied to the terminal electrodes 2a of the terminal portions 2, respectively. Thereafter, at a component temporary pressure-bonding step S200, which is an example of the component pressure-bonding step, TCPs 4 as an example of the component are temporarily pressure-bonded to each terminal electrode 2a via the ACF sheet 3. Further thereafter, at a final pressure-bonding step S300, the temporarily pressure-bonded TCPs 4 are further pressure-bonded and thereby mounted. It is noted that this final pressure-bonding step S300 is divided, and carried out as such, into a final pressure-bonding step S310 for the longer-side terminal portion of the panel substrate 1 and a final pressure-bonding step S320 for the shorter-side terminal portion of the panel substrate 1. Such a mounting step of the TCPs 4 onto the panel substrate 1 is called outer lead bonding step.

Figure 3:
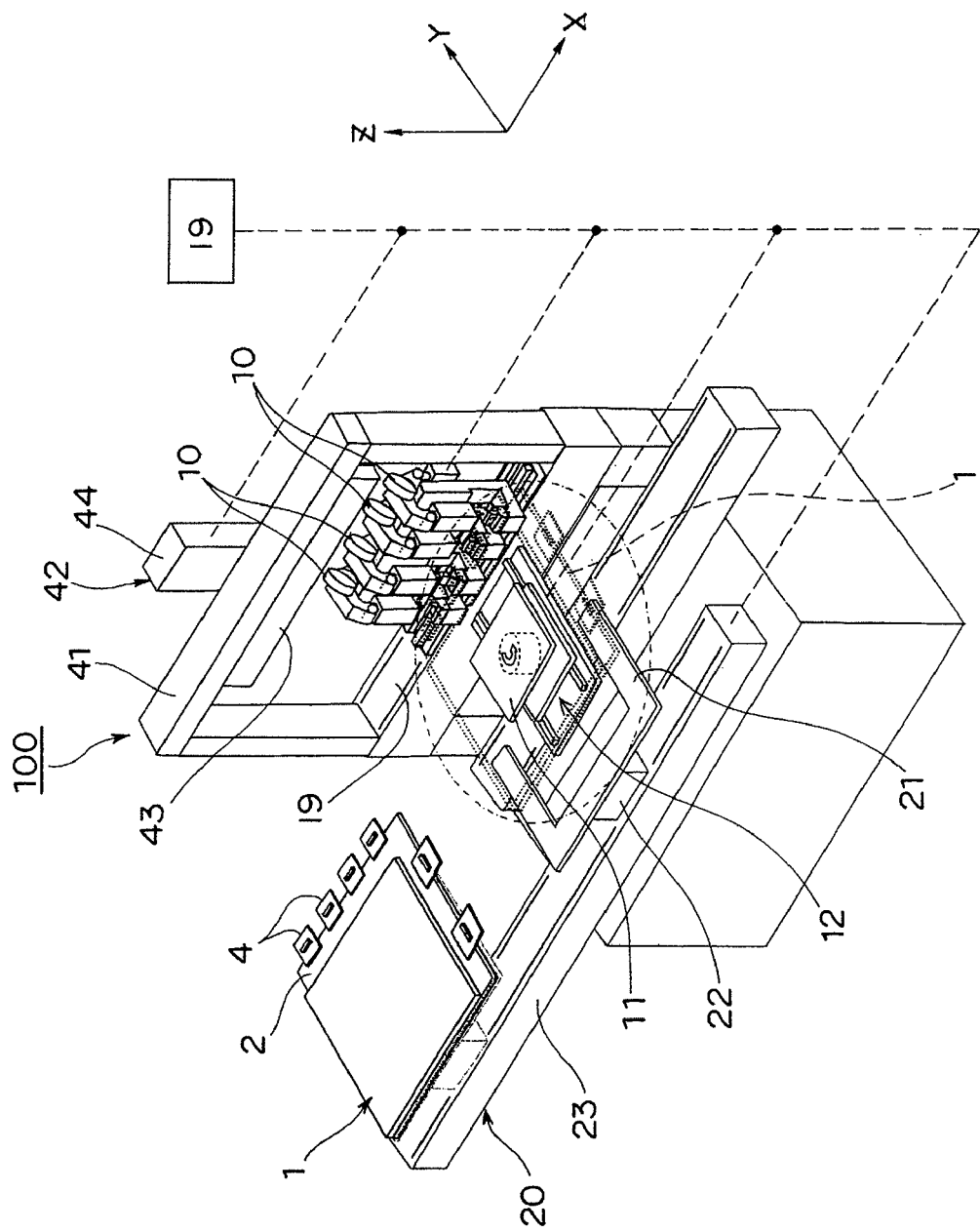
FIG. 3 is an appearance view of a final pressure-bonding device in the first embodiment.

Next, FIG. 3 shows a schematic view showing a construction of a final pressure-bonding device 100 which is an example of the component mounting apparatus for performing the final pressure-bonding step of such an outer lead bonding step.

The final pressure-bonding device 100 includes: a plurality of pressure-bonding units 10 (e.g., four pressure-bonding units 10) for finally pressure-bonding, i.e. thermo-compression bonding (mounting), the TCPs 4 to the individual terminal electrodes 2a via the ACF sheet 3 by simultaneously pressing and heating the TCPs 4 that have been temporarily pressure-bonded to the longer-side and shorter-side terminal portions 2 of the panel substrate 1 via the ACF sheet 3; a stage 11 for holding the panel substrate 1 that has been conveyed up (carried in); and a panel substrate holding device 12 for performing alignment of the TCPs 4 temporarily pressure-bonded to the terminal portions 2 of the panel substrate 1 held by the stage 11 with the pressure-bonding units 10, respectively. It is noted that the panel substrate holding device 12 has a function (X-Y movement function) of moving the panel substrate 1 in the X-axis direction or the Y-axis direction as in the figure, a function (θ-rotation function) of rotating the panel substrate 1 within a plane (horizontal plane) containing the X-axis direction and the Y-axis direction, and a function (up/down function) of moving up and down the panel substrate 1 in the Z-axis direction. By these functions, the longer-side and shorter-side terminal portions 2 of the panel substrate 1 can be aligned with their respective pressure-bonding units 10. Also, the final pressure-bonding device 100 is equipped with a recognition camera (not shown) for recognizing the position of each terminal portion 2 of the panel substrate 1 in order to achieve such positional alignment. In addition, in FIG. 3, the X-axis direction and the Y-axis direction are directions extending generally along the surface of the panel substrate 1, where a direction of conveyance of the panel substrate 1 is the X-axis direction, a direction orthogonal to the X-axis direction is the Y-axis direction, and a vertical direction in the figure is the Z-axis direction.

In the final pressure-bonding device 100 (or component mounting line), a substrate conveyance device 20 for performing the carry-in and -out of the panel substrate 1 between devices for performing individual process steps is provided. The substrate conveyance device 20 includes a panel holding part 21 for releasably sucking and holding a lower face of the panel substrate 1 by a vacuum suction means (not shown), an up/down part 22 for performing up/down operations of the panel holding part 21, and a moving device 23 for performing conveyance of the panel substrate 1 between the individual devices by moving the panel holding part 21 and the up/down part 22 along the X-axis direction in the figure. It is noted that although this first embodiment is described below in a case, as an example, in which the panel holding part 21 fulfills the holding of the panel substrate 1 by vacuum suction means, it is also possible, instead of such a case, that the panel substrate 1 is held by a panel holding part having a mechanical chuck means.

The final pressure-bonding device 100 also includes a control device 19 for integrally performing operation control of component members such as the individual pressure-bonding units 10 in association with their operations. By this control device 19, the final pressure-bonding step is carried out for the panel substrate 1 carried into the final pressure-bonding device 100 while the individual pressure-bonding units 10 are individually or integrally controlled in operation.

Figure 4:
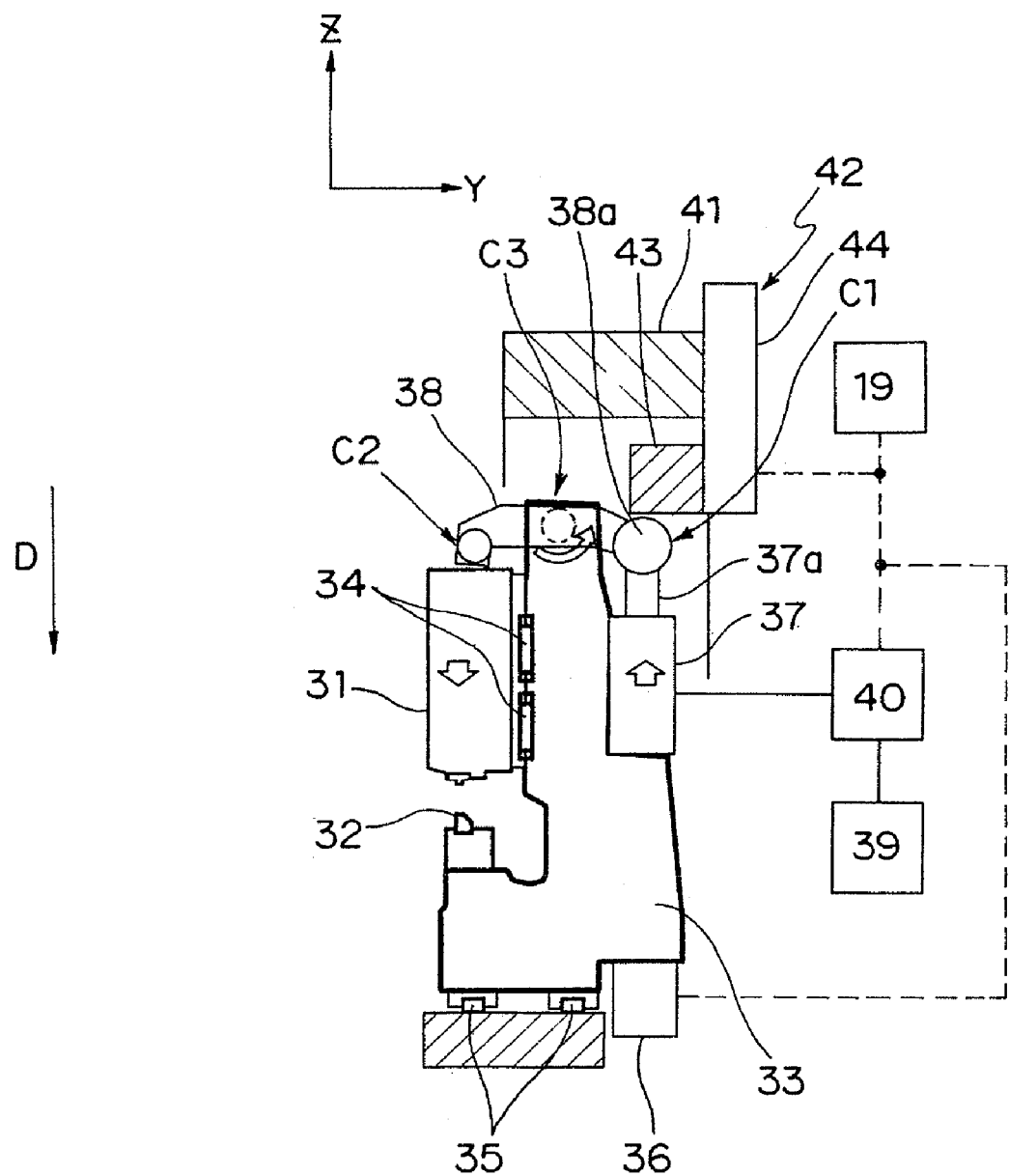
FIG. 4 is a schematic side view of the final pressure-bonding device in the first embodiment as viewed in an X-axis direction.

FIG. 4 is a schematic side view of the pressure-bonding unit 10 included in the final pressure-bonding device 100. With reference to FIGS. 3 and 4, construction of the final pressure-bonding device 100 and the pressure-bonding unit 10 will be explained in more detail.

As shown in FIG. 3, the final pressure-bonding device 100 includes, as a plurality of pressure-bonding units 10, a total of, e.g., four pressure-bonding units 10 arrayed in line in the X-axis direction. Each of the pressure-bonding units 10 includes a pressure-bonding head 31 which is an example of a pressing member for pressing and pressure-bonding the temporarily pressure-bonded TCPs 4 to the terminal portions 2 of the panel substrate 1 via the ACF sheet 3, and a backup stage 32 which is an example of an edge portion support member for supporting the terminal portions 2 of the panel substrate 1 from their lower face side during the pressure-bonding operation by the pressure-bonding head 31.

As shown in FIGS. 3 and 4, in each pressure-bonding unit 10, the backup stage 32 is fixed at a lower portion of a unit frame 33, which is a cylindrical member having a generally L-shaped cross section and formed from a rigid body, while the pressure-bonding head 31 is fitted at an upper portion of the unit frame 33 (an example of the unit support member) so that the pressure-bonding head 31 can guide up/down operation of the backup stage 32 via an LM guide 34 (an example of the pressing-member guide member) set along the Z-axis direction. In addition, although this first embodiment is described as having a structure in which the backup stage 32 is fixed at a lower portion of the unit frame 33, it is also possible, instead of such a case, for example, that the backup stage 32 is held by the unit frame 33, as a vertically movable type, so as to be movable up and down, where up/down operation of the backup stage 32 is performed by a backup stage up/down part.

As shown in FIGS. 3 and 4, on a base frame 13 of the final pressure-bonding device 100, two LM guides 35 are set so as to extend along the X-axis direction, where via the LM guides (an example of the guide support member) 35, the unit frame 33 in the four pressure-bonding units 10 is supported by the base frame 13 so as to be movable back and forth in the X-axis direction. Also, as shown in FIG. 4, a unit-moving motor (an example of a unit moving device) 36 for driving back-and-forth movement of the pressure-bonding unit 10 along the X-axis direction is provided in a lower portion of each pressure-bonding unit 10. That is, the four pressure-bonding units 10, each including the pressure-bonding head 31 and the backup stage 32, is enabled to move back and forth independently of one another while being guided along the two LM guides 35 in the X-axis direction by the individually provided unit-moving motor 36 being driven. It is noted here that the terms "movement independent of one another" mean that movement of one pressure-bonding unit 10 is fulfilled by driving of the unit-moving motor 36 provided for the one pressure-bonding unit 10 itself while movement of another pressure-bonding unit is fulfilled by driving of the unit-moving motor 36 provided for the other pressure-bonding unit 10 itself, so that moving speed and timing can be set individually for the pressure-bonding units 10, independently. In addition, movement control for those two members may be performed in association with each other for implementation of safety control such as prevention of mutual contact between the pressure-bonding units 10.

Also, as shown in FIG. 4, each pressure-bonding unit 10 includes a pressurizing unit (e.g., air cylinder) 37 which is an example of a fluid pressure cylinder serving as a press driving part for imparting, to the pressure-bonding head 31, a force for back-and-forth movement, i.e. up/down operation, of the pressure-bonding head 31 along a pressing direction D that is a direction (Z-axis direction) vertical (perpendicular) to the nearly horizontally positioned panel substrate 1 and for imparting a force for final pressure-bonding to the pressure-bonding head 31 set into contact with the TCPs 4. This pressurizing unit 37, which is placed opposite to the pressure-bonding head 31 with the unit frame 33 interposed therebetween in the Y-axis direction, is fixed to the unit frame 33. That is, in FIG. 4, the pressure-bonding head 31 is placed on the left side the unit frame 33 as in the figure, while the pressurizing unit 37 is placed on the right side of the unit frame 33 as in the figure.

In each of the pressure-bonding units 10, as shown in FIG. 4, a link mechanism is adopted as a means for mechanically transferring, to the pressure-bonding head 31, a force generated by the pressurizing unit 37. In more detail, the link mechanism is so made up that a lever 38 (an example of the lever member) rotatably supported at its generally near center by an upper end portion of the unit frame 33 is rotatably connected, at a left-hand end as in the figure, to an upper portion of the pressure-bonding head 31, and rotatably connected, at a right-hand end as in the figure, to an end portion of a rod 37a coupled to a piston inside the pressurizing unit 37. It is noted that the lever 38 is placed generally along the Y-axis direction and enabled to rotate at its support position or connecting position within a Y-Z plane. By virtue of this construction of the link mechanism, under the conditions that a connecting position C1 of a rod 37a of the pressurizing unit 37 with the lever 38 is a 'force point,' a connecting position C2 of the pressure-bonding head 31 with the lever 38 is a 'point of action,' and a support position C3 of the lever 38 by the unit frame 33 is a 'fulcrum,' a force generated by the pressurizing unit 37 can be transferred to the pressure-bonding head 31 via the lever 38. That is, a force acting along the Z-axis direction, which is generated by the pressurizing unit 37, while being inverted in direction by the lever 38, is transferred to the pressure-bonding head 31 through the lever 38 so that the pressure-bonding head 31 can be made to operate along the pressing direction D. With adoption of such a constitution that a force generated by the pressurizing unit 37 placed at a position on one side of the unit frame 33 and lower than the support position C3 can be transferred to the pressure-bonding head 31 placed at a position on the other side of the unit frame 33 and lower than the support position C3 by using the lever 38 supported at an upper portion of the unit frame 33, the pressure-bonding unit 10 can be made lower and more compact in structure as a whole while a better load balance in the pressure-bonding unit 10 can be achieved. Therefore, it becomes achievable to realize a pressure-bonding unit 10 smaller in scale and lower in the center of gravity, making it practicable to achieve prompter or more efficient movement of the pressure-bonding units 10 in the X-axis direction.

Also as shown in FIG. 4, the pressurizing unit 37 included in each pressure-bonding unit 10 is connected to a pressure generation source 39 via a lead pipe or the like. Feed quantity of compressed air is controlled so that a desired force (pressure) can be generated under control by a pressure control section 40.

Also as shown in FIGS. 3 and 4, on the base frame 13, an arch-type frame 41 formed by a rigid member and having a generally arch-like shape is fixed along the X-axis direction, and four pressure-bonding units 10 are arrayed inside the arch-type frame 41. Further, on this arch-type frame 41 is provided a head operation restricting device 42 (an example of an operation speed restricting device and a pressing-member moving device) that can restrict rotating operation of the lever 38 about the support position C3 by contact with the lever 38 so that operation of the pressure-bonding head 31 along the pressing direction D can be restricted. The head operation restricting device 42, which is placed along the X-axis direction inside the arch-type frame 41, includes one restricting member 43 which is a bar-like member contactable with an upper portion of an end portion 38a of the levers 38 of the four pressure-bonding units 10 in their connecting position C1, and a restricting member up/down device 44 for performing up/down operation back-and-forth movement along the pressing direction D) of the restricting member 43. It is noted that the restricting member 43, although provided one in number, may also be provided in a plural divided structure if operation restriction by the contact with the pressure-bonding units 10 is kept free from adverse effects.

With use of the head operation restricting device 42 constructed as shown above, in the restricting member 43 moved down by the restricting member up/down device 44, an upper portion of the end portion 38a of the lever 38 and a lower portion of the restricting member 43 are brought into contact with each other, in which contact state, a pressurizing force is transferred to the lever 38 by the pressurizing unit 37, while the restricting member 43 is moved up at a desired speed by the restricting member up/down device 44, so that the move-up speed of the end portion 38a of the lever 38 can be restricted to the desired speed. Particularly with a construction in which the lever 38 is operated by fluid pressure as in the pressurizing unit 37, it is difficult to promptly control the operation speed of the lever 38. Therefore, in this first embodiment, for secure control of the operation speed of the lever 38, the head operation restricting device 42 is adopted. By restricting the operation speed of the lever 38 like this, it becomes possible to restrict rotational speed of the lever 38 about the support position C3, so that the operation speed (move-down speed) of the pressure-bonding head 31 toward the backup tool 32 can be restricted to specified speeds including changes from high to low speeds. It is noted that since the restricting member 43 has a lower portion thereof brought into contact with the end portion 38a of the lever 38, the pressure-bonding head 31 is restricted in its operation speed during execution of its moving operation toward the backup tool 32. Also, when the restricting member 43 is moved up by the restricting member up/down device 44 so as to be separate and farther from the end portion 38a of the lever 38, operational restriction of the lever 38 can be released. That is, by the restricting member up/down device 44, the restricting member 43 can be moved back and forth between a contact position with the lever 38 and a withdrawal position away from the lever 38. As a result of this, it becomes possible to directly transfer a pressurizing force of the pressurizing unit 37 to the pressure-bonding head 31 through the lever 38, so that immediately after the contact of the pressure-bonding head 31 with the TCPs 4, which is a component to be mounted onto the panel substrate 1 via the ACF 3, transfer of a desired pressurizing force for pressure bonding of the TCPs 4 can securely be fulfilled. As shown in FIG. 3, the head operation restricting device 42 as in this case is not provided individually for each of the pressure-bonding units 10, but one head operation restricting device 42 is provided in common to the four pressure-bonding units 10. By providing the one common head operation restricting device 42 like this, the pressure-bonding units 10 can be made more simplified and downsized, individually, while a separable construction in which the restricting member 43 of the restricting member up/down device 44 that restricts the operation speed of the pressure-bonding head 31 and the pressure-bonding units 10 can be separated from each other makes it achievable to prompt the movement of the pressure-bonding units 10 along the X-axis direction, for example.

Further, information as to movement positions of the pressure-bonding units 10 in the X-axis direction by the unit-moving motors 36, respectively, is acquired by the control device 19, and the control device 19 performs movement control to prevent interference between the pressure-bonding units 10 with one another. Also, integral or individually independent restriction of the operation speed for the pressure-bonding heads 31 by the head operation restricting device 42 as well as control of the pressurizing force by the pressure control section 40, can be performed integrally by the control device 19.

Next, the pressure-bonding operation of the pressure-bonding unit 10 having such a construction as shown above is described with reference to the schematic explanatory views shown in FIGS. 5A to 5D and the graph shown in FIG. 6(A)-(C). It is noted that FIG. 6(A) is a graph showing changes in the pressing force of the pressure-bonding head, FIG. 6(B) is a graph showing changes in the contact relation between the restricting member 43 and the lever 38, and FIG. 6(C) is a graph showing changes in height position of the pressure-bonding head 31.

Figure 5A:
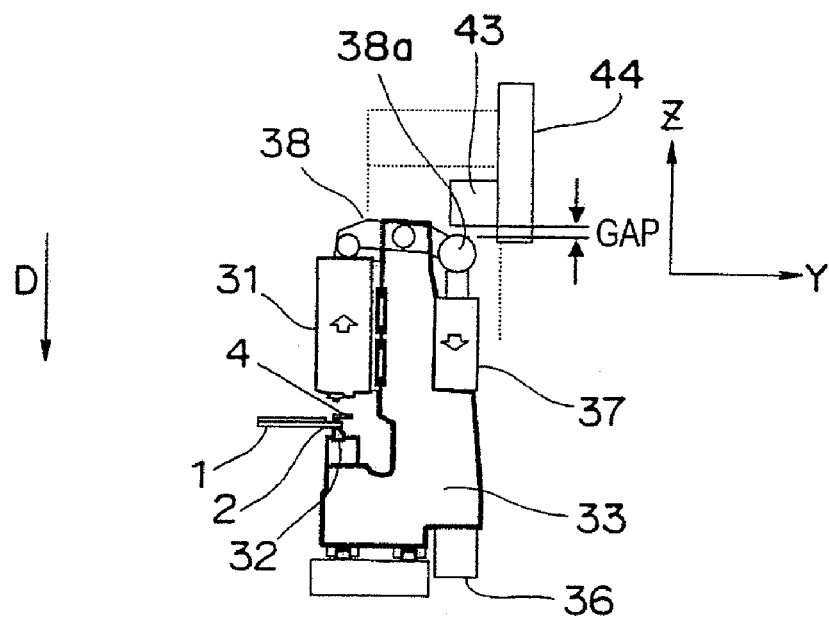
FIG. 5A is a schematic side view (time T1-T2) of the final pressure-bonding device in the first embodiment as viewed in the X-axis direction.

First, in a state shown in FIG. 5A (time T1-T2), in which the lever 38 and the restricting member 43 are separate from each other (i.e., the restricting member 43 is positioned in the withdrawal position), and the pressure-bonding heads 31 are positioned at a height position H1 so as to be separate and farther from the panel substrate 1 and the TCPs 4 placed on the backup tool 32 (see FIG. 6(A). In such a state, it is allowable to do carry out movement of the pressure-bonding units 10 in the X-axis direction, i.e., changes in placement pitch of the pressure-bonding units 10 or the like.

Figure 5B:
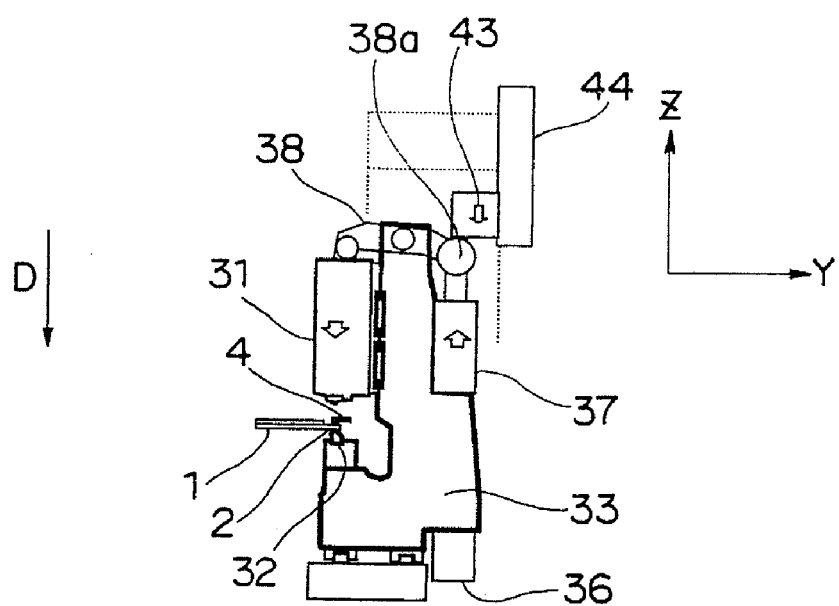
FIG. 5B is a schematic side view (time T2) of the final pressure-bonding device in the first embodiment as viewed in the X-axis direction.

Next, at time T2 as shown in FIG. 5B and FIG. 6(C), the restricting member 43 moved down by the restricting member up/down device 44, and the end portion 38a of the lever 38, are brought into contact with each other (i.e., the restricting member 43 is set into the contact position; see FIG. 6(B)). Along with this contact, a pressurizing force is generated by the pressurizing unit 37. Even if a pressurizing force is generated and transferred to the lever 38, operation of the lever 38 is restricted by the contact of the restricting member 43 with the lever 38, so that the pressure-bonding heads 31 are reliably prevented from being abruptly moved down.

Thereafter, from time T2 to T3, the restricting member 43 is moved up at a specified speed by the restricting member up/down device 44, so that the pressure-bonding head 31 is moved down in such a direction as to pressure-bond the TCPs 4 onto the panel substrate 1. It is noted that such a specified speed is not limited to a constant speed, and speed changes from high to low speeds may be made, for example, as apparent from FIG. 6(C). By the restricting member 43 being moved up gradually like this, the lever 38 is rotated after the restricting member 43, so that the pressure-bonding head 31 is moved down at a restricted speed from the height position H1 along the pressing direction D directed toward the TCPs 4 of the panel substrate 1 (see FIG. 6(C)).

Figure 5C:
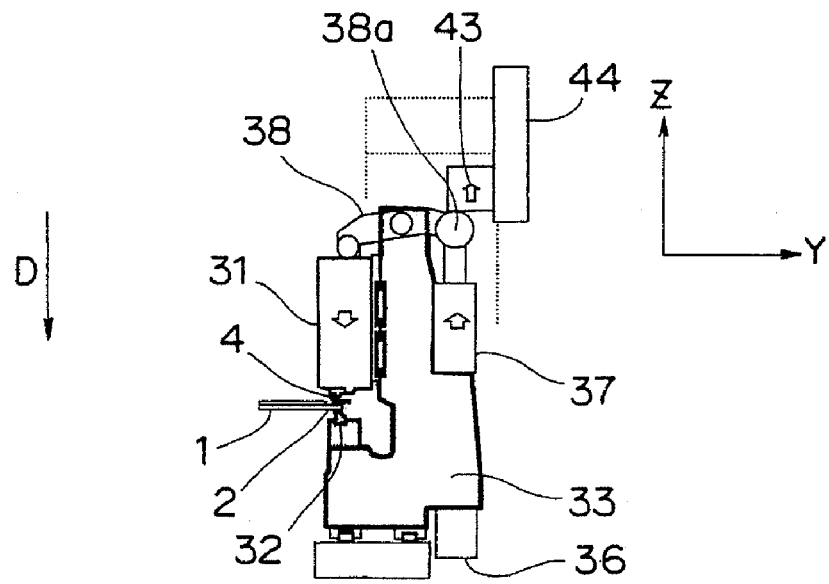
FIG. 5C is a schematic side view (time T3) of the final pressure-bonding device in the first embodiment as viewed in the X-axis direction.
Figure 5D:
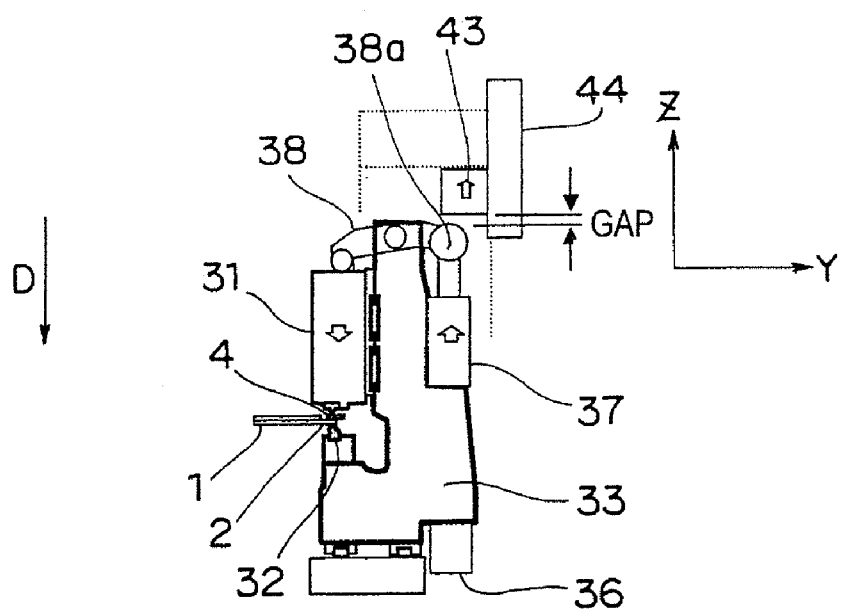
FIG. 5D is a schematic side view (time T3-T4) of the final pressure-bonding device in the first embodiment as viewed in the X-axis direction.

Then, upon reaching time T3, as shown in FIG. 5C, the pressure-bonding head 31 is moved down to a height position H2, where the lower end (contact surface or pressing surface) of the pressure-bonding head 31 is brought into contact with the TCPs 4 temporarily pressure-bonded to the terminal portion 2 of the panel substrate 1 placed on the backup tool 32. By this contact, move-down operation of the pressure-bonding head 31 is substantially limited (however, slight move-down due to pressing occurs), so that a force applied by the pressurizing unit 37 is generated as a pressing force for the TCPs 4 (see FIG. 6(A)). Along with this, as shown in FIG. 5D, the restricting member 43 that continues to be moved up at a specified speed (e.g., a speed resulting after a speed change from high to low speed before the contact of the lower end of the pressure-bonding head 31 with the TCPs 4) is separated from the end portion 38a of the lever 38 that is limited in its rotating operation by limitation of the move-down position of the pressure-bonding head 31 (see FIG. 6(B)).

Toward time T4, the pressing force for pressing the TCPs 4 by the pressure-bonding head 31 to the panel substrate 1 goes up to reach a specified pressing force F soon, and then the TCPs 4 are pressed against the panel substrate 1 with the pressing force F, thus the final pressure-bonding operation being performed. In addition, heating by an unshown heater (contained in the pressure-bonding head 31) is done in this final pressure-bonding operation.

Upon reaching the time T4, the final pressure-bonding operation is completed, where the pressure-bonding head 31 is operated in the reverse direction (i.e., moved up) by the pressurizing unit 37, so that the pressure-bonding head 31 is separated from the TCPs 4, making return to the state shown in FIG. 5A at time T5. By such a sequence of operations being carried out, the final pressure-bonding operation of the TCPs 4 to the panel substrate 1 is carried out.

Next, in the final pressure-bonding device 100, details of the procedure for carrying out the final pressure-bonding operation of the TCPs 4 to the panel substrate 1 will be described. For this description, FIG. 7 is a flowchart showing the procedure of the final pressure-bonding operation, FIGS. 8(A) and (B) is a schematic explanatory view showing a state in which the final pressure-bonding operation is being performed for a longer-side terminal portion 2A of the panel substrate 1, and FIG. 9(A) and (B) is a schematic explanatory view showing a state in which the final pressure-bonding operation is being performed for a shorter-side terminal portion 2B of the panel substrate 1.

Figure 7:
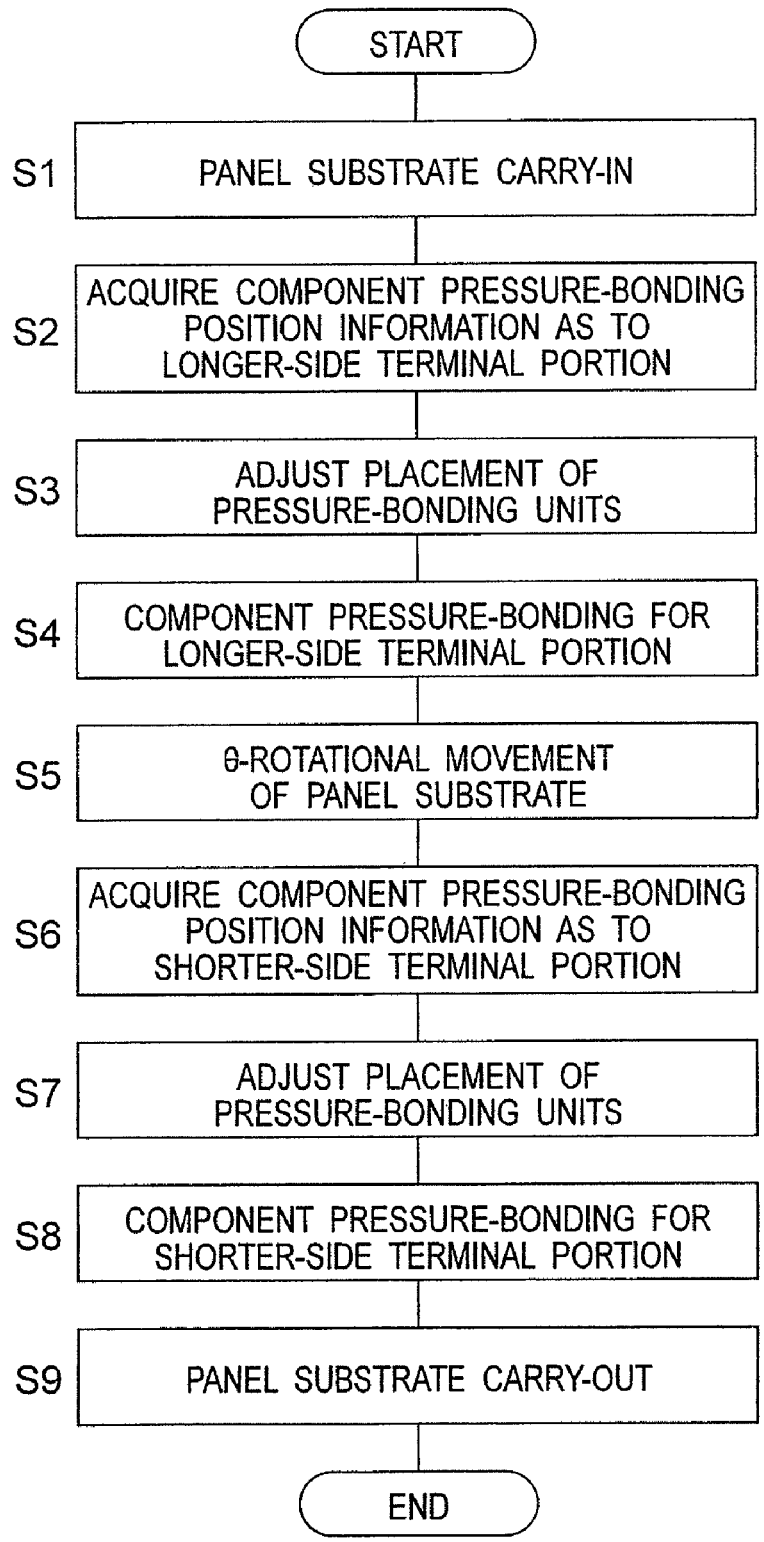
FIG. 7 is a flowchart showing a procedure for a final pressure-bonding method of the first embodiment.
Figure 8:
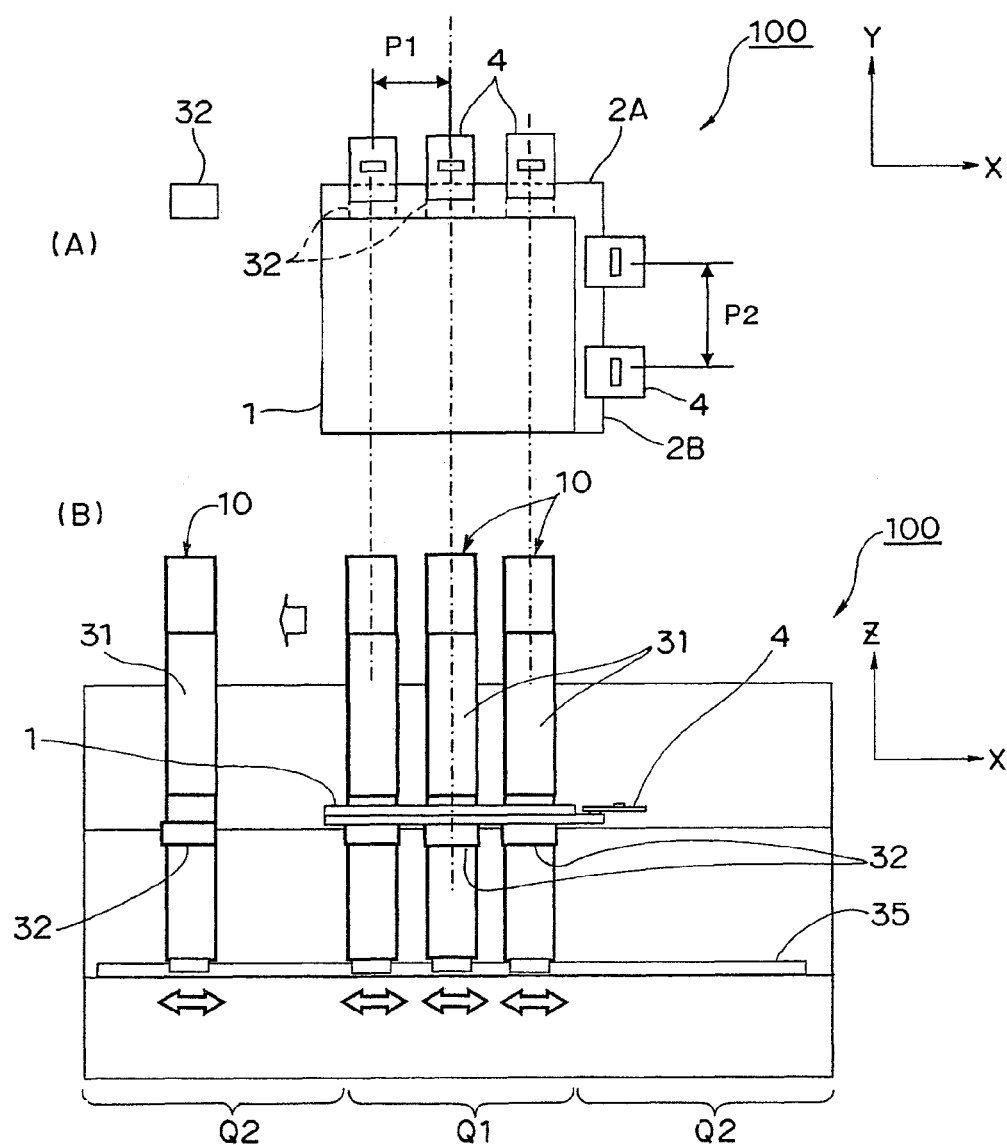
FIG. 8 is a schematic explanatory view of a state in which a final pressure-bonding operation is being performed for the longer-side terminal portion of the panel substrate, where

At step S1 of the flowchart of FIG. 7, one panel substrate 1 is carried in to the panel substrate holding device 12 of the final pressure-bonding device 100, and held by the stage 11. This panel substrate 1, as shown in FIG. 8(A), is held to the stage 11 in a posture in which the longer-side terminal portion 2A is a terminal portion extending along the X-axis direction while the shorter-side terminal portion 2B is a terminal portion extending along the Y-axis direction. Also, three TCPs 4 are temporarily pressure-bonded at an interval pitch P1 to the longer-side terminal portion 2A, while two TCPs 4 are temporarily pressure-bonded at an interval pitch P2 to the shorter-side terminal portion 2B. In addition, the interval pitches P1 and P2 are different from each other.

Next, in association with identification information as to the carried-in panel substrate 1, component pressure-bonding position information (first pressure-bonding position information) in the longer-side terminal portion 2A of the panel substrate 1 is acquired by the control device 19 (step S2). The component pressure-bonding position information contains information as to pressure-bonding positions of individual TCPs 4 in the longer-side terminal portion 2A, their interval pitch P1, number of TCPs 4 to be pressure-bonded, and the like. Such information may further include information as to types of TCPs 4, and heating temperature and heating pressure for thermo-compression bonding. For the acquisition of the component pressure-bonding position information, the information may be inputted from outside of the control device 19, or the information which has been preliminarily stored in a storage section or the like of the control device 19 may be read from the storage section or the like based on identification information as to the panel substrate 1 or production information as to the panel substrate 1.

When the component pressure-bonding position information for the longer-side terminal portion 2A is acquired in the control device 19, placement of the individual pressure-bonding units 10 is adjusted based on the acquired component pressure-bonding position information (step S3). More specifically, based on information as to the number (three) of TCPs 4 included in the component pressure-bonding position information, three pressure-bonding units 10 to be used for the final pressure-bonding operation are selected from among the four pressure-bonding units 10. In this process, the pressure-bonding units 10 that are closer to the center than the others, are selected one by one. In order that the selected three pressure-bonding units 10 are positioned in a pressure-bonding operation execution area Q1, which is an area generally close to the center in the array while the non-selected one pressure-bonding unit 10 is positioned in either one of withdrawal areas Q2 that are areas adjoining the pressure-bonding operation execution area Q1 on its both sides, the individual pressure-bonding units 10, while guided by the LM guides 35, are moved along the X-axis direction independently of one another by driving of the unit-moving motors 36 provided for the pressure-bonding units 10, respectively. By this positioning that the three pressure-bonding units 10 for execution of the final pressure-bonding operation are positioned in the pressure-bonding operation execution area Q1 while the one pressure-bonding unit 10 for no execution of the final pressure-bonding operation is positioned in the withdrawal area Q2, interference between the one pressure-bonding unit 10 for no execution of the final pressure-bonding operation and the panel substrate 1 can be prevented, so that the final pressure-bonding operation can be executed with reliability. Further, based on the information as to the interval pitch P1 of pressure-bonding positions of the TCPs 4 and their positions included in the component pressure-bonding position information, positions and placement internals of the selected three pressure-bonding units 10 are individually adjusted by the driving of the unit-moving motors 36. It is noted that such movement of the individual pressure-bonding units 10 is performed while the restricting member 43 is kept separate from the lever 38 (i.e., with the restricting member 43 positioned in the withdrawal position) (see FIG. 5A).

Placement adjustment, i.e. position and placement interval adjustment, of the pressure-bonding units 10 is completed as shown above, the panel substrate 1 is moved by the panel substrate holding device 12 so that the longer-side terminal portion 2A of the panel substrate 1 is set in position in order that three component pressure-bonding positions of the panel substrate 1 are positioned on the backup stage 32 of the selected three pressure-bonding units 10 (see FIGS. 5A and 8(A) and (B). As shown in FIGS. 8(A) and (B), interference between the one pressure-bonding unit 10 positioned in the withdrawal area Q2 and the panel substrate 1 is prevented. Thereafter, as shown in FIG. 5B, rotating operation of the lever 38 is performed under restriction of the lever 38 by the pressurizing unit 37 and the head operation restricting device 42, by which the individual pressure-bonding heads 31 are moved down so that pressure-bonding surfaces, i.e. lower faces, of the pressure-bonding heads 31 are brought into contact with the TCPs 4 as shown in FIG. 5C. Further as shown in FIGS. 5D and 6, a specified pressurizing force is applied to the TCPs 4 by the pressurizing unit 37, by which the three TCPs 4 are finally pressure-bonded, thereby mounted, via the ACF 3 in the three component pressure-bonding positions in the longer-side terminal portion 2A of the panel substrate 1 (step S4). After that, the individual pressure-bonding heads 31 are moved up by the pressurizing unit 37, respectively, resulting in such a state as shown in FIG. 5A.

Figure 22A:
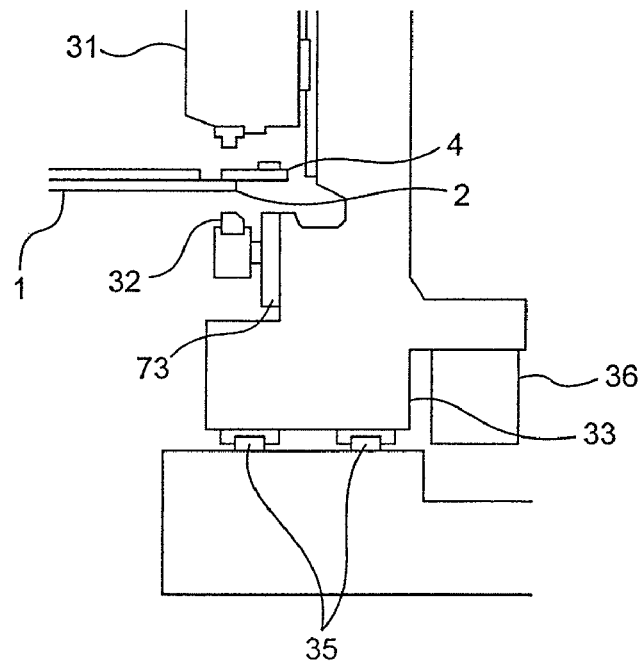
FIG. 22A is a schematic side view of a final pressure-bonding device according to a modification (with a backup stage up/down section included) as viewed in the X-axis direction.
Figure 22B:
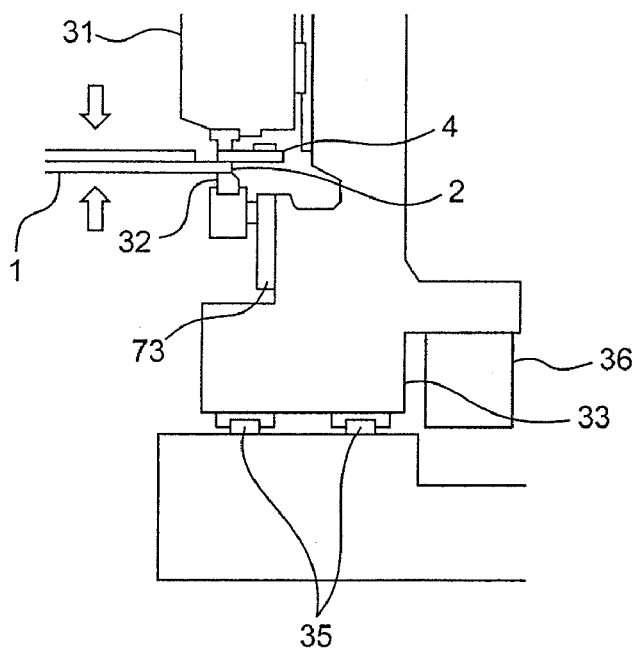
FIG. 22B is a schematic side view of a final pressure-bonding device according to a modification (with a backup stage up/down section included) as viewed in the X-axis direction.

The above description has been made in connection with a final pressure-bonding operation in a case where the backup stage 32 is a fixed-type one. However, as shown in FIGS. 22A and 22B, the backup stage 32 may be a movable-type one capable of moving up and down. With such a constitution, after the longer-side terminal portion 2A of the panel substrate 1 is placed above the backup stage 32, the pressure-bonding heads 31 are operated in such a direction as to approach the longer-side terminal portion 2A of the panel substrate 1, while the backup stage 32 is operated by a backup stage up/down part 73 in such a direction as to approach the longer-side terminal portion 2A of the panel substrate 1, by which the TCPs 4 can be pressure-bonded to the panel substrate 1. In this case, for the pressure-bonding unit 10 that does not perform the pressure-bonding operation final pressure-bonding operation, the backup stage 32 is positioned at a down position of the move-up and -down positions (support-releasing height position), which is a position lower than the pressure-bonding height position that is a support height position of the panel substrate 1, by which interference between the pressure-bonding unit 10 for no execution of pressure-bonding operation and the TCPs 4 and the panel substrate 1 can be prevented. Therefore, for example, even if the pressure-bonding unit 10 for no execution of the pressure-bonding operation is positioned not in the withdrawal area Q2 but in the pressure-bonding operation execution area Q1, interference between the pressure-bonding unit 10 and the panel substrate 1 can be prevented.

Next, upon completion of the final pressure-bonding operation for the longer-side terminal portion 2A, the panel substrate 1 is moved so as to be separate and farther from the individual backup stages 32, respectively, by the panel substrate holding device 12, and the held panel substrate 1 is rotationally moved by θ-rotation within the X-Y plane, so that the shorter-side terminal portion 2B of the panel substrate 1 is set so as to be postured along the X-axis direction (step S5).

Next, in the control device 19, component pressure-bonding position information as to the shorter-side terminal portion 2B of the panel substrate 1 (second pressure-bonding position information) is acquired (step S6). This component pressure-bonding position information contains information as to pressure-bonding positions of the individual TCPs 4 in the shorter-side terminal portion 2B, their interval pitch P2, and the number (two) of TCPs 4 to be pressure-bonded, and the like. In addition, although this first embodiment is described, as an example, in a case where the component pressure-bonding position information as to the longer-side terminal portion 2A and the component pressure-bonding position information as to the shorter-side terminal portion 2B are acquired independently of each other, it is also allowable that both types of information are acquired at the same time.

Figure 9:
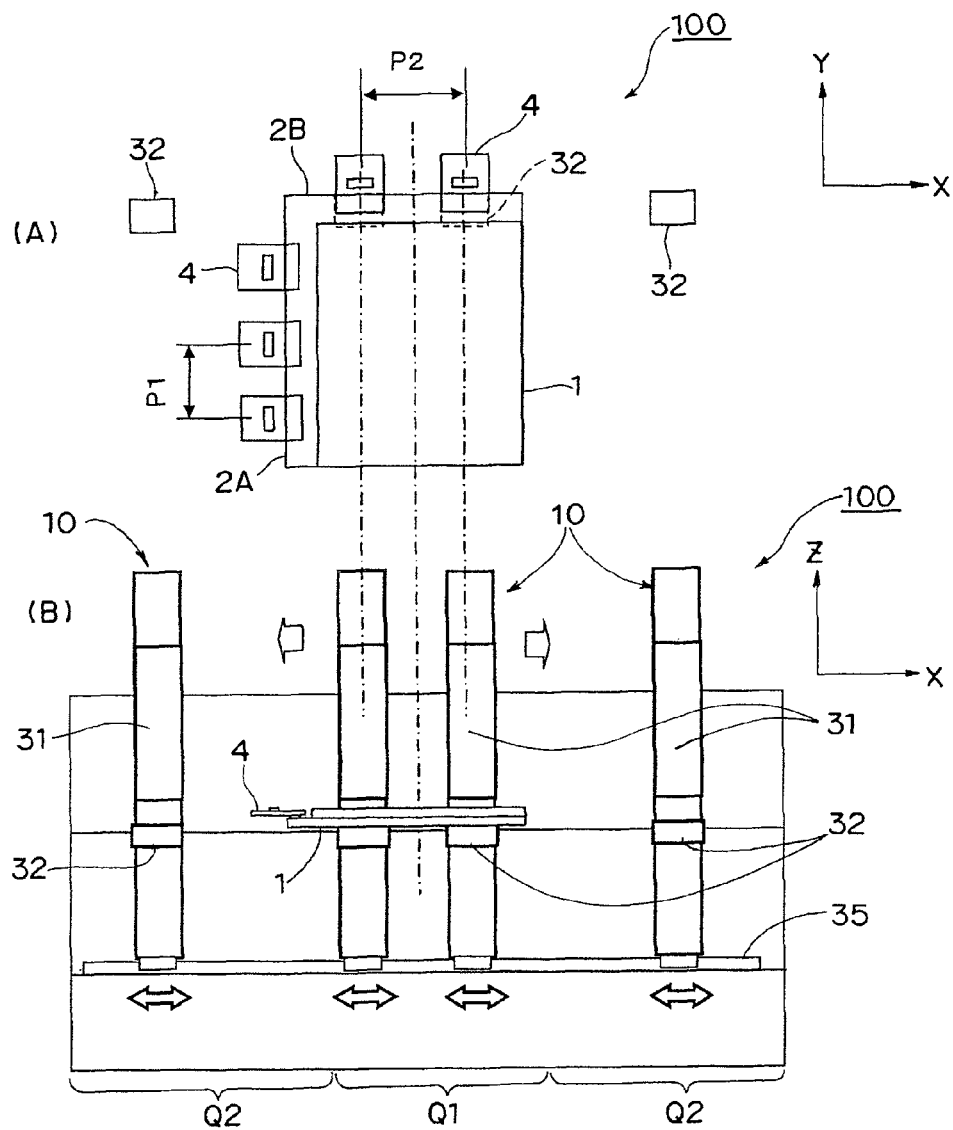
FIG. 9 is a schematic explanatory view of a state in which the final pressure-bonding operation is being performed for the shorter-side terminal portion of the panel substrate, where

Next, based on the acquired component pressure-bonding position information, placement of the individual pressure-bonding units 10 is adjusted in correspondence to the component pressure-bonding position information as to the shorter-side terminal portion 2B as shown in FIG. 9(A) and (B) (step S7). More specifically, based on the information as to the number (two) of TCPs 4 contained in the component pressure-bonding position information, two pressure-bonding units 10 positioned in the center of the four pressure-bonding units 10 are selected as the two pressure-bonding units 10 to be used for the final pressure-bonding operation from among the four pressure-bonding units 10. In order that the selected two pressure-bonding units 10 are positioned in the pressure-bonding operation execution area Q1 while the non-selected both-side two pressure-bonding units 10 are so as to be positioned in the respective withdrawal areas Q2, one for each side, the individual pressure-bonding units 10, while being guided by the LM guides 35, are moved along the X-axis direction by the driving of their respective unit-moving motors 36. Further, based on the information as to the interval pitch P2 of the pressure-bonding positions of the TCPs 4 and their positions contained in the component pressure-bonding position information, positions and placement interval of the selected two pressure-bonding units 10 are adjusted by the drive of their respective unit-moving motors 36. In addition, such movement of the pressure-bonding units 10 is performed while the restricting member 43 is kept separate from the lever 38 (see FIG. 5A).

Upon completion of the placement adjustment of the individual pressure-bonding units 10, the panel substrate 1 is moved by the panel substrate holding device 12, by which the shorter-side terminal portion 2B of the panel substrate 1 is placed so that two component pressure-bonding positions are set on the backup stages 32 of the selected two pressure-bonding units 10, respectively. FIGS. 9(A) and (B) shows a state in which the shorter-side terminal portion 2B of the panel substrate 1 is placed on the backup stages 32. As shown in FIGS. 9(A) and (B), interference between the pressure-bonding units 10 positioned in the withdrawal areas Q2 and the panel substrate 1 is prevented. Thereafter, the individual pressure-bonding heads 31 are moved down at a restricted operation speed via the lever 38 by the pressurizing unit 37 and the head operation restricting device 42, so that the pressure-bonding surfaces, i.e. lower faces, of the pressure-bonding heads 31 are brought into contact with the TCPs 4. Further, with a specified pressurizing force applied to the TCPs 4 by the pressurizing unit 37, the two TCPs 4 are finally pressure-bonded via the ACF 3, thereby mounted, at the two component pressure-bonding positions in the shorter-side terminal portion 2B of the panel substrate 1 (step S8). After that, the individual pressure-bonding heads 31 are moved up by the pressurizing unit 37.

In addition, as in the final pressure-bonding operation for the longer-side terminal portion 2A, in the final pressure-bonding operation for the shorter-side terminal portion 2B also, the backup stages 32 may be a movable-type one capable of moving up and down as shown in FIGS. 22A and 22B. In this case, after the shorter-side terminal portion 2B of the panel substrate 1 is placed above the backup stages 32, operating the pressure-bonding heads 31 and the backup stages 32 in such directions as to approach the shorter-side terminal portion 2B of the panel substrate 1 allows the TCPs 4 to be pressure-bonded to the panel substrate 1. In this process, for the pressure-bonding units 10 that do not perform the pressure-bonding operation, positioning the backup stage 32 at a move-down position (support-releasing height position or withdrawal height position) which is lower than the pressure-bonding position (support height position) makes it possible to prevent the interference between the pressure-bonding unit 10 for no execution of the pressure-bonding operation and the TCPs 4 and the panel substrate 1.

Upon completion of the final pressure-bonding operation for the shorter-side terminal portion 2B, the panel substrate 1 is moved by the panel substrate holding device 12 so as to be separate and farther from their respective backup stages 32, and the panel substrate 1 is carried out from the final pressure-bonding device 100 (step S9).

According to this first embodiment, the final pressure-bonding device 100 includes: a plurality of placed-in-array pressure-bonding units 10 including a pressure-bonding heads 31 for finally pressure-bonding TCPs 4 to the terminal portions 2 of the panel substrate 1 and a backup stages 32 for supporting the terminal portions 2 of the panel substrate 1 during the final pressure-bonding; and a plurality of unit-moving motors 36 which are provided for the plurality of pressure-bonding units 10 and which cause the pressure-bonding units 10 to be moved in parallel along the X-axis direction to change the placement of the pressure-bonding units 10. By this construction, according to component pressure-bonding position information as to the panel substrate 1, i.e. placement or number of plural component pressure-bonding positions in the terminal portions 2, the individual pressure-bonding units 10 are moved in parallel independently of one another by the unit-moving motors 36, respectively, so that the placement of the pressure-bonding units 10 can be made coincident with the placement of the component pressure-bonding positions. Thus, the final pressure-bonding operation can be carried out efficiently in accordance with component pressure-bonding positions that vary depending on specifications of the panel substrate 1.

Also, even in cases where the longer-side terminal portion 2A and the shorter-side terminal portion 2B in the panel substrate 1 differ from each other in pressure-bonding positions and interval pitches of the TCPs 4 and in the number of TCPs 4 to be pressure-bonded, component pressure-bonding appropriate to specifications of the individual terminal portions 2A, 2B can be fulfilled securely and efficiently by taking the steps of performing placement adjustment of the individual pressure-bonding units 10 based on the component pressure-bonding position information for the longer-side terminal portion 2A, then performing the final pressure-bonding operation for the longer-side terminal portion 2A, thereafter performing placement adjustment of the individual pressure-bonding units 10 based on the component pressure-bonding position information for the shorter-side terminal portion 2B, and then performing the final pressure-bonding operation for the shorter-side terminal portion 2B. Therefore, without providing pressure-bonding units for exclusive use as a longer-side use pressure-bonding unit and a shorter-side use pressure-bonding unit, positional changes to positions of the individual pressure-bonding units are promptly made so as to meet pressure-bonding pitches fitted to the respective pressure-bonding positions of the longer-side terminal portion 2A and the shorter-side terminal portion 2B by one final pressure-bonding device 100, so that component pressure-bonding to the panel substrate can be efficiently achieved.

Also, the pressure-bonding units 10 include the unit-moving motors 36 independently one for each. As a result, placement adjustment of such individual pressure-bonding units 10 can be promptly and efficiently achieved.

Also, in each of the pressure-bonding units 10, back-and-forth movement and pressing operation of the pressure-bonding heads 31 along the pressing direction D are performed by transferring a force generated by the pressurizing unit 37 to the pressure-bonding head 31 via the link mechanism. As such a link mechanism, the lever 38 rotatably supported by the unit frame 33 is used so that the force applied from the pressurizing unit 37 to one end of the lever 38 is transferred to the pressure-bonding head 31 connected to the other end of the lever 38 by using the principle of leverage. Further, for prevention of any abrupt movement of the pressure-bonding head 31 due to the force generated by the pressurizing unit 37, the end portion 38a of the lever 38 and the restricting member 43 are brought into contact with each other, so that the operation speed of the pressure-bonding heads 31 is made to follow the moving speed of the restricting member 43 by the restricting member up/down device 44. Therefore, the pressure-bonding heads 31 are controlled to be brought into contact with the TCPs 4 while operation (move-down operation) of the pressure-bonding heads 31 is being controlled securely, so that the final pressure-bonding operation can be fulfilled with appropriate pressing force.

Further, by such a head operation restricting device 42 being included as a common device among a plurality of pressure-bonding units 10, the individual pressure-bonding units 10 can be reduced in size and simplified in structure, so that placement changes of the pressure-bonding units 10 can be fulfilled easily and promptly. In particular, as the means for generating a force for operating the pressure-bonding heads 31, instead of an electric motor or the like, a fluid pressure cylinder (pressurizing unit 37) is adopted, by which the individual pressure-bonding units 10 can be made compact in structure. Further, such a device for controlling (restricting) the operation of the fluid pressure cylinder is not provided for each of the pressure-bonding units, but provided as one common device, by which the pressure-bonding units 10 can be event more compact in structure, allowing a weight reduction to be achieved. Thus, the movability by the unit-moving motors 36 can be made successful.

Under the condition that a plurality of pressure-bonding heads 31 are selected from among the four pressure-bonding heads 31, pressure-bonding heads 31 that are closer to the center side, are selected one by one. With this arrangement, in execution of the pressure-bonding operation of the TCPs 4 with restriction of the operation speed by such a common head operation restricting device 42 as shown above, a successful load balance relative to the structure of the head operation restricting device 42 can be obtained, so that the pressure-bonding quality of the TCPs 4 to the panel substrate 1 can be stabilized.

In the individual pressure-bonding units 10, a pair of the pressure-bonding head 31 and the backup stage 32 are provided, and with their mutual placement relation keep, movement for placement adjustment of the individual pressure-bonding units 10 is carried out. As a result of this arrangement, regardless of the position to which the pressure-bonding units 10 are moved, the parallelism (degree of parallelization) between the pressure-bonding surface (or pressing surface) of the pressure-bonding head 31 and the support surface of the backup stage 32 for the panel substrate 1 can be maintained constant. Thus, the pressure-bonding accuracy (mounting accuracy) in the final pressure-bonding step can be improved.

Figure 10:
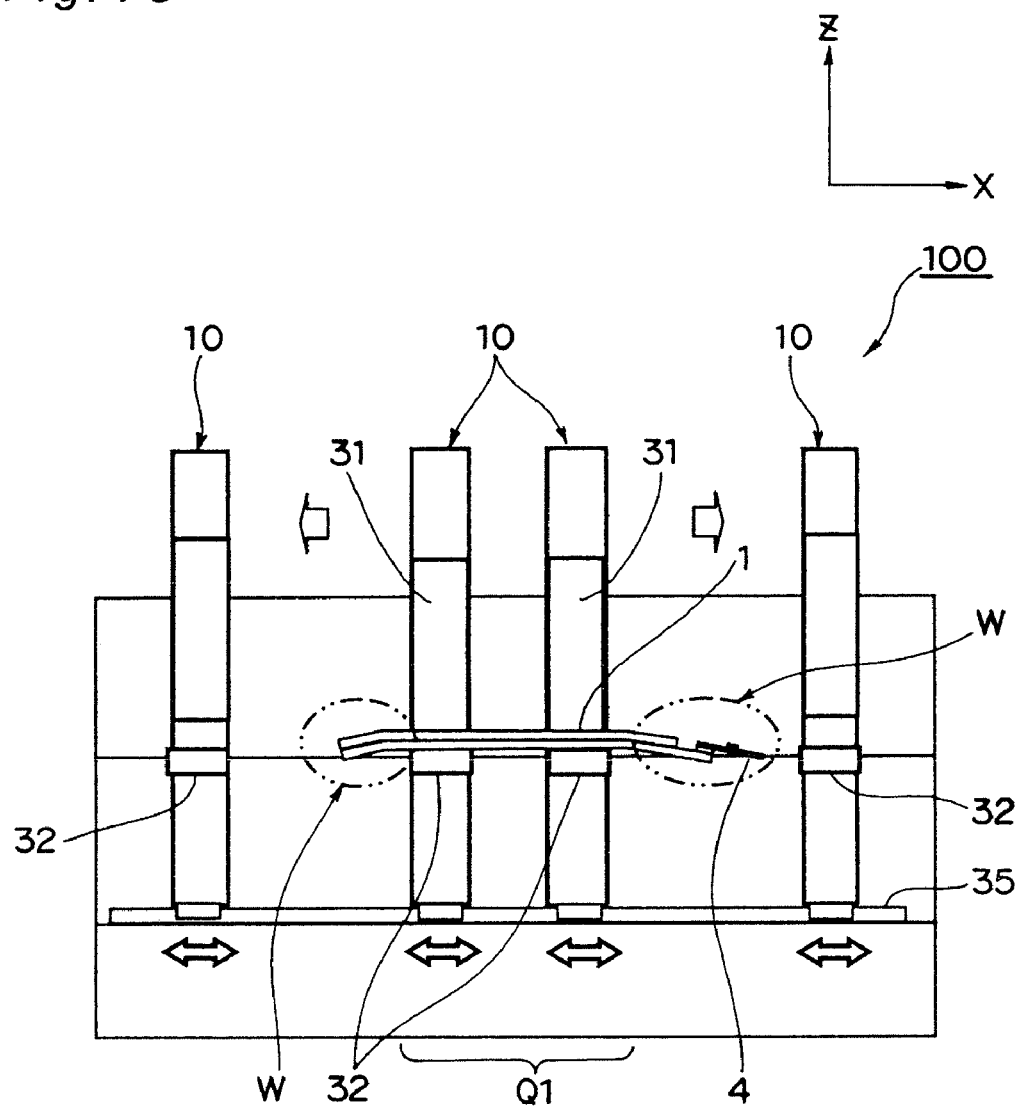
FIG. 10 is a schematic view showing a state in which the panel substrate with flexures caused at both end portions is held by the backup stage.

Also, in execution of the final pressure-bonding operation in the state in which selected pressure-bonding units 10 to be subjected to the final pressure-bonding operation for the panel substrate 1 are positioned in the pressure-bonding operation execution area Q1 while non-selected pressure-bonding units 10 to be subjected to no final pressure-bonding operation are positioned in the withdrawal areas Q2, it becomes possible to support the terminal portions 2 only by the backup stages 32 positioned in the pressure-bonding operation execution area Q1. For example, in a case where the panel substrate 1 has a flexure W occurring at both end portions as shown in FIG. 10, supporting proximities of both end portions having such flexures by the backup stages 32 may cause the floating from the backup stages 32 to occur at terminal portions in vicinities of the center. For secure prevention of such floating, supporting the panel substrate 1 only at vicinities of central portions at which the component pressure-bonding positions are located as shown in FIG. 10 makes it possible to fulfill the final pressure-bonding operation more reliably. In addition, in the case where the backup stage 32 is a movable-type one capable of moving up and down, similar effects can be obtained by moving the backup stage 32 in such a direction as to be separate and farther from the panel substrate 1, i.e. to a downward position (move-down position or support-releasing height position) so that the supporting of the terminal portions 2 is done only by the backup stages 32 of the pressure-bonding units 10 that serve for the pressure-bonding operation in the execution of the final pressure-bonding operation.

Second Embodiment

The present invention may be carried out in other various modes without being limited to the above embodiment. For example, a final pressure-bonding device and method according to a second embodiment of the invention will be described below.

Figure 11:
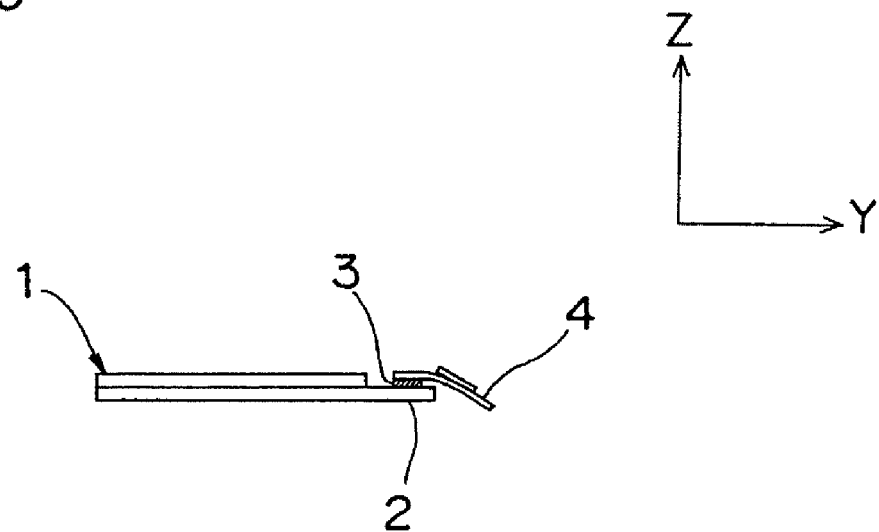
FIG. 11 is a schematic explanatory view for explaining a sagged-down state of a TCP in its horizontal conveyance of the first embodiment.

In the final pressure-bonding device 100 of the above-described first embodiment, the panel substrate 1 is set into a posture along a generally horizontal direction during its conveyance and final pressure-bonding operation. It is noted that such a conveyance method of the panel substrate 1 in the first embodiment herein will be referred to as 'horizontal conveyance.' In the case of this horizontal conveyance, as shown in the schematic view of FIG. 11, the TCP 4 that has been temporarily pressure-bonded to the terminal portion 2 of the panel substrate 1 in the temporary pressure-bonding step has an end portion sagged downward because of its flexibility. In order to prevent such sagging of the TCP 4 and fulfill a reliable final pressure-bonding operation, it is necessary to take measures such as providing an auxiliary support member for supporting an outer end portion of the TCP 4 on the stage 11 or the backup stage 32 or the like. Moreover, while upsizing of panel substrates has become more remarkable in recent years, there is a problem, as it stands, that in the individual devices for performing such an outer lead bonding step, it is difficult to avoid increases in the planar device size for ensuring of the O-rotation area of the panel substrate 1.

Figure 12:
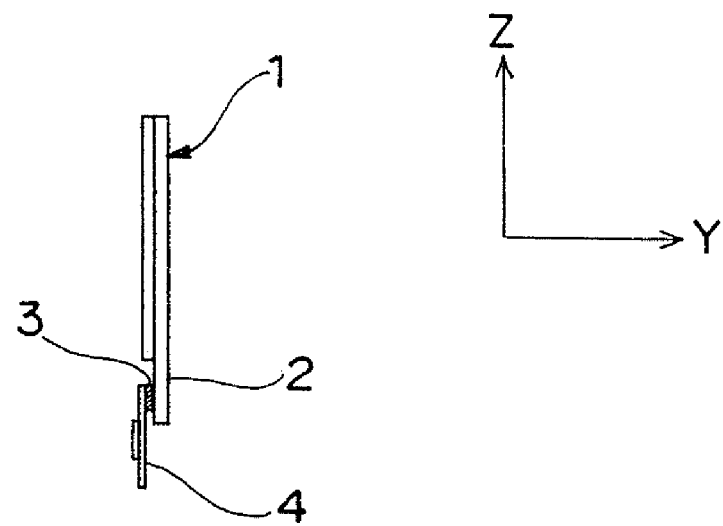
FIG. 12 is a schematic explanatory view showing a state of vertical conveyance according to a second embodiment of the invention.

With a view to solving such problems of horizontal conveyance, the second embodiment adopts a construction in which the panel substrate 1 is set along a vertical direction, i.e. the X-Z plane, and subjected to conveyance and the final pressure-bonding operation and the like in that posture (hereinafter, referred to as 'vertical conveyance'). As shown in FIG. 12, adopting the vertical conveyance makes it possible to prevent occurrence of such phenomena as sagging of the TCPs 4 temporarily pressure-bonded to the panel substrate 1.

FIG. 13 is an explanatory view showing the procedure of the outer lead bonding step, in which the vertical conveyance of the second embodiment shown above is adopted. As shown in FIG. 13, with respect to a panel substrate 1 carried into the device for performing the component mounting process, first at an ACF applying step S500, an ACF sheets 3 as a bonding member is applied to the terminal electrodes 2a of the terminal portions 2, respectively. Thereafter, at a component temporary pressure-bonding step S600, TCPs 4 are temporarily pressure-bonded to each terminal electrode 2a via the ACF sheet 3. Further thereafter, at a final pressure-bonding step S700, the temporarily pressure-bonded TCPs 4 are further pressure-bonded and thereby mounted. It is noted that this final pressure-bonding step S700 is divided, and carried out as such, into a final pressure-bonding step S710 for the longer-side terminal portion of the panel substrate 1 and a final pressure-bonding step S720 for the shorter-side terminal portion of the panel substrate 1. The individual steps are basically similar to those of the outer lead bonding step of horizontal conveyance of the first embodiment, except that the panel substrate 1 is subjected, in its vertical posture, to its conveyance and specified operations.

Next, construction of a final pressure-bonding device 200 for performing the final pressure-bonding step in the outer lead bonding step of vertical conveyance of the second embodiment is explained mainly about a pressure-bonding unit 210 and its associated construction. FIGS. 14A to 14D are schematic views of the pressure-bonding units 210 for explaining the final pressure-bonding operation, where the individual figures are views of states corresponding to those of FIGS. 5A to 5D of the first embodiment. Also, in the following description, constituent members substantially similar in function and construction to those of the pressure-bonding units 10 of the first embodiment are designated by like reference signs and their description is omitted.

Figure 14A:
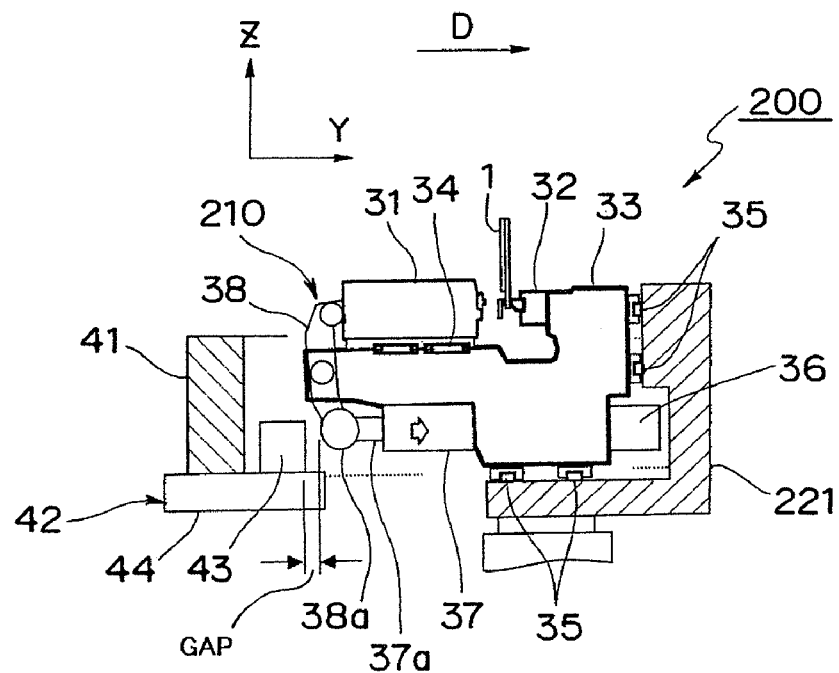
FIG. 14A is a schematic side view (corresponding to time T1-T2 in FIG. 6) of the final pressure-bonding device in the second embodiment as viewed in the X-axis direction.

The final pressure-bonding device 200 includes, as a plurality of pressure-bonding units 210, e.g., four pressure-bonding units 210 arrayed in line in the X-axis direction. As shown in FIG. 14A, the pressure-bonding unit 210 is substantially similar in construction to the pressure-bonding unit 10 of the first embodiment except that the pressure-bonding unit 210 is placed substantially on a horizontal plane with a 90-degree turn in a direction perpendicular to the conveyance direction of the panel substrate 1 as compared with the first embodiment so that a pressing direction D of the pressure-bonding unit 210 becomes along the Y-axis direction.

More specifically, as shown in FIG. 14A, each of the pressure-bonding units 210 includes a pressure-bonding head 31 and a backup stage 32, where the backup stage 32 is fixed on an upper-portion side face of a unit frame 33, which is a cylindrical member having a generally L-shaped cross section and formed from a rigid body, while the pressure-bonding head 31 is fitted on the upper face of the unit frame 33 so that the pressure-bonding head 31 can guide moving operation of the backup stage 32 via an LM guide 34 set along the Y-axis direction. On the base frame 13 of the final pressure-bonding device 200 is fixed a support frame 221 having a generally L-shaped cross section. The LM guides 35 provided two in number on each of the inner upper face and side face of the support frame 221 are placed so as to extend along the X-axis direction, the unit frames 33 of the four pressure-bonding units 210 are supported by the base frame 13 so as to be movable back and forth in the X-axis direction via the individual LM guides 35. Also, as shown in FIG. 14A, a unit-moving motor 36 for driving the back-and-forth movement of the pressure-bonding unit 210 along the X-axis direction is provided in a right-side lower portion of each of the pressure-bonding units 210. That is, the four pressure-bonding units 210, each having the pressure-bonding head 31 and the backup stage 32 independently, can be moved back and forth independently of one another while being guided along the four LM guides 35 in the X-axis direction by driving of the provided independently unit-moving motors 36.

Also, as shown in FIG. 14A, each pressure-bonding head 31 includes a pressurizing unit 37 for imparting, to the pressure-bonding head 31, a force for back-and-forth movement, i.e. horizontal movement operation, of the pressure-bonding head 31 along the pressing direction D that is a direction (Y-axis direction) perpendicular to the nearly vertically positioned panel substrate 1 and for imparting a force for final pressure-bonding to the pressure-bonding head 31 set into contact with the TCPs 4. In FIG. 14A, the pressure-bonding head 31 is placed on the upper side of the unit frame 33 as in the figure, while the pressurizing unit 37 is placed on the lower side of the unit frame 33 as in the figure.

In each of the pressure-bonding units 210, as shown in FIG. 14A, a link mechanism is adopted as a means for mechanically transferring, to the pressure-bonding head 31, a force generated by the pressurizing unit 37. As in the first embodiment, the link mechanism is so made up that a lever 38 rotatably supported at its generally near center by a left end portion of the unit frame 33 is rotatably connected, at an upper end as in the figure, to a left-side end portion of the pressure-bonding head 31, and rotatably connected, at a lower end as in the figure, to an end portion of a rod 37a coupled to a piston inside the pressurizing unit 37. It is noted that the lever 38 is placed generally along the Z-axis direction and enabled to rotate at its support position or connecting position within the Y-Z plane.

Also as shown in FIG. 14A, on the support frame 221, an arch-type frame 41 formed by a rigid member and having a generally arch-like shape is fixed along the X-Y plane, and four pressure-bonding units 210 are arrayed inside the arch-type frame 41. Further, on this arch-type frame 41 are provided a restricting member 43 which is placed so as to extend in the X-axis direction inside the arch-type frame 41 and which is contactable with the figure-left-side end portion of the end portion 38a of the lever 38 for the four pressure-bonding units 210, and a restricting-member up/down device for moving the restricting member 43 in the Y-axis direction.

Figure 14B:
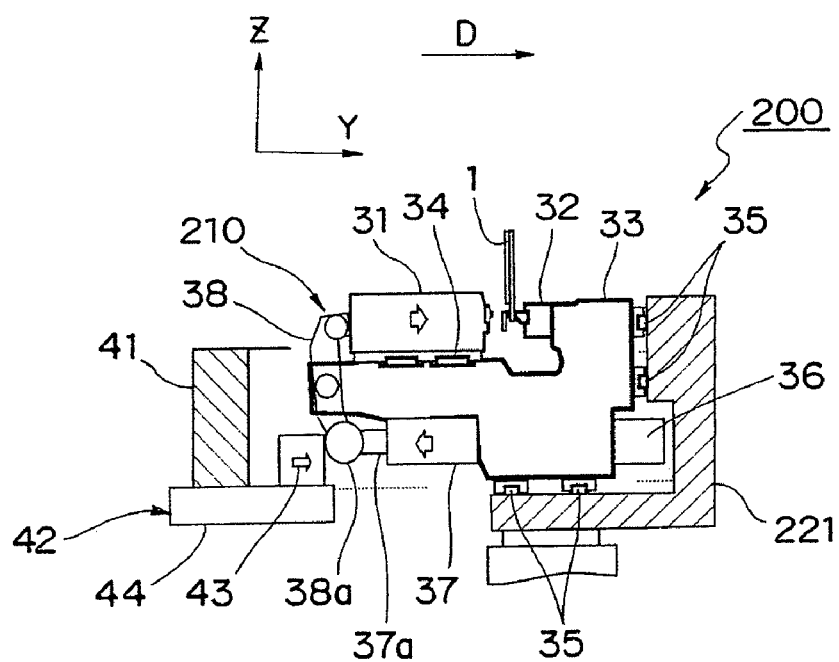
FIG. 14B is a schematic side view (corresponding to time T2 in FIG. 6) of the final pressure-bonding device in the second embodiment as viewed in the X-axis direction.
Figure 14C:
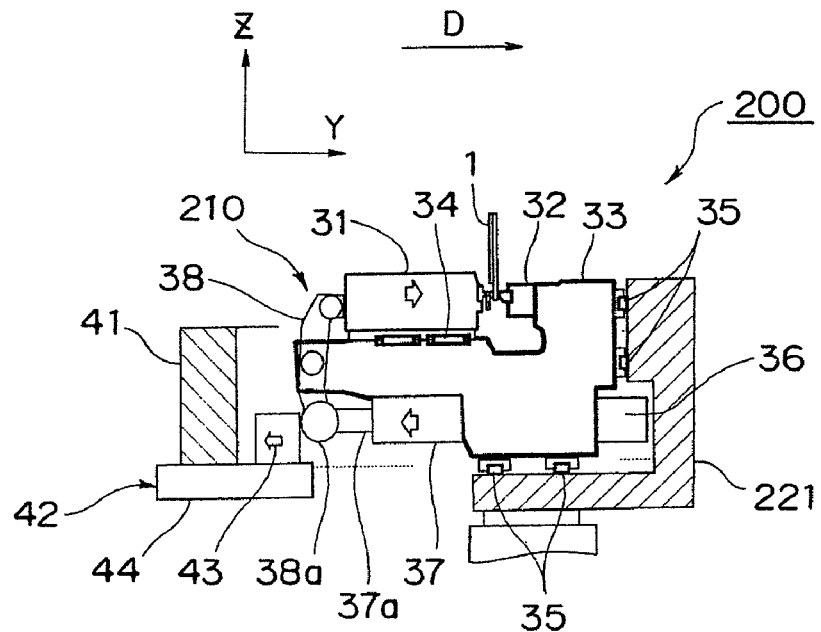
FIG. 14C is a schematic side view (corresponding to time T3 in FIG. 6) of the final pressure-bonding device in the second embodiment as viewed in the X-axis direction.
Figure 14D:
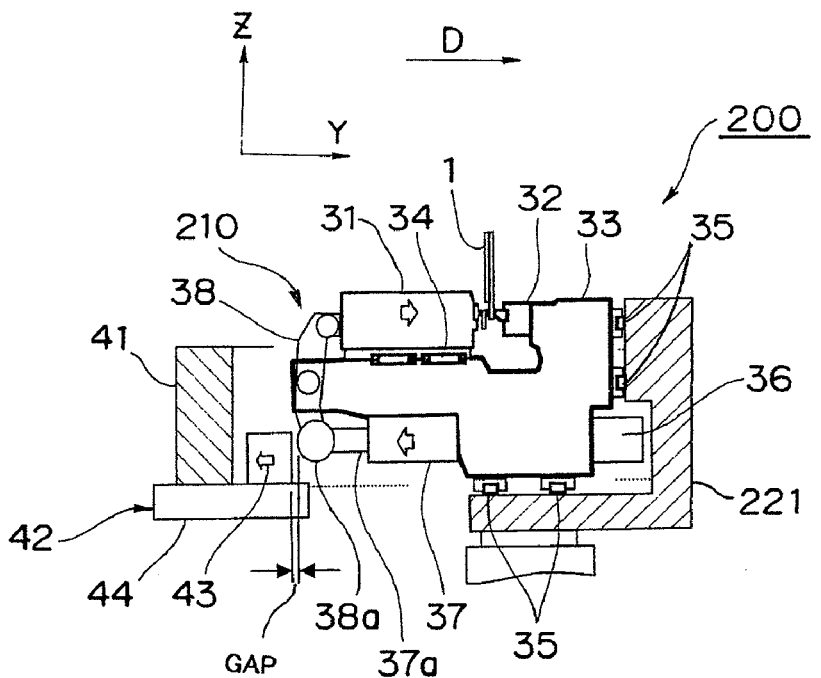
FIG. 14D is a schematic side view (corresponding to time T3-T4 in FIG. 6) of the final pressure-bonding device in the second embodiment as viewed in the X-axis direction.

In the final pressure-bonding device 200 of the second embodiment constructed as described above, as shown in FIG. 14A, a panel substrate is set so as to be in contact with the backup stages 32. Thereafter, as shown in FIG. 14B, while rotation of the lever 38 is restricted by the restricting member 43, a pressurizing force is generated by the pressurizing unit 37, so that the pressure-bonding head 31 is operated via the lever 38 so as to move toward the backup stages 32 along the pressing direction D, i.e. the Y-axis direction that is a direction in which the TCPs 4 constituting the components are pressure-bonded to the panel substrate 1. Then, as shown in FIG. 14C, the pressure-bonding head 31 is brought into contact with the TCPs 4 temporarily pressure-bonded to the panel substrate 1, where the pressure-bonding head 31 presses the TCPs 4 to fulfill their final pressure-bonding operation to the panel substrate 1. Along with this, as shown in FIG. 14D, the restricting member 43 is separated from the lever 38, causing the restriction of the operation speed to be released, so that the pressurizing force of the pressurizing unit 37 presses the pressure-bonding head 31 with a specified pressing force via the lever 38 to press the TCPs 4 to the panel substrate 1. Thereafter, upon completion of the final pressure-bonding operation, the pressure-bonding head 31 is operated by the pressurizing unit 37 so as to be separated from the TCPs 4. Also, changes in movement, i.e. changes in placement pitch, of the individual pressure-bonding units 210 along the X-axis direction are effectuated in the state in which the restricting member 43 is separate from the lever 38 as shown in FIG. 14A.

Even with adoption of a constitution that the vertical conveyance of the panel substrate 1 is performed as in the above-described second embodiment, the individual pressure-bonding units 210 are so placed as to be laid in the Y-axis direction, i.e., the pressing direction D of each pressure-bonding head 31 is set along the Y-axis direction, thus making it possible to realize a final pressure-bonding device 200 by which the same effects as in the first embodiment can be obtained while advantages of the vertical conveyance are gained. In particular, with such vertical conveyance adopted, as the device width in the Y-axis direction is determined by sizes (widths) of the device constituting members, the vertical conveyance of the panel substrate 1 leads to reduction of the device width particularly in the horizontal direction perpendicular to the conveyance direction of large-scale panel substrates, and moreover with downsizing and structural simplification of the individual pressure-bonding units 210, reduction in the device width in the horizontal direction perpendicular to the conveyance direction of the panel substrate can be realized.

Modifications

Next, various modifications of the final pressure-bonding devices of the first and second embodiments will be described with reference to the accompanying drawings. Also, in the following description, constituent members substantially similar to those of the embodiments are designated by like reference signs and their description is omitted.

Figure 15:
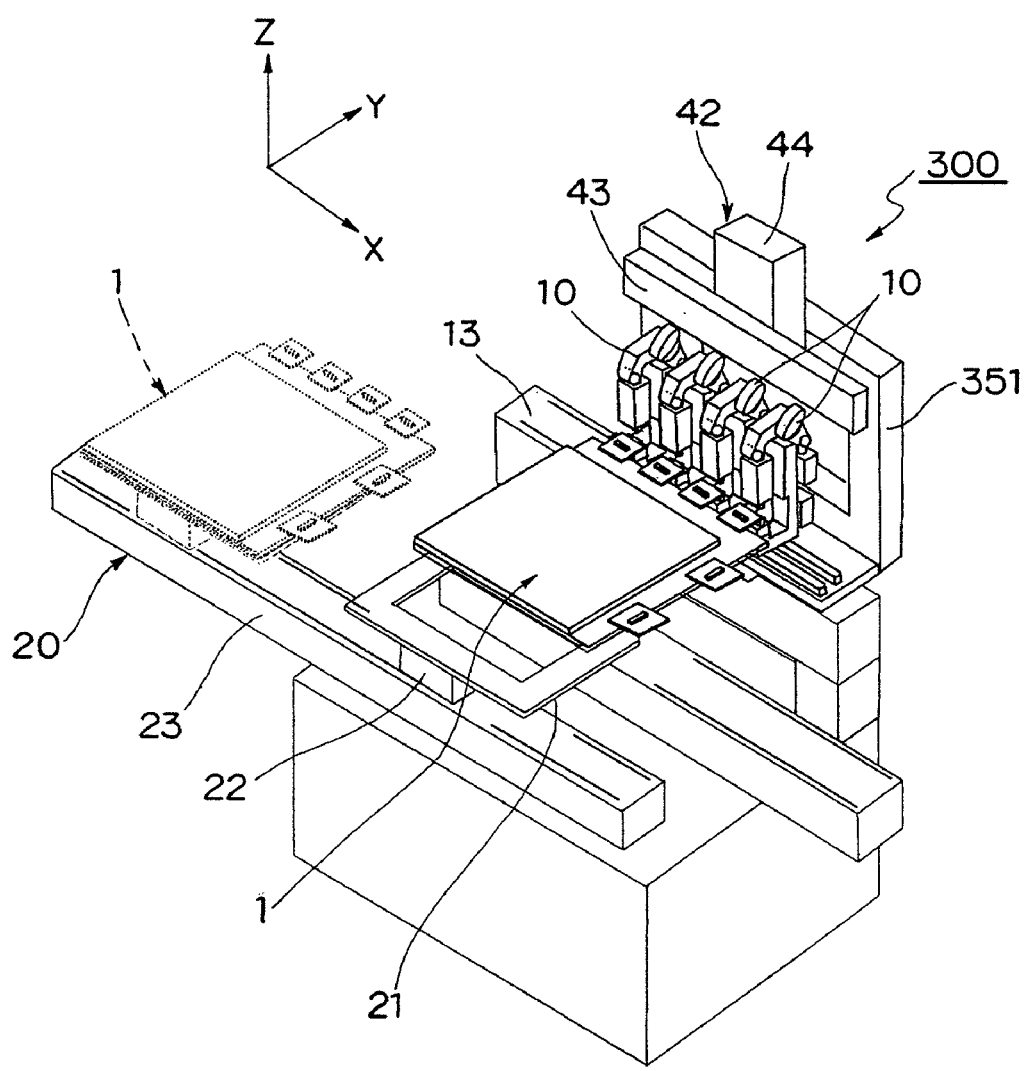
FIG. 15 is an appearance view (horizontal conveyance) of the final pressure-bonding device according to a modification of the first and second embodiments.
Figure 16:
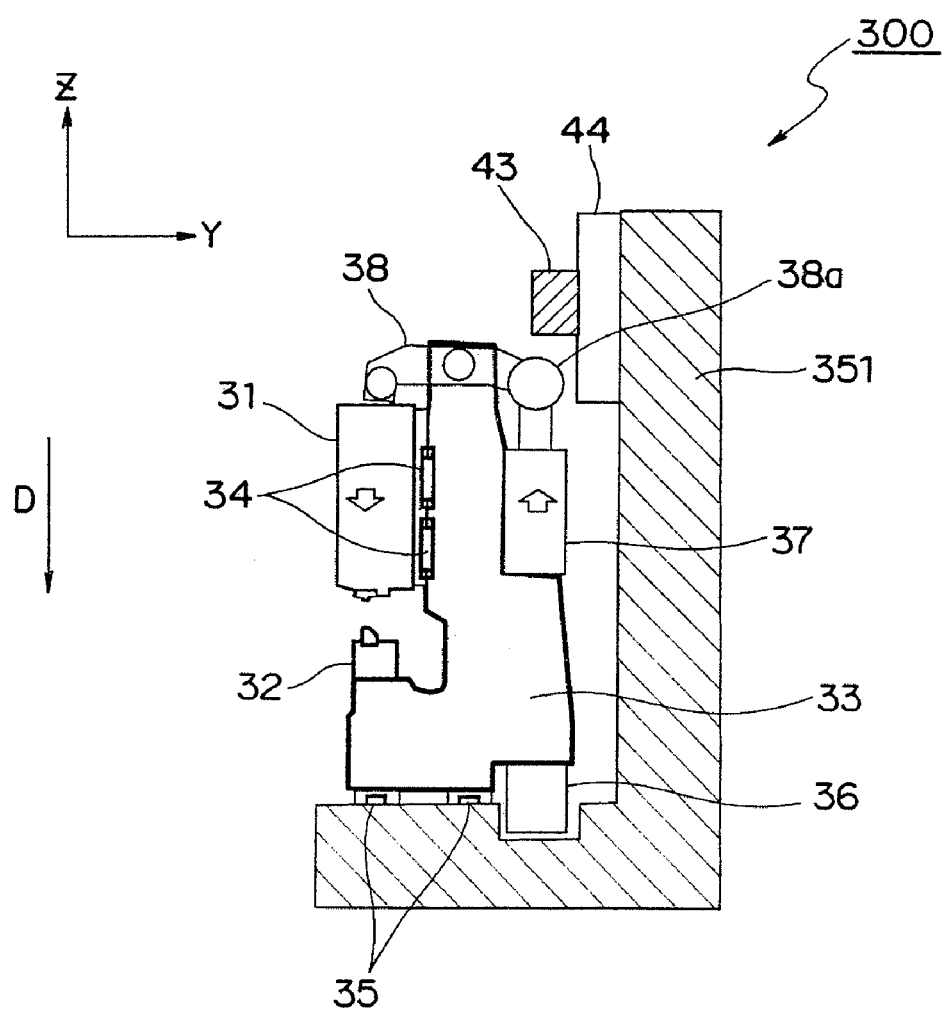
FIG. 16 is a schematic side view (horizontal conveyance) of the final pressure-bonding device in the modification of FIG. 15 as viewed in the X-axis direction.

The arch-type frame 41 is adopted as a structure for supporting the head operation restricting device 42 in the first embodiment, and yet a support frame 351 placed in Y-axis-direction rearward of each pressure-bonding unit 10 as shown in the schematic views of a final pressure-bonding device 300 in FIGS. 15 and 16 may also be used instead of such an arch-type frame 41.

With adoption of a constitution using such a support frame 351, there can be provided a constitution in which the support frame 351 is not placed along the array direction of the pressure-bonding units 10. Accordingly, the pressure-bonding units 10 can be made free from restraints on their moving range, so that the degree of freedom in the movement for placement pitch changes can be enhanced. Also, when the base frame 13 for supporting the support frame 351 is used as a moving axis (i.e., moving device) for moving the support frame 351 back and forth in the X-axis direction (although not shown), moving the pressure-bonding units 10 along with the support frame 351 integrally in the X-axis direction makes it possible to enlarge the substantial moving range of each pressure-bonding unit 10 in the X-axis direction enough to carry out component pressure-bonding work particularly for panel substrates 1 increased in size in the X-axis direction, which is the conveyance direction of the panel substrate 1, beyond the X-axis direction width of the support frame 351 without taking any size-increasing measures for the support frame 351. Also, such a constitution of back-and-forth relative movement between the support frame and the base frame may be applied to final pressure-bonding devices of vertical conveyance without being limited to final pressure-bonding devices of horizontal conveyance.

In contrast to this, with the constitution using the arch-type frame 41, even if an external force (a force generated by operation speed restriction of the lever 38) is applied to the arch-type frame 41 through the restricting member 43, warps or the like is less likely to occur to the frame, so that the operation speed of the lever 38 can be restricted more accurately.

Further, such a constitution that the head operation restricting device is fixed not to the arch-type frame but to the support frame as shown above may also be applied to final pressure-bonding devices that adopt the vertical conveyance as in the second embodiment.

Figure 17:
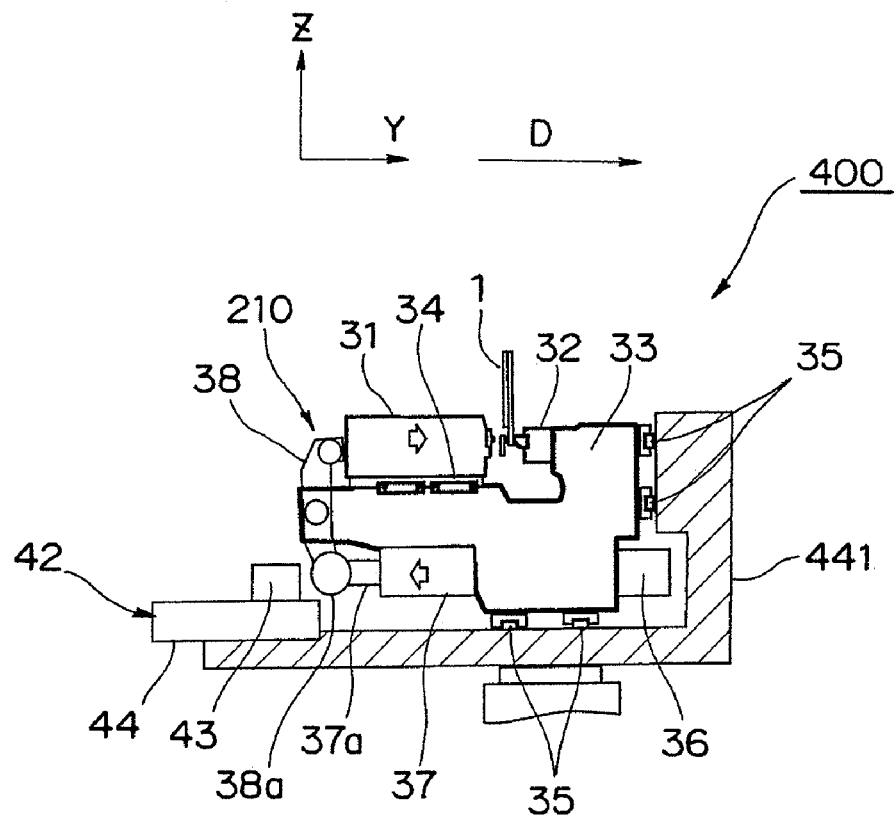
FIG. 17 is a schematic side view (vertical conveyance) of the final pressure-bonding device according to a modification as viewed in the X-axis direction.

More specifically, it is allowable to adopt a constitution that, as shown in the schematic view of a final pressure-bonding device 400 of FIG. 17, a support frame 441 extends along the Y-axis direction to support the head operation restricting device 42.

Figure 18:
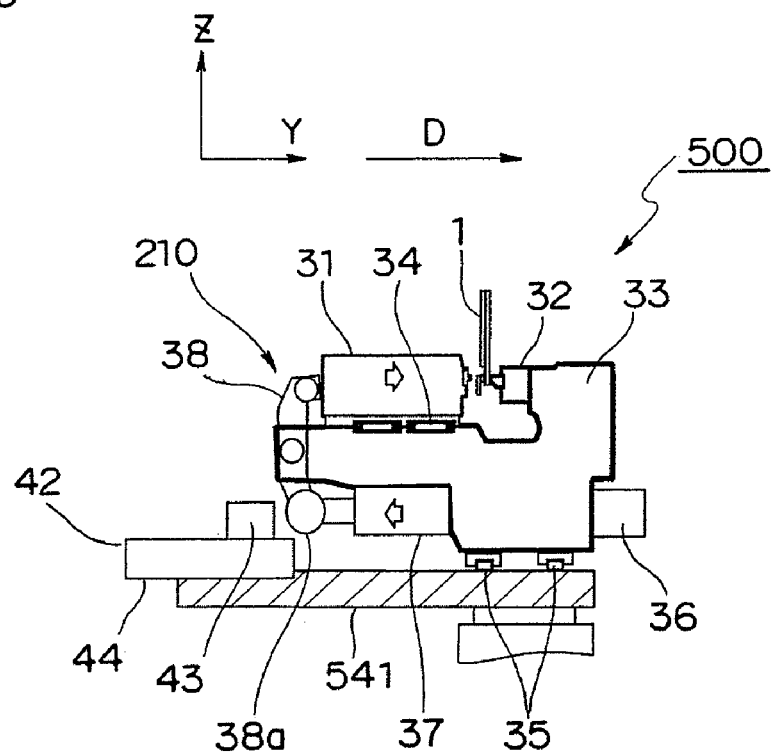
FIG. 18 is a schematic side view (vertical conveyance) of the final pressure-bonding device according to another modification as viewed in the X-axis direction.

It is also allowable to adopt a constitution that, as shown in the schematic view of a final pressure-bonding device 500 of FIG. 18, movement of each pressure-bonding unit 210 in the X-axis direction is guided only by two LM guides 35 placed on a support frame 541. Such constitution is practicable particularly when the pressure-bonding units 210 are designed to be smaller and lighter.

Also, the final pressure-bonding devices of the first and second embodiments have been described on a case in which a pressurizing force generated by the pressurizing unit is transmitted to the pressure-bonding head placed on an opposite side with the unit frame interposed therebetween by using a link mechanism using the lever 38. However, the present invention is not limited to such a constitution only. Instead of such a constitution, for example, a constitution as shown in the schematic view of a final pressure-bonding device 600 of FIG. 19 may be adopted.

Figure 19:
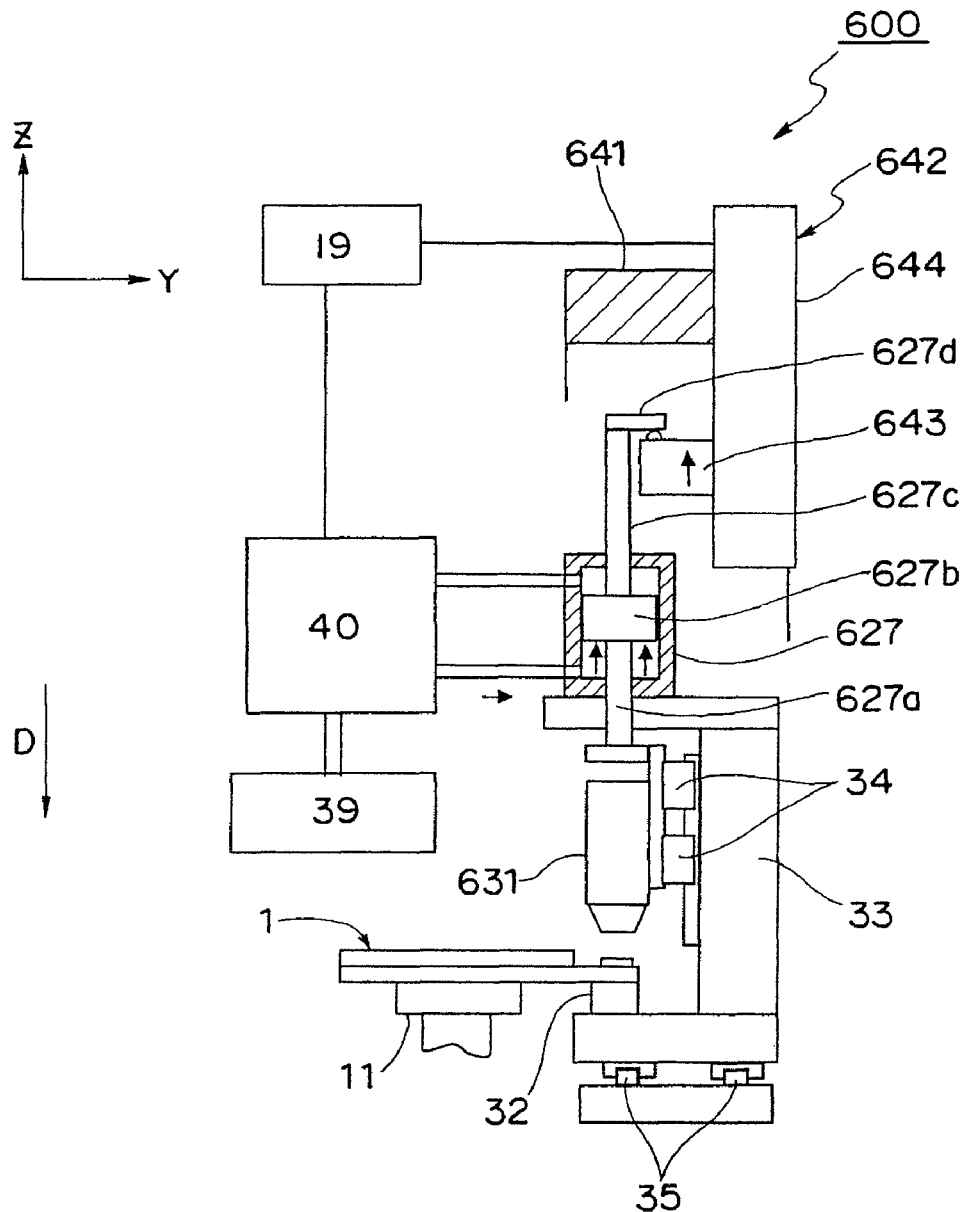
FIG. 19 is a schematic side view of a final pressure-bonding device according to a modification (a modification of the restricting structure) as viewed in the X-axis direction.

More specifically, as shown in FIG. 19, in the final pressure-bonding device 600, a pressurizing unit 627 is placed coaxial with an operating axis (up/down axis) extending along the pressing direction D of a pressure-bonding head 631, and a lower-side rod 627a coupled to a piston 627b of the pressurizing unit 627 is connected directly to the pressure-bonding head 631. Further, a lower portion of an engagement portion 627d formed at an upper end portion of an upper-side rod 627c coupled to the piston 627b is made engageable with an upper portion of a restricting member 643, thus making it possible to restrict the operation speed of the pressure-bonding head 631 by a restricting member up/down device 644 of a head operation restricting device 642.

Figure 20:
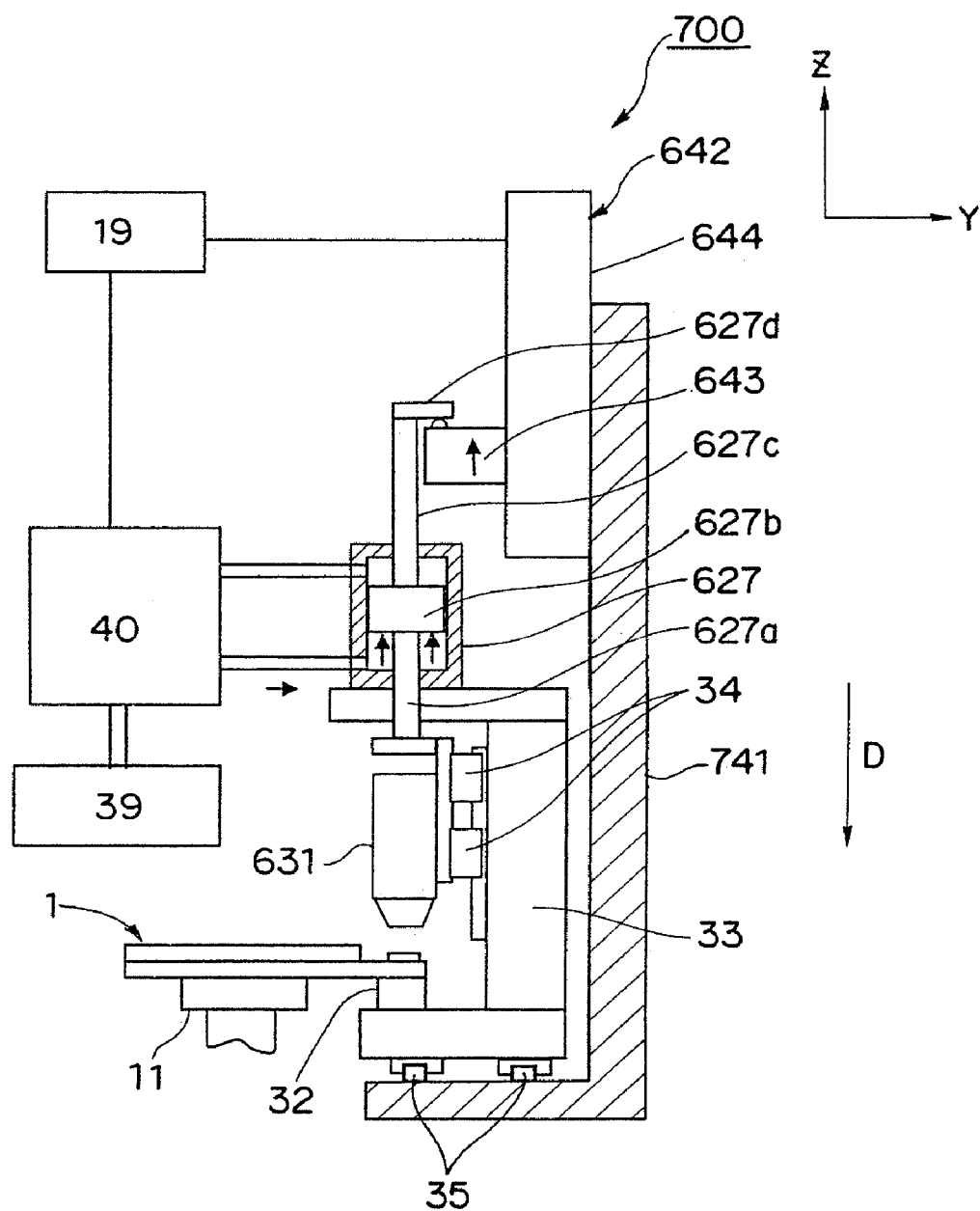
FIG. 20 is a schematic side view of a final pressure-bonding device according to another modification (a modification of the restricting structure) as viewed in the X-axis direction.

With such a constitution including the coaxial restriction of the operation speed of the pressure-bonding head 631, action of a force for the coaxial restriction is involved, which allows a successful dynamic balance to be obtained. Meanwhile, with adoption of such a constitution as in the first embodiment including the use of the lever 38, the height of the pressure-bonding units can be kept lower, so that the apparatus can be made smaller in scale and lower in the center of gravity, making it practicable to achieve prompter and easier movement of each pressure-bonding unit as advantageous. It is noted that an arch-type frame 641 is adopted in the final pressure-bonding device 600 of FIG. 19, and a support frame 741 is adopted in a final pressure-bonding device 700 shown in FIG. 20.

Figure 21:
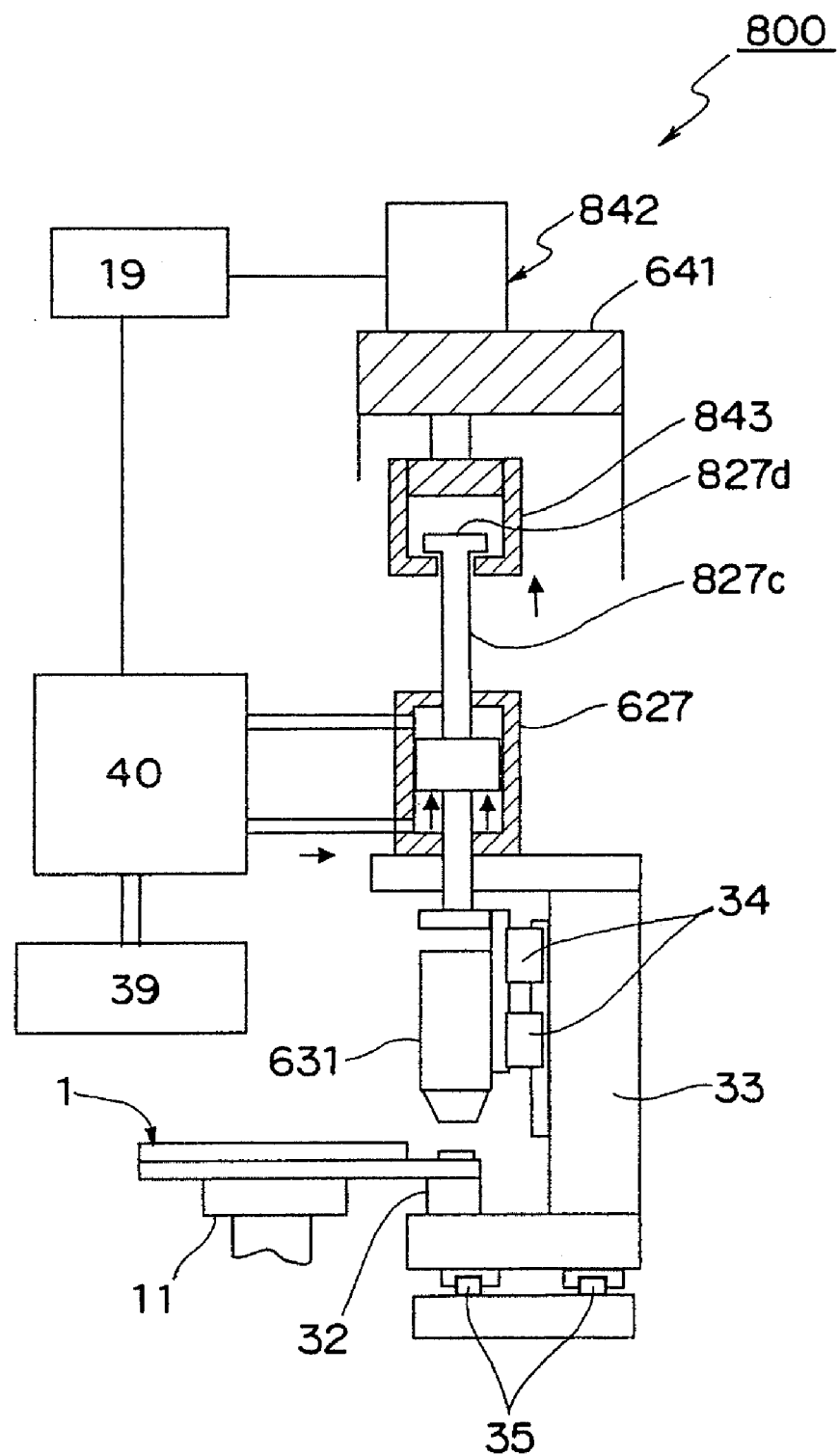
FIG. 21 is a schematic side view of a final pressure-bonding device according to still another modification (a modification of the restricting structure) as viewed in the X-axis direction.

As to an engagement relation between the restricting member 643 and the engagement portion 627d of the upper-side rod 627c shown in FIG. 19, other various arrangements are also applicable, where an example is, as shown in the schematic view of a final pressure-bonding device 800 of FIG. 21, a head operation restricting device 842 having a restricting member 843 which is so formed that an end portion of an upper-side rod 827c extends through and which is to be coaxially engaged with an engagement portion 827d. With such a constitution, a reaction force that depends on the operation speed and position of the pressure-bonding head 631 can be received within a plane of an upper beam of the arch-type frame 641 including the restrictive position of the restricting member 843, so that action of force can be exerted nearly completely only on the coaxial base, allowing a better dynamic balance to be obtained.

Third Embodiment

Next, a component mounting apparatus and a component mounting method according to a third embodiment of the invention are described. First, in conjunction with an outer lead bonding step in which such a component mounting apparatus and component mounting method of the third embodiment are used, FIG. 23 is a schematic plan view showing a construction of a component mounting line 100 which is an example of the component mounting system for performing the outer lead bonding step.

As shown in FIG. 23, a component mounting line 300 includes: an ACF applying device 320 for performing an ACF applying step for a panel substrate 1; a component temporary pressure-bonding device 330 for performing a component temporary pressure-bonding step of TCPs 4 or other components to the panel substrate 1 having an ACF sheet 3 applied thereto; a final pressure-bonding device (which is an example of the component mounting apparatus of this third embodiment) 340 for performing a final pressure-bonding step (which is an example of the component pressure-bonding step of this third embodiment) of pressure-bonding and thereby mounting the TCPs 4, which have been temporarily pressure-bonded to longer-side and shorter-side terminal portions 2 of the panel substrate 1; and a substrate conveyor device 350 for conveying the panel substrate 1 between the individual devices. It is noted that each of the devices, which is equipped with a panel substrate holding device having two stages for holding the panel substrate 1, is enabled to perform the individual steps while simultaneously holding two panel substrates 1 having a size smaller than a preset size. Further, for panel substrates 1 over the preset size, it is also possible that the inverted steps are carried out in a state which, for example, one panel substrate 1 is held by one of the two stages.

The ACF applying device 320 includes: two pressure-bonding units 323 for cutting the taped ACF sheet 3, which is fed from a tape feeding section 321 to a tape collecting section 322, into a specified length and then applying the cut ACF sheet 3 to a terminal portion 2 of the panel substrate 1; and a panel substrate holding device 324 which is an example of a substrate holding device to which a panel substrate 1 conveyed by the substrate conveyor device 350 is transferred and which holds the transferred panel substrate 1 and moreover performs positional alignment between the terminal portion 2 of the held panel substrate 1 and the pressure-bonding unit 323. The panel substrate holding device 324, which includes two stages 324a and 324b for holding the panel substrates 1, respectively, has a function (X-Y movement function) of moving the panel substrates 1 held by the stages 324a and 324b, respectively, in the X-axis direction or the Y-axis direction as in the figure, a function (θ-rotation function) of rotating the panel substrate 1 within a plane (horizontal plane) containing the X-axis direction and the Y-axis direction, and a function (up/down function) of moving up and down the panel substrate 1 in the Z-axis direction. By these functions, the longer-side and shorter-side terminal portions 2 of the panel substrate 1 can be aligned with their respective pressure-bonding units 323. Also, the ACF applying device 320 is equipped with two recognition cameras 326 for recognizing the position of each terminal portion 2 of the panel substrate 1 in order to achieve such positional alignment. Also, the ACF applying operation by each pressure-bonding unit 323 is carried out while the terminal portion 2 of the panel substrate 1 is supported from its lower side by a backup tool 325. In addition, in FIG. 23, the X-axis direction and the Y-axis direction are directions extending generally along the surface of the panel substrate 1, where a direction of conveyance of the panel substrate 1 is the X-axis direction, a direction orthogonal to the X-axis direction is the Y-axis direction, and a vertical direction in the figure is the Z-axis direction.

The component temporary pressure-bonding device 330 includes: a TCP feed cassette section (not shown) for feeding a plurality of TCPs 4 housed in a cassette; a plurality of temporary pressure-bonding heads (an example of mounting heads or pressing members) for temporarily pressure-bonding the TCPs 4 fed from the TCP feed cassette section to their respective terminal portions 2a via the ACF sheet 3; two stages 333a and 333b to which the panel substrates 1 are transferred and which hold the panel substrates 1; and a panel substrate holding device 333 for performing positional alignment of the terminal portions 2 of the panel substrate 1 held by the stages 333a and 333b, respectively, and the temporary pressure-bonding heads 332. The component temporary pressure-bonding device 330 includes four temporary pressure-bonding heads 332, where the individual temporary pressure-bonding heads 332 are rotatably placed concentrically equidistantly, the temporary pressure-bonding heads 332 being placed successively at a TCP feed position that is an upper position on the circumference in FIG. 23 and a temporary pressure-bonding position that is a lower position on the circumference, hence a so-called rotary method. Also, the component temporary pressure-bonding device 330 further includes two recognition cameras 334 for recognizing positions of the TCPs 4 sucked and held by the terminal portions 2 of the panel substrate 1 and the temporary pressure-bonding heads 332, and a pre-center camera 336 for recognizing a holding posture of a TCP 4 sucked and held by the temporary pressure-bonding head 332 in the TCP feed position. In addition, the panel substrate holding device 333 has the X-Y movement function, the θ-rotation function, and the up/down function. Also, the component temporary pressure-bonding operation by the individual temporary pressure-bonding heads 332 is carried out while the terminal portion 2 of the panel substrate 1 is supported from its lower side by a backup tool 335.

The final pressure-bonding device 340 includes: a plurality of pressure-bonding units 341 for simultaneously pressing and heating the TCPs 4 temporarily pressure-bonded to the longer-side and shorter-side terminal portions 2 of the panel substrate 1 via the ACF sheet 3 so that the TCPs 4 are temporarily pressure-bonded, i.e. thermo-compression bonded (mounted), to their respective terminal electrodes 2a; two stages 343a and 343b for holding transferred panel substrates 1, respectively; and a panel substrate holding device 343 for performing positional alignment of the TCPs 4 temporarily pressure-bonded to the terminal portions 2 of the panel substrate 1 held by the stages 343a and 343b, respectively, with their corresponding pressure-bonding units 341, respectively. In addition, the panel substrate holding device 343 has the X-Y movement function, the θ-rotation function, and the up/down function. Also provided for performing such positional alignment are two recognition cameras 344 for recognizing positions of the two panel substrate 1, respectively. It is noted that detailed construction of the final pressure-bonding device 340 including the pressure-bonding unit 341 will be described later.

The substrate conveyor device 350 includes: a panel holding part 351 for releasably sucking and holding a lower face of the panel substrate 1 by a vacuum suction means (not shown); an up/down section (not shown) for moving up and down the panel holding part 351; and a moving device 353 for moving the panel holding part 351 and the up/down part along the X-axis direction as in the figure to convey the panel substrate 1 between the individual devices. In the substrate conveyor device 350, the panel holding parts 351 are placed independently between the individual steps, i.e. between their respective devices, so that the conveyance of the panel substrate 1 for its delivery between the devices can be fulfilled independently of one another. In addition, the third embodiment is described in a case where the panel holding parts 351 fulfill the holding of the panel substrate 1 by vacuum suction means as an example, and yet instead of such a case, the panel substrate 1 may also be held by a panel holding part having a mechanical chuck means.

The component mounting line 300 is equipped with a control device 319 for performing operation control integrally over the individual devices 320, 330, 340 and 350 in association with one another. While individual operation control over the individual devices is performed by this control device 319, conveyance control for the panel substrates 1 is performed one by one from upstream-side to downstream-side devices, so that component mounting operation for a plurality of panel substrates 1 is carried out. In addition, an integrated control method may be adopted as the control method by the control device 319, or the control method may also be another which is provided individually in each of the devices, where conveyance control signals on the panel substrates 1 are delivered among the devices.

Next, the component mounting operation in the component mounting line 300 having such constitution as shown above is described. In addition, individual operations described below are performed under control by the control device 319.

First, panel substrates 1 are carried into the component mounting line 300 shown in FIG. 23. The carried-in panel substrates 1 are held by the panel holding part 351 of the substrate conveyor device 350, and conveyed in that holding state in the X-axis direction of the figure by the moving device 353 so as to be placed on the panel substrate holding device 324 of the ACF applying device 320. When the lower face of the panel substrate 1 placed in the panel substrate holding device 324 is sucked and held, the sucking and holding by the panel holding part 351 of the substrate conveyor device 350 is released.

Next, X-Y movement of the panel substrate 1 held by the panel substrate holding device 324 is carried out, followed by positional alignment of the longer-side terminal portions 2 and the pressure-bonding units 323. Thereafter, the ACF sheet 3 is applied to the longer-side terminal portion 2 by the pressure-bonding unit 323 (ACF applying step). In this positioned state, the longer-side terminal portion 2 is supported directly from its lower face side by the backup tool 325, so that a reliable applying operation of the ACF sheet 3 can be achieved. Thereafter, θ-rotation of the individual stages 324a and 324b is performed by the panel substrate holding device 324, followed by positional alignment of the shorter-side terminal portions 2 and the pressure-bonding units 323, where the ACF sheet 3 is applied to the shorter-side terminal portions 2 by the pressure-bonding units 323. Upon completion of the ACF applying step, the panel holding part 351 of the substrate conveyor device 350 sucks and holds the lower face of the panel substrate 1 while the sucking and holding by the panel substrate holding device 324 is released, and the panel substrate 1 is delivered to the substrate conveyor device 350. After that, the panel substrate 1 with the ACF sheet 3 applied thereto is conveyed by the substrate conveyor device 350 to the component temporary pressure-bonding device 330.

In the component temporary pressure-bonding device 330, the panel substrates 1 conveyed by the substrate conveyor device 350 are placed on and delivered to the stages 333a, 333b of the panel substrate holding device 333, respectively. Meanwhile, the TCPs 4 are fed to the temporary pressure-bonding heads 332 positioned in the TCP feed positions, so that the TCPs 4 are sucked and held by the temporary pressure-bonding heads 332. Thereafter, rotational movement of the temporary pressure-bonding heads 332 is performed, so that the temporary pressure-bonding heads 332 sucking and holding the TCPs 4 are positioned to temporary pressure-bonding positions. Along with this, various types of movement of the panel substrates 1 by the panel substrate holding device 333 are performed, by which positional alignment between one terminal electrode 2a of the longer-side terminal portion 2 and the temporary pressure-bonding head 332 is achieved. After that, the temporary pressure-bonding heads 332 are moved down, by which the TCPs 4 are temporarily pressure-bonded to the terminal electrodes 2a via the ACF sheet 3. Similar operation is repeated successively, by which the TCPs 4 are temporarily pressure-bonded to their respective terminal electrodes 2a (component temporary pressure-bonding step). Upon completion of the temporary pressure-bonding of the TCPs 4 to the longer-side terminal portion 2, θ-rotation of the panel substrates 1 is performed by the panel substrate holding device 333, followed by positional alignment of the shorter-side terminal portion 2 and the temporary pressure-bonding head 332, where the TCPs 4 are temporarily pressure-bonded to their respective terminal electrodes 2a of the shorter-side terminal portion 2. Upon completion of the temporary pressure-bonding step, the panel holding part 351 of the substrate conveyor device 350 sucks and holds the lower face of the panel substrate 1 while the suction and holding by the panel substrate holding device 333 is released, and then the panel substrate 1 is delivered to the substrate conveyor device 350. After that, the panel substrates 1 with the TCPs 4 temporarily pressure-bonded thereto are conveyed to the final pressure-bonding device 340 by the substrate conveyor device 350.

In the final pressure-bonding device 340, the panel substrates 1 conveyed by the substrate conveyor device 350 are placed on and delivered to their respective stages 343a, 343b of the panel substrate holding device 343. Thereafter, positional alignment of the longer-side terminal portions 2 of the panel substrates 1 and their respective pressure-bonding units 341 is performed by the panel substrate holding device 343. After this, the individual temporarily-bonded TCPs 4 are heated while being pressed to their respective terminal electrodes 2a via the ACF sheet 3 by the individual pressure-bonding units 341, such that the TCPs 4 are mounted by thermo-compression bonding (final pressure-bonding step). In addition, the pressing of the individual TCPs 4 by the pressure-bonding units 341 is effected via protective tape (not shown) with a view to preventing deposition of contaminations or the like on pressing surfaces of the pressure-bonding units 341. Also, the ACF sheet 3 is thermally set by heat applied from the pressure-bonding units 341 to the ACF sheet 3. Upon completion of the final pressure-bonding step, the panel holding part 351 of the substrate conveyor device 350 sucks and holds the lower face of the panel substrate 1 while the sucking and holding by the panel substrate holding device 343 is released, and the panel substrate 1 is delivered to the substrate conveyor device 350. After that, the panel substrate 1 with the TCPs 4 mounted thereon is conveyed by the substrate conveyor device 350 so as to be carried out from the component mounting line 300. In the component mounting line 300, a plurality of panel substrates 1 are conveyed successively by the substrate conveyor device 350 so as to be subjected to specified steps in the individual devices, by which the outer lead bonding step is carried out. In addition, a case in which TCPs 4, which are components, are mounted on edge portions of the panel substrate 1 has been shown as an example, and yet the present invention is not limited to such cases only. For example, IC chips or other components may be mounted on COF (Chip On Film) boards. In this case, the COF board is not limited to such a case in which component mounting areas are placed in mutually neighboring two side edge portions in a rectangular shape as in the panel substrate 1, and a plurality of component mounting areas in various positional relations may be placed.

Next, in the component mounting line 300, construction of the final pressure-bonding device 340 for performing the final pressure-bonding step, which is an example of the component mounting step, is described in more detail. In conjunction with this description, FIG. 24 is a schematic front view of the final pressure-bonding device 340 as viewed in the Y-axis direction, and FIG. 25A is a schematic side view thereof as viewed in the X-axis direction.

Figure 24:
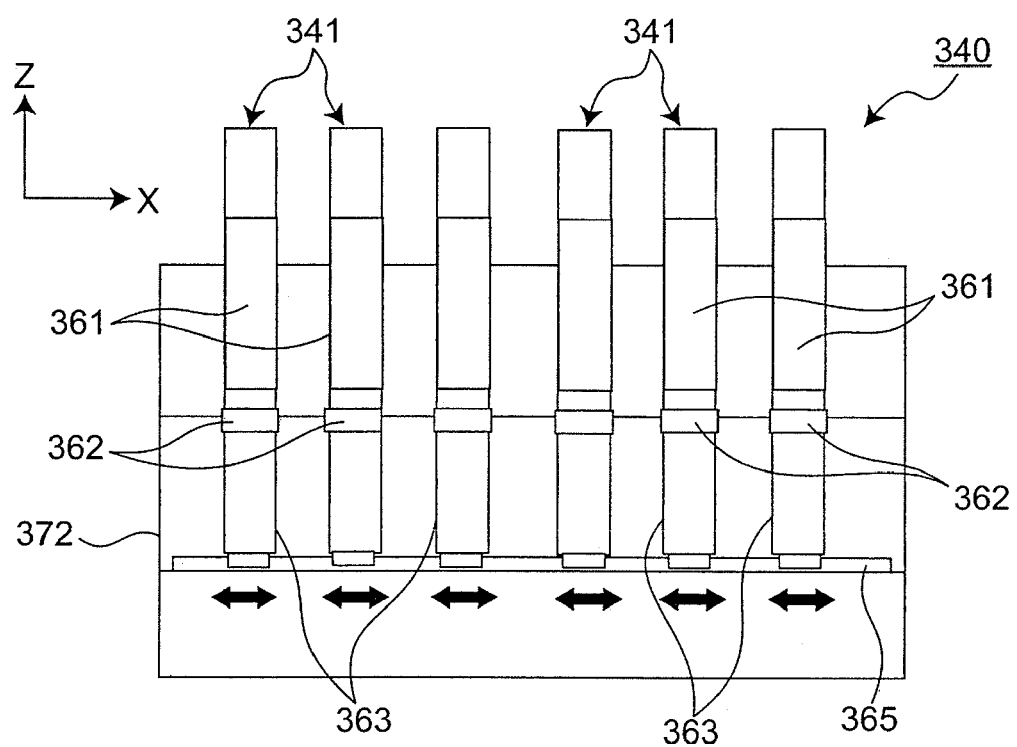
FIG. 24 is a schematic front view of the final pressure-bonding device of the third embodiment as viewed in a Y-axis direction.
Figure 25A:
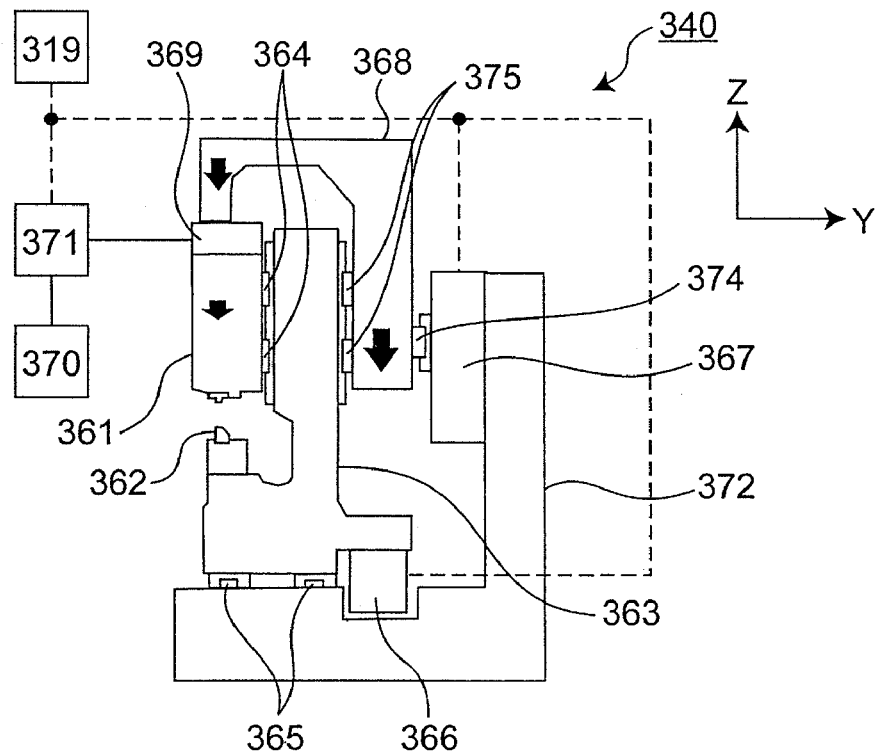
FIG. 25A is a schematic side view of the final pressure-bonding device of the third embodiment as viewed in the X-axis direction.

As shown in FIGS. 23, 24 and 25A, the final pressure-bonding device 340 includes, as the plurality of pressure-bonding units 341, a total of six pressure-bonding units 341 arrayed in line in the X-axis direction. Each of the pressure-bonding units 341 includes a pressure-bonding head (an example of pressing member) 361 for pressing and thereby pressure-bonding TCPs 4, which have been temporarily pressure-bonded, via the ACF sheet 3 to the terminal portions 2 of the panel substrate 1, and a backup stage 362 which is an example of the edge-portion support member for supporting the terminal portions 2 of the panel substrate 1 from its lower face side during the pressure-bonding operation by the pressure-bonding head 361.

Figure 25B:
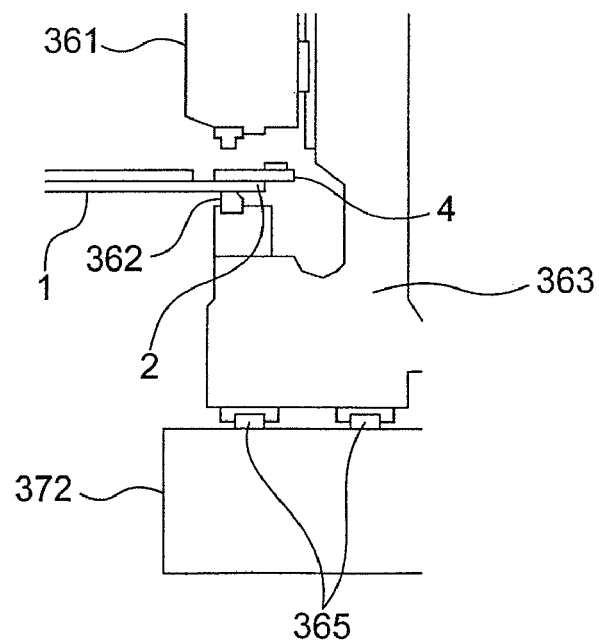
FIG. 25B is a schematic side view (a panel substrate placement state) of the final pressure-bonding device of the third embodiment as viewed in the X-axis direction.
Figure 25C:
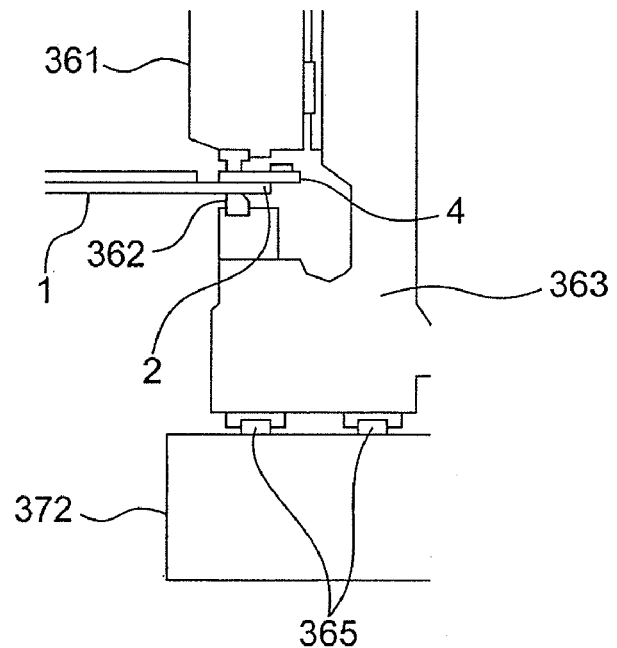
FIG. 25C is a schematic side view (a state of execution of the final pressure-bonding operation) of the final pressure-bonding device of the third embodiment as viewed in the X-axis direction.
Figure 25D:
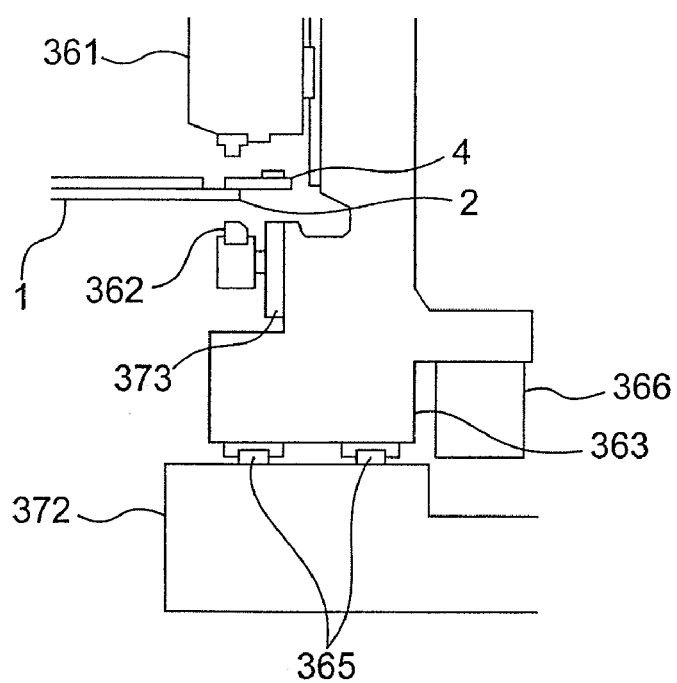
FIG. 25D is a schematic side view (with a backup stage up/down section included, a panel substrate placement state) of the final pressure-bonding device of the third embodiment as viewed in the X-axis direction.
Figure 25E:
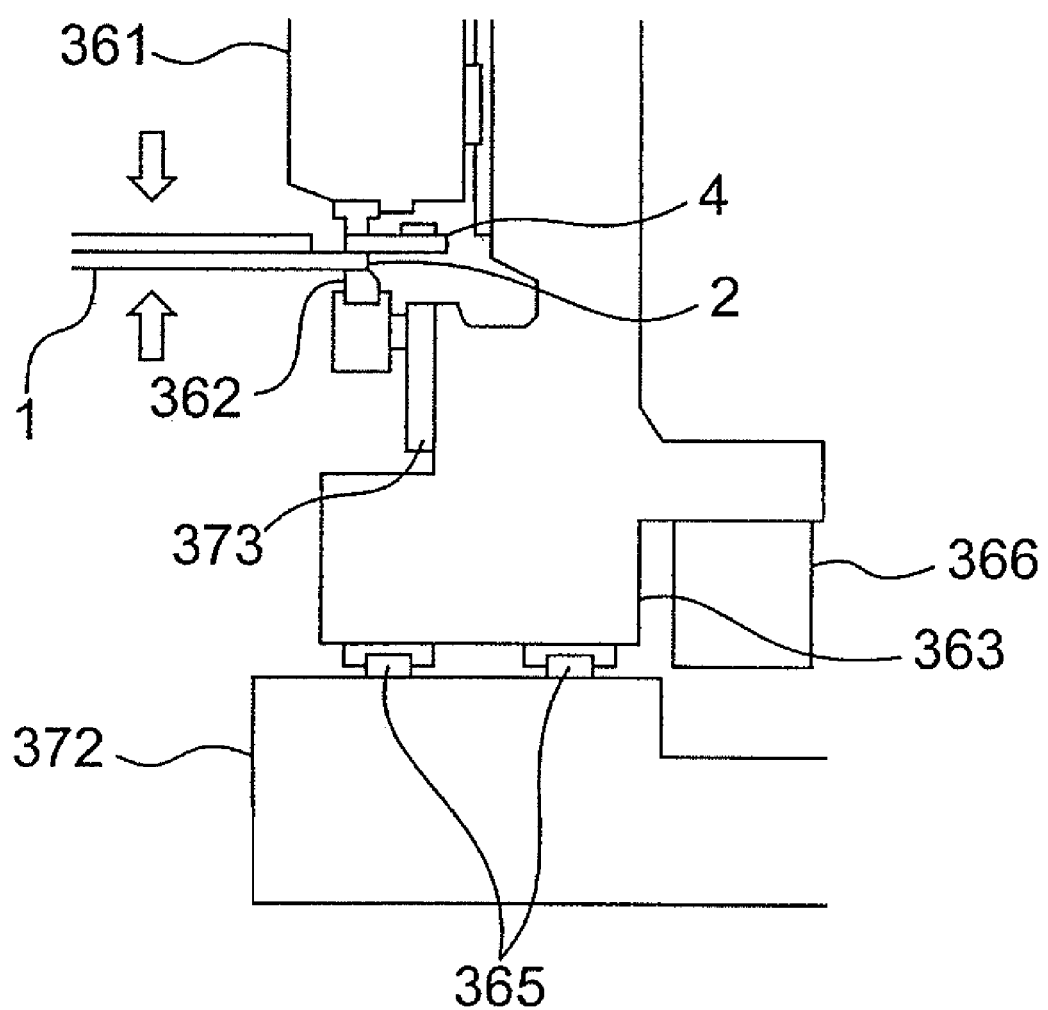
FIG. 25E is a schematic side view (with a backup stage up/down section included, a state of execution of the final pressure-bonding operation) of the final pressure-bonding device of the third embodiment as viewed in the X-axis direction.

As shown in FIG. 25A, in each pressure-bonding unit 341, the backup stage 362 is fitted at a lower portion of a unit frame 363 having a generally L-shaped cross section and formed from a rigid body, while the pressure-bonding head 361 is fitted at an upper portion of the unit frame 363 via LM guides 364 placed along the Z-axis direction so as to be able to guide the up/down operation. In addition, the backup stage 362 is not limited to the fixation to a lower portion of the unit frame 363, and instead of such a case, for example, as shown in FIGS. 25D and 25E, the backup stage 362 is supported by the unit frame 363 so as to be a vertically movable type one and up/down movable, and up/down operation of the backup stage 362 may be performed by a backup stage up/down section 373.

As shown in FIGS. 24 and 25A, on a base frame 372 of the final pressure-bonding device 340, two LM guides 365 are set so as to extend along the X-axis direction, where via the LM guides (an example of the guide support member) 365, the unit frame 363 in the six pressure-bonding units 10 is supported by the base frame 372 so as to be movable back and forth in the X-axis direction. Also, as shown in FIG. 25A, a unit-moving motor (an example of the unit moving device) 366 for driving back-and-forth movement of the pressure-bonding unit 341 along the X-axis direction is provided in a lower portion of each pressure-bonding unit 341. That is, the six pressure-bonding units 341, each including the pressure-bonding head 361 and the backup stage 62, is enabled to move back and forth independently of one another while being guided along the LM guides 365 in the X-axis direction by the individually provided unit-moving motor 366 being driven. It is noted here that the terms "movement independent of one another" mean that movement of one pressure-bonding unit 341 is fulfilled by driving of the unit-moving motor 366 provided for the one pressure-bonding unit 341 itself while movement of another pressure-bonding unit 341 is fulfilled by driving of the unit-moving motor 366 provided for such other pressure-bonding unit 341 itself, so that moving speed and timing can be set individually for the pressure-bonding units 341, independently. In addition, movement control for those two members may be performed in association with each other for implementation of safety control such as prevention of mutual contact between the pressure-bonding units 341.

As shown in FIG. 25A, on the base frame 372 of the final pressure-bonding device 340 is provided one common head up/down unit 367 (an example of the common pressing-member moving device) for integrally moving up and down the six pressure-bonding heads 361. The common head up/down unit 367 transfers its up/down driving force to up/down frames 368 via a cam follower 374, and further transfers the driving force to the pressure-bonding heads 361 via the up/down frames 368, respectively, so as to operate for driving of the operation and up/down speed and position in the pressure-bonding operation of each pressure-bonding head 361. Also, each of the up/down frames 368 is supported by the unit frame 363 so that its up/down operation can be guided via LM guides 375 set on the individual unit frames 363 along the Z-axis direction. In addition, although a constitution including one head up/down unit 367 for integrally moving up and down a plurality of pressure-bonding heads 361 has been described above, it is also possible, instead of such a case, that a head up/down unit is provided for each of the plurality of pressure-bonding heads 361 to make the pressure-bonding heads moved up and down independently of one another.

Also, as shown in FIG. 25A, each pressure-bonding head 361 contains a pressurizing unit (e.g., air cylinder) 369 for generating a pressurizing force for pressure-bonding operation in the pressure-bonding heads 361. Each pressurizing unit 369 is connected to a pressure generation source 370 via a lead pipe or the like. Feed quantity of compressed air is controlled so that a desired pressurizing force can be generated under control by a pressure control section 371.

Further, information as to movement positions of the pressure-bonding units 341 in the X-axis direction by the unit-moving motors 366, respectively, is acquired by the control device 319, and the control device 319 performs movement control to prevent interference of the pressure-bonding units 341 with one another. Also, integral or individually independent up/down operation of the respective pressure-bonding heads 361 by the head up/down unit 367 as well as control of the pressurizing force by the pressure control section 371, is performed integrally by the control device 319. When some of the pressure-bonding units 341 do not perform the pressure-bonding operation, the pressurizing unit 369 working as an operation actuator of the pressure-bonding head 361 of the pressure-bonding units 341 that do not perform the pressure-bonding operation may be operated or positioned toward a direction opposite to the direction in which the pressure-bonding of the TCPs 4 to the panel substrate 1 is performed.

Next, in the final pressure-bonding device 340 of the component mounting line having such a construction as described above, details of the procedure for carrying out the final pressure-bonding operation of the TCPs 4 to the panel substrate 1 will be described. The procedure of the final pressure-bonding operation in the final pressure-bonding device 340 is similar to the procedure shown in the flowchart of FIG. 7 in the first embodiment. FIGS. 26(A) and (B) is a schematic explanatory view of a state in which the final pressure-bonding operation is being performed for the longer-side terminal portion 2A of the panel substrate 1. FIGS. 27(A) and (B) is a schematic explanatory view of a state in which the final pressure-bonding operation is being performed for the shorter-side terminal portion 2B. The following description of the final pressure-bonding operation is exemplified by a case in which the panel substrate 1 is held by only one stage 343*a* out of the two stages 343*a*, 343*b* included in the panel substrate holding device 343, so that the final pressure-bonding operation is performed for this panel substrate 1.

At step S1 of the flowchart of FIG. 7, one panel substrate 1 is carried in to the panel substrate holding device 343 of the final pressure-bonding device 340, and held by the stage 343*a*. This panel substrate 1, as shown in FIG. 26(A), is held to the stage 343*a* in a posture in which the longer-side terminal portion 2A is a terminal portion extending along the X-axis direction while the shorter-side terminal portion 2B is a terminal portion extending along the Y-axis direction. Also, three TCPs 4 are temporarily pressure-bonded at an interval pitch P1 to the longer-side terminal portion 2A, while two TCPs 4 are temporarily pressure-bonded at an interval pitch P2 to the shorter-side terminal portion 2B. In addition, the interval pitches P1 and P2 are different from each other.

Next, in association with identification information as to the carried-in panel substrate 1, component pressure-bonding position information (first pressure-bonding position information) for the longer-side terminal portion 2A of the panel substrate 1 is acquired by the control device 319 (step S2). The component pressure-bonding position information contains information as to pressure-bonding positions of individual TCPs 4 in the longer-side terminal portion 2A, their interval pitch P1, number of TCPs 4 to be pressure-bonded, and the like. Such information may further include information as to types of TCPs 4, and heating temperature and pressurizing force for thermo-compression bonding. For the acquisition of the component pressure-bonding, position information, the information may be inputted from outside of the control device 319, or the information which has been preliminarily stored in a storage section or the like of the control device 319 may be read from the storage section or the like based on identification information as to the panel substrate 1.

When the component pressure-bonding position information for the longer-side terminal portion 2A is acquired in the control device 319, placement of the individual pressure-bonding units 341 is adjusted based on the acquired component pressure-bonding position information (step S3). More specifically, based on information as to the number (three) of TCPs 4 included in the component pressure-bonding position information, three pressure-bonding units 341 to be used for the final pressure-bonding operation are selected from among the six pressure-bonding units 341. In this process, the pressure-bonding units 341 that are closer to the center than the others, are selected one by one. In order that the selected three pressure-bonding units 341 are positioned in a pressure-bonding operation execution area Q1, which is an area generally close to the center in the array while the non-selected both-side three pressure-bonding units 341 are positioned in one of withdrawal areas Q2 that are areas adjoining the pressure-bonding operation execution area Q1 on its both sides, the individual pressure-bonding units 341, while guided by the LM guides 365, are moved along the X-axis direction independently of one another by driving of the unit-moving motors 366 provided for the pressure-bonding units 341, respectively. By this positioning in which the three pressure-bonding units 341 for execution of the final pressure-bonding operation are positioned in the pressure-bonding operation execution area Q1 while the three pressure-bonding units 341 for no execution of the final pressure-bonding operation are positioned in the both-side withdrawal areas Q2, interference between the three pressure-bonding units 341 for no execution of the final pressure-bonding operation and the panel substrate 1 can be prevented, so that the final pressure-bonding operation can be executed with reliability. Further, based on the information as to the interval pitch P1 of pressure-bonding positions of the TCPs 4 and their positions included in the component pressure-bonding position information, positions and placement internals of the selected three pressure-bonding units 341 are adjusted by the driving of the unit-moving motors 366.

When placement adjustment of the individual pressure-bonding units 341 is completed as shown above, the panel substrate 1 is moved by the panel substrate holding device 343 so that the longer-side terminal portion 2A of the panel substrate 1 is set in position in order that three component pressure-bonding positions are positioned on or above the backup stage 362 of the selected three pressure-bonding units 341. It is noted that FIG. 25B and FIGS. 26(A) and (B) are views showing an example of the state in which the longer-side terminal portion 2A of the panel substrate 1 is placed on the backup stage 362. As shown in FIGS. 26(A) and (B), interference between the three pressure-bonding units 341 positioned in the withdrawal areas Q2 and the panel substrate 1 is prevented. Thereafter, as shown in FIG. 25C, the individual pressure-bonding heads 361 are moved down via the up/down frames 368 by the head up/down unit 367, so that the pressure-bonding surfaces, i.e. lower faces, of the pressure-bonding heads 361 are brought into contact with the TCPs 4. Further, specified pressurizing force is applied to the TCPs 4 by the pressurizing unit 369, by which the three TCPs 4 are finally pressure-bonded, thereby mounted, via the ACF 3 in the three component pressure-bonding positions in the longer-side terminal portion 2A of the panel substrate 1 (step S4). After that, the individual pressure-bonding heads 362 are moved up by the head up/down unit 367. The above description has been made in connection with a final pressure-bonding operation in a case where the backup stage 362 is a fixed-type one. However, in the case where the backup stage 362 is a movable-type one capable of moving up and down, after the longer-side terminal portion 2A of the panel substrate 1 is placed above the backup stage 362, the pressure-bonding heads 361 and the backup stage 362 can be operated in such a direction as to approach the longer-side terminal portion 2A of the panel substrate 1, by which the TCPs 4 can be pressure-bonded to the panel substrate 1. In this case, for the pressure-bonding units 341 that do not perform the final pressure-bonding operation, the backup stage 362 is positioned at a down position of the move-up and -down positions (support-releasing height position), which is a position lower than the pressure-bonding height position that is a support height position of the panel substrate 1, by which interference between the pressure-bonding units 341 for no execution of pressure-bonding operation and the TCPs 4 and the panel substrate 1 can be prevented. Therefore, for example, even if the pressure-bonding units 341 for no execution of the pressure-bonding operation are positioned not in the withdrawal area Q2 but in the pressure-bonding operation execution area Q1, interference between the pressure-bonding units 341 and the panel substrate 1 can be prevented.

Upon completion of the final pressure-bonding operation for the longer-side terminal portion 2A, the panel substrate 1 is moved so as to be separate and farther from the individual backup stages 362, respectively, by the panel substrate holding device 343, and the held panel substrate 1 is rotationally moved by θ-rotation within the X-Y plane, so that the shorter-side terminal portion 2B of the panel substrate 1 is set so as to be postured along the X-axis direction (step S5).

Next, in the control device 319, component pressure-bonding position information as to the shorter-side terminal portion 2B of the panel substrate 1 (second pressure-bonding position information) is acquired (step S6). This component pressure-bonding position information contains information as to pressure-bonding positions of the individual TCPs 4 in the shorter-side terminal portion 2B, their interval pitch P2, and the number (two) of TCPs 4 to be pressure-bonded, and the like. In addition, although this embodiment is described, as an example, in a case where the component pressure-bonding position information as to the longer-side terminal portion 2A and the component pressure-bonding position information as to the shorter-side terminal portion 2B are acquired independently of each other, it is also allowable, instead of such a case, that both types of information are acquired at the same time.

Next, based on the acquired component pressure-bonding position information, placement of the individual pressure-bonding units 341 is adjusted (step S7). More specifically, based on the information as to the number (two) of TCPs 4 contained in the component pressure-bonding position information, two pressure-bonding units 341 positioned in the center of the six pressure-bonding units 341 are selected as the two pressure-bonding units 341 to be used for the final pressure-bonding operation from among the six pressure-bonding units 341. In order that the selected two pressure-bonding units 341 are positioned in the pressure-bonding operation execution area Q1 while the non-selected both-side four pressure-bonding units 341 are moved along the X-axis direction by the driving of their respective unit-moving motors 366 so as to be positioned in the respective withdrawal areas Q2, two for each side, while being guided by the LM guides 365. Further, based on the information as to the interval pitch P2 of the pressure-bonding positions of the TCPs 4 and their positions contained in the component pressure-bonding position information, positions and a placement interval of the selected two pressure-bonding units 341 are adjusted by the driving of their respective unit-moving motors 366.

Upon completion of the placement adjustment of the individual pressure-bonding units 341, the panel substrate 1 is moved by the panel substrate holding device 343, by which the shorter-side terminal portion 2B of the panel substrate 1 is placed so that two component pressure-bonding positions are set on or above the backup stages 362 of the selected two pressure-bonding units 341, respectively. FIGS. 27(A) and (B) shows a state in which the shorter-side terminal portion 2B of the panel substrate 1 is placed on the backup stages 362. As shown in FIGS. 27(A) and (B), interference between the four pressure-bonding units 341 positioned in the withdrawal areas Q2 and the panel substrate 1 is prevented. Thereafter, the individual pressure-bonding heads 361 are moved down via the up/down frames 368 by the head up/down unit 367, so that the pressure-bonding surfaces, i.e. lower faces, of the pressure-bonding heads 361 are brought into contact with the TCPs 4. Further, with a specified pressurizing force applied to the TCPs 4 by the pressurizing unit 369, the two TCPs 4 are finally pressure-bonded via the ACF sheet 3, thereby mounted, at the two component pressure-bonding positions in the shorter-side terminal portion 2B of the panel substrate 1 (step S8). After that, the individual pressure-bonding heads 362 are moved up by the head up/down unit 367. In addition, as in the final pressure-bonding operation for the longer-side terminal portion 2A, in the final pressure-bonding operation for the shorter-side terminal portion 2B also, in a case where the backup stage 362 may be a movable-type one capable of moving up and down, after the shorter-side terminal portion 2B of the panel substrate 1 is placed above the backup stages 362, operating the pressure-bonding heads 361 and the backup stages 362 in such directions as to approach the shorter-side terminal portion 2B of the panel substrate 1 allows the TCPs 4 to be pressure-bonded to the panel substrate 1. In this process, for the pressure-bonding units 341 that do not perform the pressure-bonding operation, positioning the backup stage 362 at a move-down position (support-releasing height position or withdrawal height position) which is lower than the pressure-bonding position (support height position) makes it possible to prevent the interference between the pressure-bonding units 341 for no execution of the pressure-bonding operation and the TCPs 4 and the panel substrate 1.

Upon completion of the final pressure-bonding operation for the shorter-side terminal portion 2B, the panel substrate 1 is moved by the panel substrate holding device 343 so as to be separate and farther from their respective backup stages 362, and the panel substrate 1 is carried out from the final pressure-bonding device 340 (step S9).

According to this third embodiment, the final pressure-bonding device 340 includes: a plurality of placed-in-array pressure-bonding units 341 including pressure-bonding heads 361 for finally pressure-bonding TCPs 4 to the terminal portions 2 of the panel substrate 1 and a backup stages 362 for supporting the terminal portions 2 of the panel substrate 1 during the final pressure-bonding; and a plurality of unit-moving motors 366 which are provided for the plurality of pressure-bonding units 341 and which cause the pressure-bonding units 341 to be moved in parallel along the X-axis direction to change the placement of the pressure-bonding units 341. By this construction, according to component pressure-bonding position information as to the panel substrate 1, i.e. placement or number of plural component pressure-bonding positions in the terminal portions 2, the individual pressure-bonding units 341 are moved in parallel independently of one another by the unit-moving motors 366, respectively, so that the placement of the pressure-bonding units 341 can be made coincident with the placement of the component pressure-bonding positions. Thus, the final pressure-bonding operation can be carried out efficiently in accordance with component pressure-bonding positions that vary depending on specifications of the panel substrate 1.

Also, even in cases where the longer-side terminal portion 2A and the shorter-side terminal portion 2B in the panel substrate 1 differ from each other in pressure-bonding positions and interval pitches of the TCPs 4 and in the number of TCPs 4 to be pressure-bonded, component pressure-bonding appropriate to specifications of the individual terminal portions 2A, 2B can be fulfilled securely and efficiently by taking the steps of performing placement adjustment of the individual pressure-bonding units 341 based on the component pressure-bonding position information for the longer-side terminal portion 2A, then performing the final pressure-bonding operation for the longer-side terminal portion 2A, thereafter performing placement adjustment of the individual pressure-bonding units 341 based on the component pressure-bonding position information for the shorter-side terminal portion 2B, and then performing the final pressure-bonding operation for the shorter-side terminal portion 2B. Therefore, without providing pressure-bonding units of exclusive use as a longer-side use pressure-bonding unit and a shorter-side use pressure-bonding unit, positional changes to positions of the individual pressure-bonding units are promptly made so as to meet pressure-bonding pitches fitted to the respective pressure-bonding positions of the longer-side terminal portion 2A and the shorter-side terminal portion 2B by one final pressure-bonding device 340, so that component pressure-bonding to the panel substrate can be efficiently achieved.

Also, the pressure-bonding units 341 include the unit-moving motors 366 independently one for each. As a result, placement adjustment of such individual pressure-bonding units 341 can be promptly and efficiently achieved.

Meanwhile, it is preferable to adopt a construction in which the pressure-bonding units 341 is provided not with up/down devices, respectively, for performing the up/down operations of the pressure-bonding heads 361, but with one common head up/down unit 367 for integrally moving up and down the six pressure-bonding heads 361. Adopting such a construction allows the individual pressure-bonding units 341 to be simpler in structure, therefore lighter in weight, so that the mobility by the unit-moving motors 366 can be made more successful.

Also, when a plurality of pressure-bonding heads 361 are selected from among the six pressure-bonding heads 361, pressure-bonding heads 361 that are closer to the center than the others are selected one by one. With this selection, when the up/down operation by the common head up/down unit 367 is performed to carry out the pressure-bonding operation for the TCPs 4, a more successful load balance for the structure of the head up/down unit 367 can be obtained, so that the pressure-bonding quality of the TCPs 4 to the panel substrate 1 can be made more stable.

Further, for the pressure-bonding units 341, there is adopted a construction in which the pressure-bonding head 361 and the backup stage 362 are paired and, with their mutual placement relation kept, movement for placement adjustment of the pressure-bonding units 341 is performed. As a result of this, regardless of the position to which the pressure-bonding units 341 are moved, the parallelism (degree of parallelization) between the pressure-bonding surface (or pressing surface) of the pressure-bonding head 361 and the support surface of the backup stage 362 for the panel substrate 1 can be maintained constant. Thus, the pressure-bonding accuracy (mounting accuracy) in the final pressure-bonding step can be improved.

The present invention may be carried out in other various modes without being limited to the above embodiments. As an example, a pressure-bonding method according to a modification of this third embodiment will be described below with reference to the schematic explanatory views shown in FIG. 28(A), (B) and FIG. 29(A), (B).

The above embodiments have been described in a case in which one panel substrate 1 is carried in to the final pressure-bonding device 340. By contrast, this modification example will be described in a case in which two panel substrates 1 are carried in to the final pressure-bonding device 340.

As shown in FIGS. 28(A) and (B), two panel substrates 1 that have been carried in are held individually by the stages 343a, 343b, respectively, of the panel substrate holding device 343. Based on component pressure-bonding position information as to the longer-side terminal portion 2A of each panel substrate 1, placement adjustment of the six pressure-bonding units 341 is carried out. More specifically, three pressure-bonding units 341 are selected for one panel substrate 1 and subjected to their placement adjustment. Thereafter, the panel substrates 1 are moved by the panel substrate holding device 343 and subjected to positional alignment with the pressure-bonding units 341, with the longer-side terminal portion 2A placed on the backup stages 362, respectively. The resulting state is the state shown in FIG. 28(A) and (B). After that, the final pressure-bonding operation for the longer-side terminal portion 2A is carried out by the respective pressure-bonding heads 361.

Upon completion of the final pressure-bonding operation for the longer-side terminal portion 2A, the panel substrates 1 are withdrawn from on the backup stages 362, followed by θ-rotation movement of the panel substrates 1, with the shorter-side terminal portion 2B placed along the X-axis direction. Based on the component pressure-bonding position information as to the shorter-side terminal portion 2B of each panel substrate 1, placement adjustment of the six pressure-bonding units 341 is carried out. More specifically, two pressure-bonding units 341 are selected for one panel substrate 1, and placement adjustment is done in such a way that non-selected both-end two pressure-bonding units 341 are moved to the withdrawal areas Q2. Thereafter, the panel substrates 1 are moved by the panel substrate holding device 343 and subjected to positional alignment with the pressure-bonding units 341, with the shorter-side terminal portion 2B placed on the backup stages 362, respectively. The resulting state is the state shown in FIGS. 29(A) and (B). After that, the final pressure-bonding operation for the shorter-side terminal portion 2B is carried out by the respective pressure-bonding heads 361. Then, the panel substrates 1 are carried out from the final pressure-bonding device 340. In addition, when the backup stage 362 is a movable-type one capable of moving up and down, it is also possible that with respect to the non-selected both-end two pressure-bonding units 341, the backup stages 362 are withdrawn (e.g., moved down) in such a direction as to go farther from the panel substrate 1, so that these two pressure-bonding units 341 are kept from pressure-bonding operation.

Even in the case where two panel substrates 1 are held by the panel substrate holding device 343 and subjected to execution of the final pressure-bonding operation as in this modification example, the final pressure-bonding operation can be carried out reliably and efficiently in response to differences in component pressure-bonding position between the longer-side terminal portion 2A and the shorter-side terminal portion 2B.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosures of Japanese Patent Applications No. 2007-313718, No. 2007-313722 and No. 2007-313727 filed on Dec. 4, 2007, including specifications, claims, and drawings are incorporated herein by reference in their entirety.

The invention claimed is:

1. A component mounting method for pressing and thereby pressure-bonding a plurality of components to a component pressure-bonding area in an edge portion of a substrate, the method comprising:

with provision of a pressing member for pressing a component to a component pressure-bonding area in the substrate, a unit support member in which an edge-portion support member for supporting an edge portion of the substrate during pressure-bonding by the pressing member is provided, and a press driving part which is provided on the unit support member and which imparts to the pressing member a force for moving back and forth the pressing member along a pressing direction perpendicular to a surface of the substrate, moving a plurality of pressure-bonding units, which are arrayed in line, independently of one another along the edge portion of the substrate so that the pressure-bonding units become coincident with pressure-bonding positions for a plurality of components to be pressure-bonded to a component pressure-bonding area in the edge portion of the substrate, thus achieving positioning of the pressure-bonding units;

setting a plurality of pressure-bonding positions in the edge portion of the substrate on or above the edge-portion support member;

thereafter, generating a force for moving back and forth the pressing member by the press driving part of each pressure-bonding unit to operate the pressing member toward the edge-portion support member, and moreover, while making a common restricting member directly or indirectly engaged with each pressing member in a plurality of pressure-bonding units in a direction in which the pressing member is moved toward the edge-portion support member, controlling a moving speed of a common restricting member to commonly restrict operation speeds of the individual pressing members; and releasing the engagement between the pressing members and the common restricting member while contacting the pressing members with the components thereby derestricting the operation speeds of the pressing members, and pressure-bonding a plurality of components to the edge portion of the substrate by the individual pressing members.

2. The component mounting method as defined in claim 1, wherein in positional alignment between the pressure-bonding positions of a plurality of components in the edge portion of the substrate and a plurality of pressure-bonding units, the individual pressure-bonding units are supported so as to be movable in a direction along the edge portion of the substrate, and a support frame for supporting the common restricting member is moved integrally with the plurality of pressure-bonding units in the direction along the edge portion of the substrate.

* * * * *